(12) United States Patent
Liu et al.

(10) Patent No.: US 11,024,600 B2
(45) Date of Patent: Jun. 1, 2021

(54) UNIFIED SEMICONDUCTOR DEVICES HAVING PROGRAMMABLE LOGIC DEVICE AND HETEROGENEOUS MEMORIES AND METHODS FOR FORMING THE SAME

(71) Applicant: YANGTZE MEMORY TECHNOLOGIES CO., LTD., Wuhan (CN)

(72) Inventors: Jun Liu, Wuhan (CN); Weihua Cheng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 40 days.

(21) Appl. No.: 16/727,895

(22) Filed: Dec. 26, 2019

(65) Prior Publication Data
US 2020/0328181 A1 Oct. 15, 2020

Related U.S. Application Data

(63) Continuation of application No. PCT/CN2019/113238, filed on Oct. 25, 2019.

(30) Foreign Application Priority Data

Apr. 15, 2019 (WO) ................ PCT/CN2019/082607
Apr. 30, 2019 (WO) ................ PCT/CN2019/085237
(Continued)

(51) Int. Cl.
*H01L 25/065* (2006.01)
*H01L 25/18* (2006.01)
(Continued)

(52) U.S. Cl.
CPC .......... *H01L 25/0652* (2013.01); *H01L 21/78* (2013.01); *H01L 24/08* (2013.01);
(Continued)

(58) Field of Classification Search
CPC ......... H01L 25/0652; H01L 2924/1436; H01L 2924/1431; H01L 25/18; H01L 24/08;
(Continued)

(56) References Cited

U.S. PATENT DOCUMENTS 10,074,667 B1 9/2018 Higashi et al.
2014/0319662 A1* 10/2014 You .................. H01L 23/49838
257/665
(Continued)

FOREIGN PATENT DOCUMENTS

CN 109148498 A 1/2019
CN 109155301 A 1/2019
(Continued)

OTHER PUBLICATIONS

International Search Report issued in corresponding International Application No. PCT/2019/113238, dated Feb. 6, 2020, 5 pages.
(Continued)

*Primary Examiner* — Thanh Y. Tran
(74) *Attorney, Agent, or Firm* — Bayes PLLC

(57) ABSTRACT

Embodiments of semiconductor devices and fabrication methods thereof are disclosed. In an example, a semiconductor device includes NAND memory cells and a first bonding layer including first bonding contacts. The semiconductor device also includes a second semiconductor structure including DRAM cells and a second bonding layer including second bonding contacts. The semiconductor device also includes a third semiconductor structure including a programmable logic device and a third bonding layer including third bonding contacts. The semiconductor device further includes a first bonding interface between the first and third bonding layers, and a second bonding interface between the second and third bonding layers. The first bonding contacts are in contact with a first set of the third
(Continued)

bonding contacts at the first bonding interface. The second bonding contacts are in contact with a second set of the third bonding contacts at the second bonding interface. The first and second bonding interfaces are in a same plane.

20 Claims, 24 Drawing Sheets

(30) Foreign Application Priority Data

| | | |
|---|---|---|
| Jul. 24, 2019 | (WO) | PCT/CN2019/097442 |
| Sep. 11, 2019 | (WO) | PCT/CN2019/105292 |

(51) Int. Cl.
 *H01L 23/00* (2006.01)
 *H01L 21/78* (2006.01)
 *H01L 25/00* (2006.01)

(52) U.S. Cl.
 CPC .............. *H01L 24/80* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2225/06524* (2013.01); *H01L 2924/1431* (2013.01); *H01L 2924/1436* (2013.01); *H01L 2924/14511* (2013.01)

(58) Field of Classification Search
 CPC ......... H01L 21/78; H01L 24/80; H01L 25/50; H01L 2224/08145; H01L 2224/80895; H01L 2224/80896; H01L 2225/06524; H01L 2924/14511; H01L 27/11573; H01L 27/10897
 See application file for complete search history.

(56) References Cited

U.S. PATENT DOCUMENTS

| | | | |
|---|---|---|---|
| 2016/0322330 A1* | 11/2016 | Lin | H01L 23/5384 |
| 2018/0046908 A1 | 2/2018 | Cox et al. | |
| 2018/0261623 A1 | 9/2018 | Higashi et al. | |
| 2019/0259732 A1 | 8/2019 | Choo et al. | |
| 2020/0203364 A1* | 6/2020 | Totoki | H01L 27/11524 |
| 2020/0266146 A1* | 8/2020 | Nishida | H01L 27/11573 |

FOREIGN PATENT DOCUMENTS

| | | |
|---|---|---|
| CN | 109616463 A | 4/2019 |
| CN | 110192269 A | 8/2019 |
| CN | 110249427 A | 9/2019 |
| TW | 201913966 A | 4/2019 |
| TW | 201933578 A | 8/2019 |
| TW | 201937688 A | 9/2019 |

OTHER PUBLICATIONS

Written Opinion of the International Searching Authority issued in corresponding International Application No. PCT/2019/113238, dated Feb. 6, 2020, 5 pages.

* cited by examiner

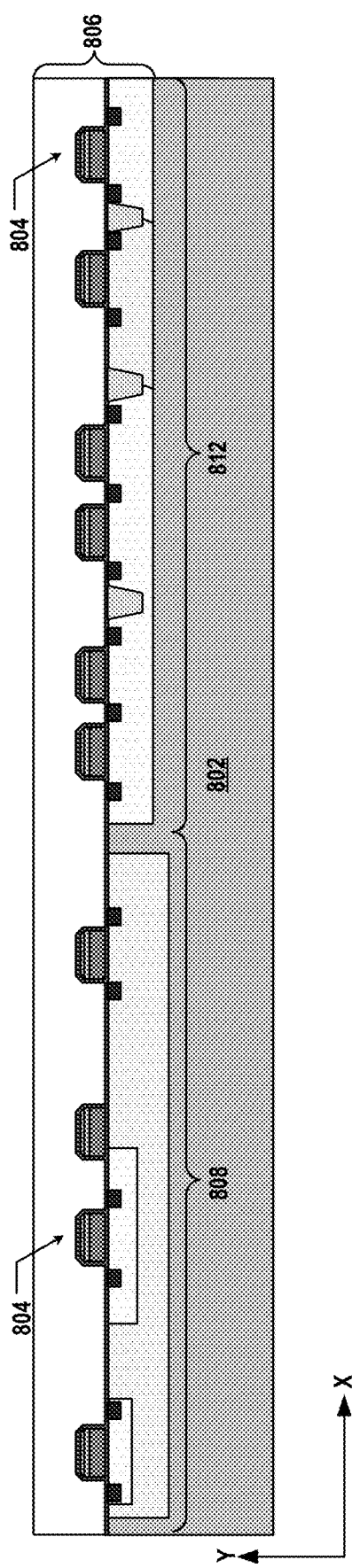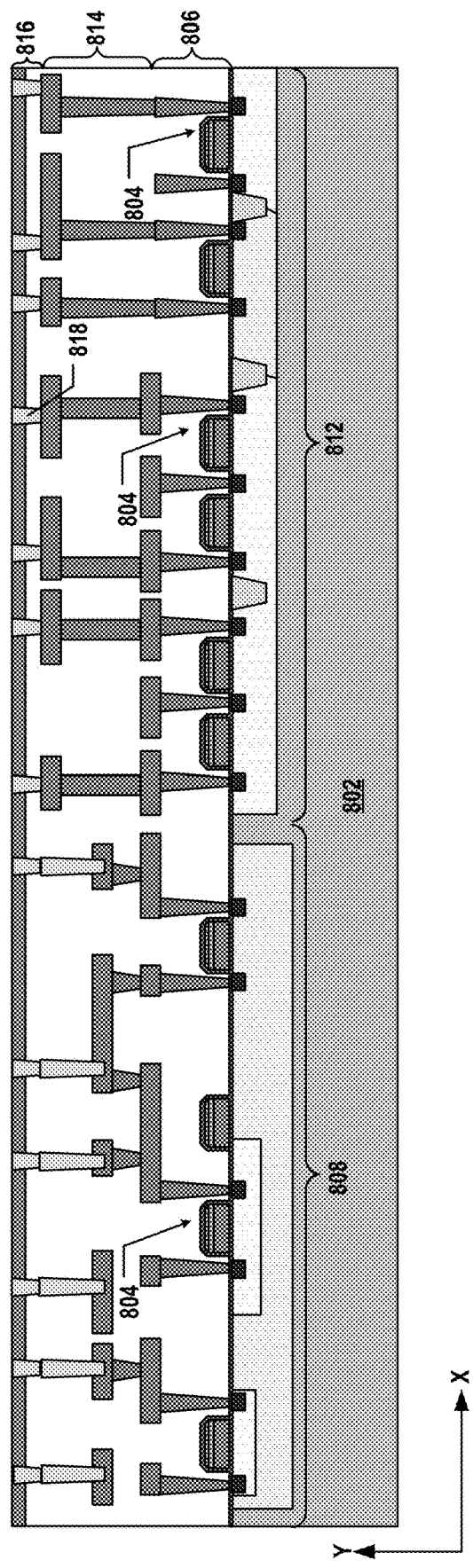
FIG. 8A
FIG. 8B

UNIFIED SEMICONDUCTOR DEVICES HAVING PROGRAMMABLE LOGIC DEVICE AND HETEROGENEOUS MEMORIES AND METHODS FOR FORMING THE SAME

CROSS-REFERENCE TO RELATED APPLICATIONS

This application is continuation of International Application No. PCT/CN2019/113238, filed on Oct. 25, 2019, entitled "UNIFIED SEMICONDUCTOR DEVICES HAVING PROGRAMMABLE LOGIC DEVICE AND HETEROGENEOUS MEMORIES AND METHODS FOR FORMING THE SAME," which claims the benefit of priorities to International Application No. PCT/CN2019/105292, filed on Sep. 11, 2019, entitled "UNIFIED SEMICONDUCTOR DEVICES HAVING PROCESSOR AND HETEROGENEOUS MEMORIES AND METHODS FOR FORMING THE SAME," International Application No. PCT/CN2019/082607, filed on Apr. 15, 2019, entitled "INTEGRATION OF THREE-DIMENSIONAL NAND MEMORY DEVICES WITH MULTIPLE FUNCTIONAL CHIPS," International Application No. PCT/CN2019/097442, filed on Jul. 24, 2019, entitled "BONDED UNIFIED SEMICONDUCTOR CHIPS AND FABRICATION AND OPERATION METHODS THEREOF," and International Application No. PCT/CN2019/085237, filed on Apr. 30, 2019, entitled "THREE-DIMENSIONAL MEMORY DEVICE WITH EMBEDDED DYNAMIC RANDOM-ACCESS MEMORY," all of which are incorporated herein by reference in their entireties.

BACKGROUND

Embodiments of the present disclosure relate to semiconductor devices and fabrication methods thereof.

Field-programmable gate arrays (FPGAs) are reprogrammable integrated circuits that contain an array of programmable logic blocks. FPGA chip adoption is driven by their flexibility, hardware-timed speed and reliability, and parallelism. FPGAs provide benefits to designers of many types of electronic equipment, ranging from smart energy grids, aircraft navigation, automotive driver's assistance, medical ultrasounds, and data center search engines. Today, FPGAs are gaining prominence in another field as well: deep neural networks (DNNs) that are used for artificial intelligence (AI), such as in analyzing large amounts of data for machine learning.

SUMMARY

Embodiments of semiconductor devices and fabrication methods thereof are disclosed herein.

In one example, a semiconductor device includes an array of NAND memory cells and a first bonding layer including a plurality of first bonding contacts. The semiconductor device also includes a second semiconductor structure including an array of dynamic random-access memory (DRAM) cells and a second bonding layer including a plurality of second bonding contacts. The semiconductor device also includes a third semiconductor structure including a programmable logic device and a third bonding layer including a plurality of third bonding contacts. The semiconductor device further includes a first bonding interface between the first bonding layer and the third bonding layer, and a second bonding interface between the second bonding layer and the third bonding layer. The first bonding contacts are in contact with a first set of the third bonding contacts at the first bonding interface. The second bonding contacts are in contact with a second set of the third bonding contacts at the second bonding interface. The first bonding interface and the second bonding interface are in a same plane.

In another example, a method for forming a semiconductor device is disclosed. A plurality of first semiconductor structures are formed on a first wafer. At least one of the first semiconductor structures includes an array of NAND memory cells and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of DRAM cells and a second bonding layer including a plurality of second bonding contacts. The second wafer is diced into a plurality of second dies, such that at least one of the second dies includes the at least one of the second semiconductor structures. A plurality of third semiconductor structures are formed on a third wafer. At least one of the third semiconductor structures includes a programmable logic device and a third bonding layer including a plurality of third bonding contacts. The third wafer is diced into a plurality of third dies, such that at least one of the third dies includes the at least one of the third semiconductor structures. The third die and each of the first die and the second die are bonded in a face-to-face manner, such that the third semiconductor structure is bonded to each of the first semiconductor structure and the second semiconductor structure. The first bonding contacts are in contact with a first set of the third bonding contacts at a first bonding interface. The second bonding contacts are in contact with a second set of the third bonding contacts at a second bonding interface.

In still another example, a method for forming a semiconductor device is disclosed. A plurality of first semiconductor structures are formed on a first wafer. At least one of the first semiconductor structures includes an array of NAND memory cells and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of DRAM cells and a second bonding layer including a plurality of second bonding contacts. The second wafer is diced into a plurality of second dies, such that at least one of the second dies includes the at least one of the second semiconductor structures. A plurality of third semiconductor structures are formed on a third wafer. At least one of the third semiconductor structures includes a programmable logic device and a third bonding layer including a plurality of third bonding contacts. The third wafer and each of the at least one first die and the at least one second die are bonded in a face-to-face manner to form a bonded structure, such that the at least one third semiconductor structure is bonded to each of the first semiconductor structure and the second semiconductor structure. The first bonding contacts are in contact with a first set of the third bonding contacts at a first bonding interface. The second bonding contacts are in contact with a second set of the third bonding contacts at a second bonding interface. The bonded structure is diced into a plurality of dies. At least one of the dies includes the bonded first, second, and third semiconductor structures.

In yet another example, a semiconductor device includes a logic die including an array of programmable logic blocks, a memory die including an array of memory blocks comprising a plurality types of memory, and a bonding interface between the logic die and the memory die, such that the array of programmable logic blocks is electrically connected to the array of memory blocks through the bonding interface.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 8A and 8B illustrate a fabrication process for forming an exemplary semiconductor structure having a programmable logic device and peripheral circuits, according to some embodiments.

Figure 1:
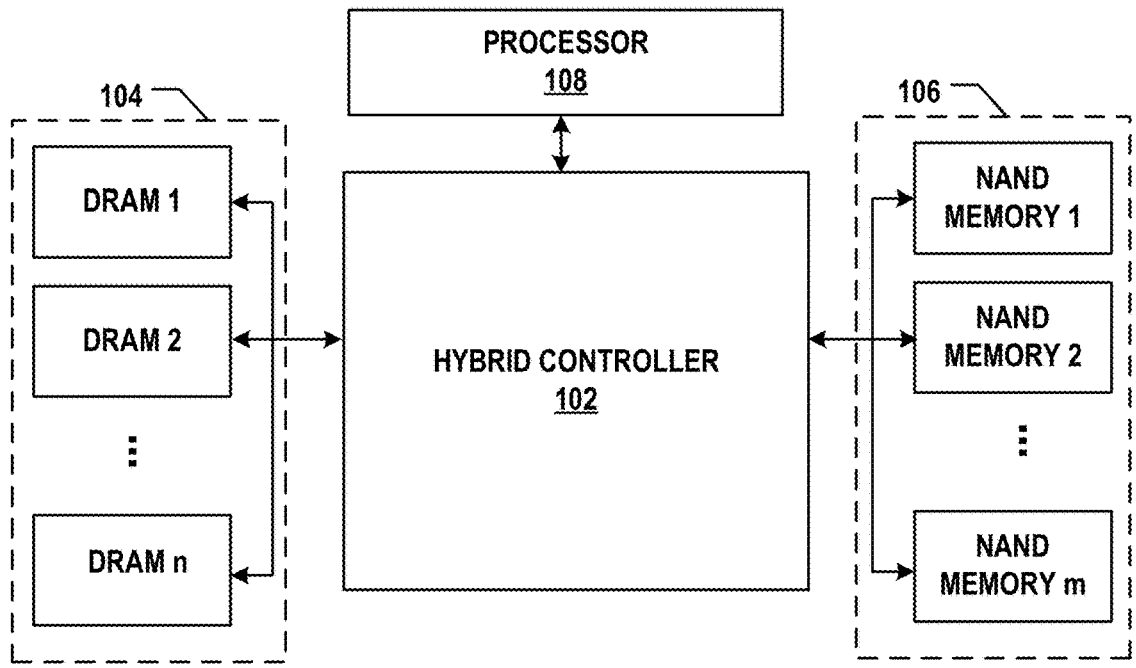
FIG. 1 illustrates a block diagram of a system having a processor and heterogeneous memories.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiments. Further, when a particular feature, structure or characteristic is described in connection with an embodiment, it would be within the knowledge of a person skilled in the pertinent art to affect such features, structures or characteristics in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional (3D) NAND memory string" refers to a vertically-oriented string of memory cell transistors connected in series on a laterally-oriented substrate so that the string of memory cell transistors extends in the vertical direction with respect to the substrate. As used herein, the term "vertical/vertically" means nominally perpendicular to the lateral surface of a substrate.

As used herein, a "wafer" is a piece of a semiconductor material for semiconductor devices to build in and/or on it and that can undergo various fabrication processes before being separated into dies.

Heterogeneous memories, such as NAND flash memory and DRAM, have been integrated with processors (also known as "microprocessors," such as central processing units (CPUs)) to form systems for various applications. For example, FIG. 1 illustrates a block diagram of a system 100 having a processor and heterogeneous memories. System 100 includes a hybrid controller 102, heterogeneous memories including one or more DRAMs 104 and one or more NAND memories 106, and a processor 108. System 100 also includes one or more caches (e.g., instruction cache or data cache, not shown) formed by static random-access memory (SRAM). Hybrid controller 102 controls operations of DRAMs 104 and NAND memories 106. That is, hybrid controller 102 acts as both a NAND memory controller managing data storage and transfer in NAND memories 106 as well as a DRAM controller managing data storage and transfer in DRAMs 104. Processor 108 includes one or more integrated or discrete processor cores, such as execution logic/engines configured to perform any suitable logic operations. Each one of hybrid controller 102 and processor 108 further includes one or more bus interface units (not shown) configured to receive and transmit data within system 100 and between system 100 and other devices.

Figure 2:
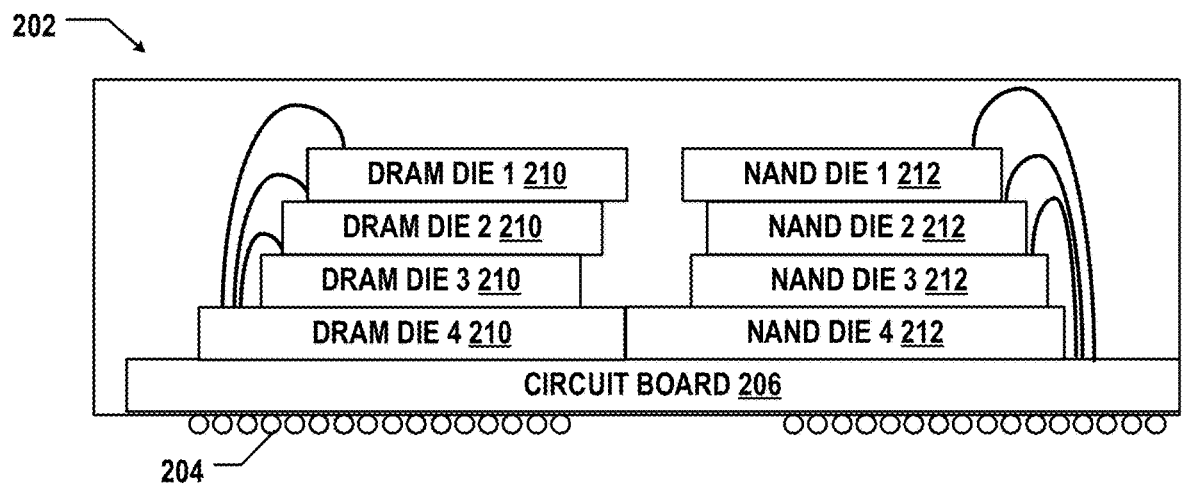
FIG. 2 illustrates a schematic view of a cross-section of a semiconductor device in a multi-chip package (MCP) having heterogeneous memories.

FIG. 2 illustrates a schematic view of a cross-section of a semiconductor device 200 in an MCP 202 having heterogeneous memories. MCP 202, also known as multi-chip module (MCM), is an electronic assembly, such as a package with a number of conductor terminals (i.e., pins) 204 where multiple integrated circuits (ICs or "chips"), semiconductor dies, and/or other discrete components are integrated onto a circuit board 206. As shown in FIG. 2, a variety of chiplets are stacked on circuit board 206 in MCP 202, including DRAM dies 210 and NAND dies 212. Each of the memory dies, e.g., DRAM die 210 or NAND die 212, is electrically connected to circuit board 206 through die-to-die wire bonding including, but not limited to, aluminum (Al), copper (Cu), silver (Ag), or gold (Au) bonding wires based on ball bonding, wedge bonding, or compliant bonding. Each DRAM die 210 is an exemplary implementation of DRAM 104, and each NAND die 212 is an exemplary implementation of NAND memory 106, described above in detail with respect to FIG. 1.

However, processors, in particular CPUs, are optimized for sequential processing, lacking adequate support for parallelism, and are limited in their capabilities for high-speed processing. Unlike processors, FPGAs, as one type of programmable logic devices (PLDs), are truly parallel in nature, so different processing operations do not have to compete for the same resources, which are in particular suitable for high-performance computing, such as in analyzing large amounts of data for machine learning, encryption/decryption, and video and image data compression or other processing. On the other hand, the application of programmable logic devices, in particular, FPGAs, is limited to its cost and working frequency. The relatively large chip area consumption of FPGA chips cause high cost, and the signal transfer delay, such as the resistive-capacitive (RC) delay from metal routing, limits the working frequency.

Various embodiments in accordance with the present disclosure provide a unified semiconductor device having a programmable logic device and heterogeneous memories (e.g., DRAM and NAND memories) integrated on a bonded chip to achieve higher working frequency, wider data bandwidth, lower power consumption, and lower cost. The heterogeneous memory architecture can utilize the advantages of both non-volatile memory and volatile memory, for example, the large storage capacity of NAND memory and the fast access speed of DRAM, thereby broadening the process window for circuit design. In one example, the heterogeneous memory architecture can achieve faster power-on speed by reloading the logical-physical address map from each NAND memory to a respective DRAM when the system restarts due to power interruption.

Moreover, by replacing the processor with a programmable logic device, such as FPGA, additional on-chip caches may not be needed for storing the updates to the logical-physical address map, thereby further reducing the chip size, the critical path distance, the RC delay, and the power consumption. Compared with processors, which need to communicate with other logic devices on the chip through memory, the connections between the programmable logic blocks and other logic devices in an FPGA are preset at the time of programming. Thus, the system performance can be further improved.

In one example, the semiconductor device disclosed herein may include a logic die having an array of programmable logic blocks (e.g., in an FPGA) bonded with a memory die having an array of memory blocks including various heterogeneous memories. In another example, the semiconductor device disclosed herein may include heterogeneous memories, such as a first semiconductor structure having NAND memory (e.g., as non-volatile memory), and a second semiconductor structure having DRAM (e.g., as volatile memory). The semiconductor device disclosed herein can further include a third semiconductor structure having a programmable logic device (e.g., as the controller of the heterogeneous memories) bonded to each of the first and second semiconductor structures with a large number of short-distance vertical metal interconnects instead of the peripherally-distributed, long-distance metal routing, or even conventional through silicon vias (TSVs).

As a result, the optimal instant data and state storage capability can achieve higher signal-to-noise (S/N) ratio, better memory array efficiency, less die size and lower bit cost, denser arrangements of functional modules (e.g. programmable logic blocks, clock management, input/output (I/O) interface, etc.), faster speed, and smaller printed circuit board (PCB) size at the same time. Further, shorter manufacturing cycle time with higher yield can be achieved due to less interactive influences from manufacturing processes of the programmable logic device wafer, the NAND memory wafer, and the DRAM wafer, as well as the known good hybrid bonding yield. The shorter connection distance between the programmable logic device, NAND memory, and DRAM, such as from millimeter or centimeter-level to micrometer-level, can improve the programmable logic device and memory performance with faster data transfer rate, improve programmable logic device efficiency with wider bandwidth, and improve system speed.

Figure 3A:
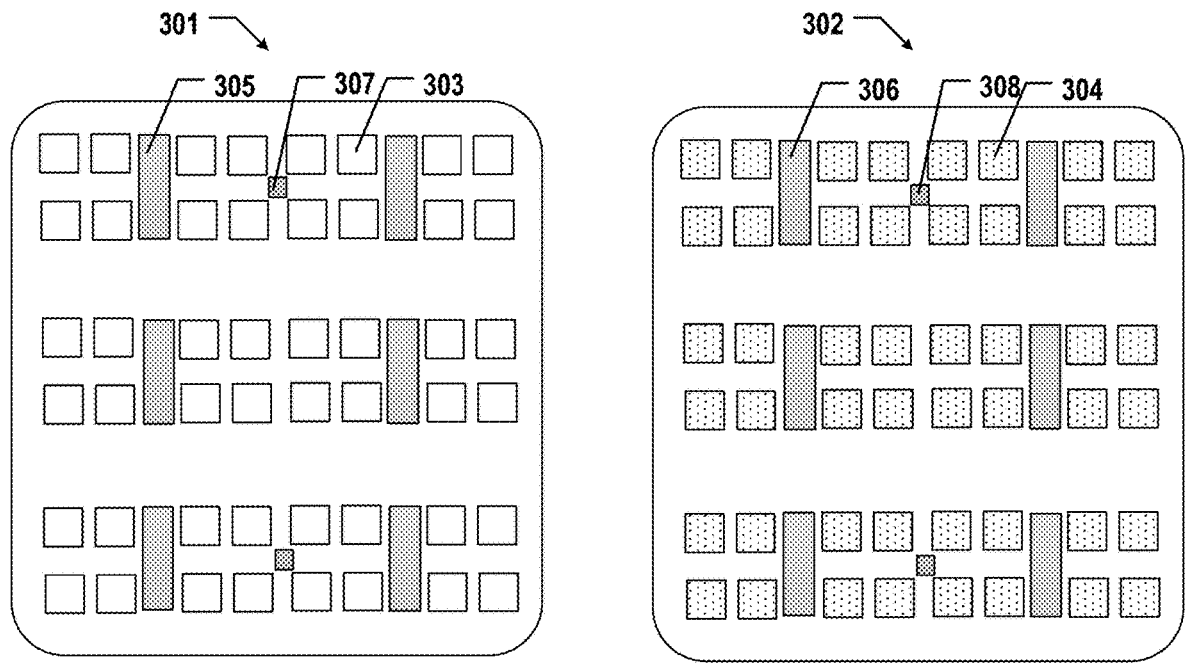
FIG. 3A illustrates a schematic plan view of an exemplary logic die having an array of programmable logic blocks and an exemplary memory die having an array of memory blocks, according to some embodiments.

FIG. 3A illustrates a schematic plan view of an exemplary logic die 301 having an array of programmable logic blocks 303 and an exemplary memory die 302 having an array of memory blocks 304, according to some embodiments. Logic die 301 can include a programmable logic device comprised of array of programmable logic blocks 303. A programmable logic device is an electronic component used to build reconfigurable digital circuits, which has an undefined function at the time of manufacture and programmed (reconfigured) by using a program after the manufacturing. The programmable logic device can include, for example, programmable logic array (PLA), programmable array logic (PAL), generic array logic (GAL), complex programmable logic device (CPLD), and FPGA. Logic die 301 can also include a plurality of logic circuits, such as I/O interface circuits 305 and clock management circuits 307. It is understood that any other suitable logic circuits may be included in logic die 301 as well, for example, peripheral circuits of memory.

Memory die 302 can include heterogeneous memories in the form of array of memory blocks 304. Memory blocks 304 include a plurality types of memory (i.e., heterogeneous memories) including at least two of NAND memory (as non-volatile memory), DRAM (as volatile memory), and phase-change memory (PCM). In one example, some of memory blocks 304 may be NAND memory, and some of memory blocks 304 may be DRAM. In another example, some of memory blocks 304 may be PCM. PCM can utilize the difference between the resistivity of the amorphous and the crystalline phase in phase-change materials (e.g., chalcogenide alloys) based on heating and quenching of the phase-change materials electrothermally. PCM includes 3D) (Point memory, which stores data based on a change in resistance of the bulk material property (e.g., in a high-resistance state or a low-resistance state), in conjunction with a stackable cross-point data access array to be bit-addressable. In some embodiments, as logic die 301 uses a programmable logic device, such as FPGA, to replace processors, the plurality types of memory in memory die 302 do not include SRAM (e.g., as a cache shared by array of programmable logic blocks 303). As a result, array of programmable logic blocks 303 in logic die 301 and array of memory blocks 304 in memory die 302 do not share an SRAM cache, according to some embodiments.

Similar to logic die 301, memory die 302 can also include a plurality of logic circuits, such as I/O interface circuits 306 and clock management circuits 308. It is understood that any other suitable logic circuits may be included in memory die 302 as well, for example, peripheral circuits of array of memory blocks 304. It is understood that in some embodiments, logic circuits may be formed on only one of logic die 301 and memory die 302. That is, at least one of logic die 301 or memory die 302 may include a plurality of logic circuits 305/307 or 306/308.

Figure 3B:
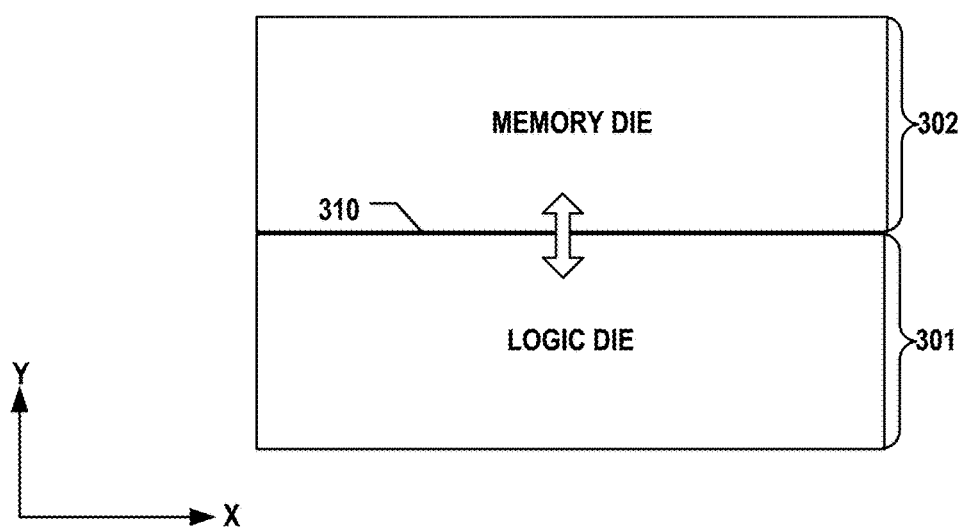
FIG. 3B illustrates a schematic view of a cross-section of a semiconductor device having the logic die and memory die in FIG. 3A bonded together, according to some embodiments.

FIG. 3B illustrates a schematic view of a cross-section of a semiconductor device 300 having logic die 301 and memory die 302 in FIG. 3A bonded together, according to some embodiments. Semiconductor device 300 is a unified semiconductor device that can be any suitable computing system, such as FPGA-enabled controllers, FPGA-enabled network switches/routers, FPGA-included system on chips (SoCs), reconfigurable I/O devices, etc. Semiconductor device 300 can be also any suitable memory system, such as embedded multimedia cards (eMMCs), universal flash storages (UFSs), or solid-state drive (SSDs). In semiconductor device 300, array of programmable logic blocks 303 of logic die 301 can control the operations of bonded logic die 301 and/or memory die 302 and exchange data with array of memory blocks 304 of memory die 302.

As shown in FIG. 3B, semiconductor device 300 further includes a bonding interface 310 vertically between memory die 302 and logic die 301, such that array of programmable logic blocks is 303 is electrically connected to array of memory blocks 304 through bonding interface 310. Memory die 302 and logic die 301 can be fabricated separately (and in parallel in some embodiments) such that the thermal budget of fabricating one of memory die 302 and logic die 301 does not limit the processes of fabricating another one of memory die 302 and logic die 301. Moreover, a large number of interconnects (e.g., bonding contacts) can be formed through bonding interface 310 to make direct, short-distance (e.g., micron-level) electrical connections between memory die 302 and logic die 301, as opposed to the long-distance (e.g., millimeter or centimeter-level) chip-to-chip data bus on the circuit board, such as PCB, thereby eliminating chip interface delay and achieving high-speed I/O throughput with reduced power consumption. Data transfer between memory blocks 304 in memory die 302 and programmable logic blocks 303 in logic die 301 can be performed through the interconnects (e.g., bonding contacts) across bonding interface 310. By vertically integrating memory die 302 and logic die 301, the chip size can be reduced, and the memory cell density can be increased.

In some embodiments, some of memory blocks 304 in memory die 302 are NAND memory and are configured to store a logical-physical address map, and programmable logic blocks 303 in logic die 301 are configured to load the logical-physical address map from NAND memory into some other memory blocks 304, which are DRAM, when semiconductor device 300 is powered on. A logical address is the address generated by programmable logic blocks 303 during execution, and a physical address is the location in memory blocks 304. A logical-physical address map can map a physical address to a logical address. When semiconductor device 300 is powered on, programmable logic blocks 303 of logic die 301 can be configured to control data exchange between memory blocks 304 in memory die 302, such as between NAND memory and DRAM or between NAND memory and NAND memory. In the event an unexpected power disruption occurs, programmable logic blocks 303 in logic die 301 can reload the logical-physical address map from NAND memory into DRAM without affecting the reboot speed when the power resumes. By replacing processors with programmable logic blocks 303 in logic die 301, an SRAM cache for storing the log of updates to the logical-physical address map may not be needed, which further reduces the chip size.

Figure 4A:
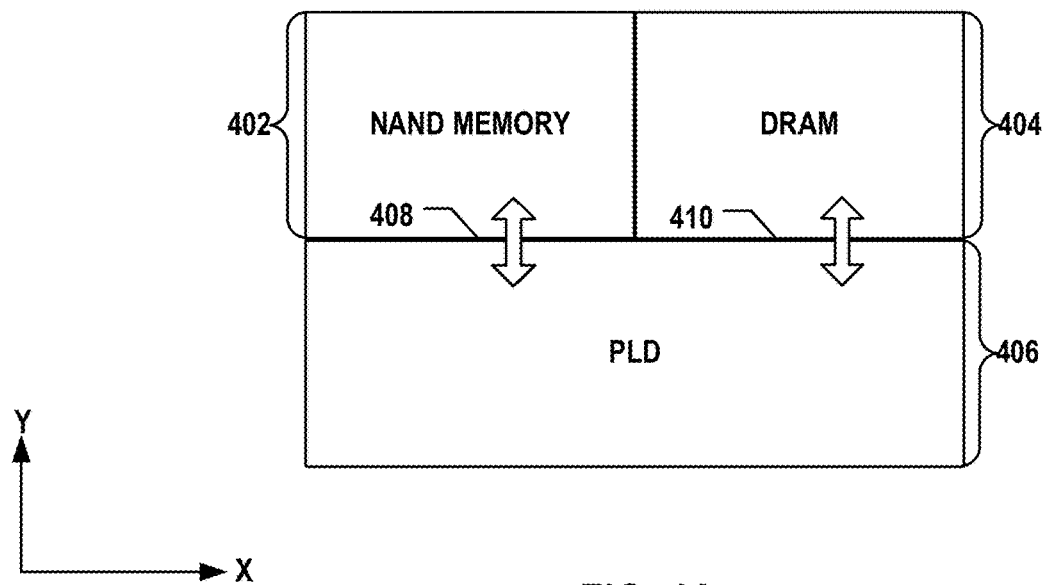
FIG. 4A illustrates a schematic view of a cross-section of an exemplary semiconductor device having a programmable logic device and heterogeneous memories, according to some embodiments.

FIG. 4A illustrates a schematic view of a cross-section of an exemplary semiconductor device 400 having a programmable logic device and heterogeneous memories, according to some embodiments. Semiconductor device 400 represents an example of bonded semiconductor devices. The components of semiconductor device 400 (e.g., a programmable logic device (PLD), NAND memory, and DRAM) can be formed separately on different substrates and then joined together to form a bonded chip.

Semiconductor device 400 can include a first semiconductor structure 402 including an array of NAND memory cells. That is, first semiconductor structure 402 can be a NAND flash memory device in which memory cells are provided in the form of an array of 3D NAND memory strings and/or an array of two-dimensional (2D) NAND memory cells. NAND memory cells can be organized into pages, which are then organized into blocks in which each NAND memory cell is electrically connected to a separate line called a bit line (BL). All memory cells with the same vertical position in the NAND memory cell can be electrically connected through the control gates by a word line (WL). In some embodiments, a memory plane contains a certain number of blocks that are electrically connected through the same bit line.

In some embodiments, the array of NAND memory cells is an array of 2D NAND memory cells, each of which includes floating-gate transistors. The array of 2D NAND memory cells includes a plurality of 2D NAND memory strings, each of which includes a plurality of memory cells (e.g., 32 to 128 memory cells) connected in series (resembling a NAND gate) and two select transistors, according to some embodiments. Each 2D NAND memory string is arranged in the same plane on the substrate (in 2D), according to some embodiments. In some embodiments, the array of NAND memory cells is an array of 3D NAND memory strings, each of which extends vertically above the substrate (in 3D) through a memory stack. Depending on the 3D NAND technology (e.g., the number of layers/tiers in the memory stack), a 3D NAND memory string typically includes 32 to 256 NAND memory cells, each of which includes a floating-gate transistor or a charge-trap transistor Semiconductor device 400 can also include a second semiconductor structure 404 including an array of DRAM cells. That is, second semiconductor structure 404 can be a DRAM memory device. DRAM requires periodic refreshing of the memory cells. In some embodiments, each DRAM cell includes a capacitor for storing a bit of data as a positive or negative electrical charge as well as one or more transistors that control access to it. In one example, each DRAM cell is a one-transistor, one-capacitor (1T1C) cell.

Semiconductor device 400 can further include a third semiconductor structure 406 including a programmable logic device. In some embodiments, the programmable logic device in third semiconductor structure 406 uses complementary metal-oxide-semiconductor (CMOS) technology. The programmable logic device can be implemented with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.) to achieve high speed.

A programmable logic device is an electronic component used to build reconfigurable digital circuits, which has an undefined function at the time of manufacture and programmed (reconfigured) by using a program after the manufacturing. The programmable logic device can include, for example, PLA, PAL, GAL, CPLD, and FPGA. FPGA is an integrated circuit that can be configured by a customer or a designer after manufacturing, i.e., "field-programmable," using a hardware description language (HDL). FPGAs include an array of programmable logic blocks and a hierarchy of reconfigurable interconnects that allow the programmable logic blocks to be connected in different configurations to implement different logic functions, according to some embodiments. The programmable logic blocks, also known as configurable logic blocks (CLBs), slices, or logic cells, are the basic logic unit of an FPGA, can be made up of two basic components: flip-flops and lookup tables (LUTs). Some FPGAs further include fixed-function logic blocks (e.g., multipliers), memory (e.g., embedded RAM), and I/O blocks.

Unlike processors, FPGAs are truly parallel in nature, so different processing operations do not have to compete for the same resources, according to some embodiments. Each independent processing task can be assigned to a dedicated section of the FPGA and can function autonomously without any influence from other logic blocks. As a result, the performance of one part of the application is not affected when adding more processing, according to some embodiments. In some embodiments. another benefit of FPGAs over processor-based systems is that the application logic is implemented in hardware circuits rather than executing on top of an operating system (OS), drivers, and application software.

Other processing units (also known as "logic circuits") besides the programmable logic device can be formed in third semiconductor structure 406 as well, such as the entirety or part of the peripheral circuits of the NAND memory in first semiconductor structure 402 and/or the entirety or part of the peripheral circuits of DRAM in second semiconductor structure 404. In some embodiments, third semiconductor structure 406 of semiconductor device 400 further includes the entirety or part of the peripheral circuits of the NAND memory in first semiconductor structure 402. The peripheral circuit (also known as control and sensing circuits) can include any suitable digital, analog, and/or mixed-signal circuits used for facilitating the operations of the NAND memory. For example, the peripheral circuit can include one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). In some embodiments, third semiconductor structure 406 of semiconductor device 400 further includes the entirety or part the peripheral circuits of the DRAM in second semiconductor structure 404. The peripheral circuits (also known as control and sensing circuits) can include any suitable digital, analog, and/or mixed-signal circuits used for facilitating the operations of the DRAM. For example, the peripheral circuits can include one or more of an input/output buffer, a decoder (e.g., a row decoder and a column decoder), a sense amplifier, or any active or passive components of the circuit (e.g., transistors, diodes, resistors, or capacitors). In some embodiments, first semiconductor structure 402 includes the entirety or part of the peripheral circuits of the NAND memory, and second semiconductor structure 404 includes the entirety or part of the peripheral circuits of the DRAM.

As shown in FIG. 4A, semiconductor device 400 further includes a first bonding interface 408 vertically between first semiconductor structure 402 and third semiconductor structure 406, and a second bonding interface 410 vertically between second semiconductor structure 404 and third semiconductor structure 406. First bonding interface 408 and second bonding interface 410 are in the same plane, according to some embodiments. That is, in some embodiments, first semiconductor structure 402 and second semiconductor structure 404 are not stacked over one another, but instead, both are stacked over and in contact with third semiconductor structure 406. Third semiconductor structure 406 can have a size larger than the size of first or second semiconductor structure 402 or 404 to accommodate both first and second semiconductor structures 402 and 404.

As described below in detail, first, second, and third semiconductor structures 402, 404, and 406 can be fabricated separately (and in parallel in some embodiments) such that the thermal budget of fabricating one of first, second, and third semiconductor structures 402, 404, and 406 does not limit the processes of fabricating another one of first, second, and third semiconductor structures 402, 404, and 406. Moreover, a large number of interconnects (e.g., bonding contacts) can be formed through first and second bonding interfaces 408 and 410 to make direct, short-distance (e.g., micron-level) electrical connections between first and third semiconductor structures 402 and 406 and between second and third semiconductor structures 404 and 406, respectively, as opposed to the long-distance (e.g., millimeter or centimeter-level) chip-to-chip data bus on the circuit board, such as PCB, thereby eliminating chip interface delay and achieving high-speed I/O throughput with reduced power consumption. Data transfer between the NAND memory in first semiconductor structure 402 and the programmable logic device in third semiconductor structure 406 can be performed through the interconnects (e.g., bonding contacts) across first bonding interface 408. Similarly, data transfer between the DRAM in second semiconductor structure 404 and the programmable logic device in third semiconductor structure 406 can be performed through the interconnects (e.g., bonding contacts) across second bonding interface 410. By vertically integrating first, second, and third semiconductor structures 402, 404, and 406, the chip size can be reduced, and the memory cell density can be increased. Furthermore, as a "unified" chip, by integrating multiple discrete chips (e.g., the programmable logic device and heterogeneous memories) into a single bonded chip (e.g., semiconductor device 400), faster system speed and smaller PCB size can be achieved as well.

Figure 4B:
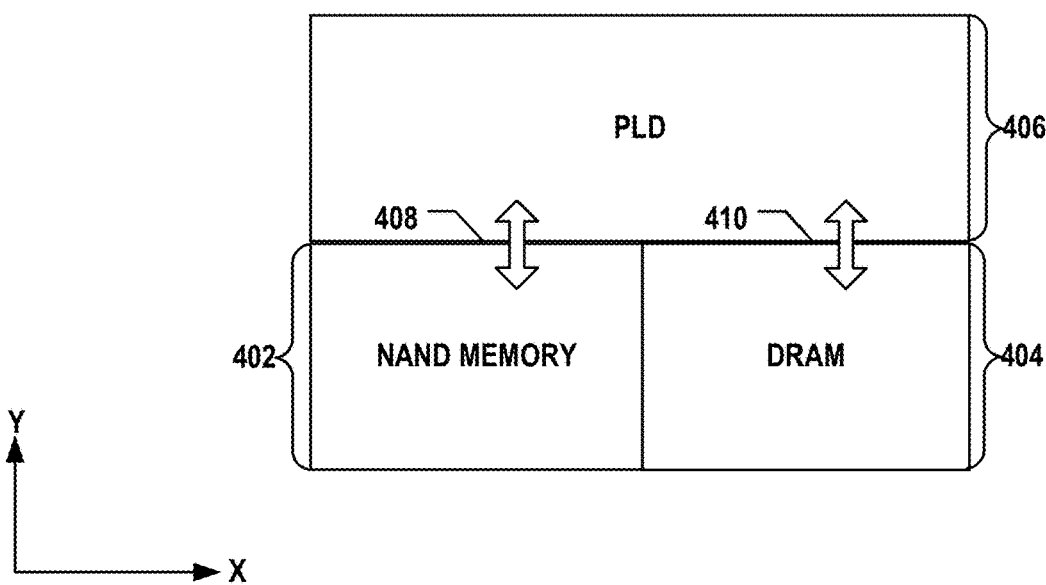
FIG. 4B illustrates a schematic view of a cross-section of another exemplary semiconductor device having a programmable logic device and heterogeneous memories, according to some embodiments.

It is understood that the relative positions of stacked first, second, and third semiconductor structures 402, 404, and 406 are not limited. FIG. 4B illustrates a schematic view of a cross-section of another exemplary semiconductor device 401 having a programmable logic device and heterogeneous memories, according to some embodiments. Different from semiconductor device 400 in FIG. 4A in which third semiconductor structure 406 including the programmable logic device is below first semiconductor structure 402 including the array of NAND memory cells and second semiconductor structure 404 including the array of DRAM cells, in semiconductor device 401 in FIG. 4B, third semiconductor structure 406 is above first semiconductor structure 402 and second semiconductor structure 404. Nevertheless, first bonding interface 408 is formed vertically between first and third semiconductor structures 402 and 406 in semiconductor device 401, and first and third semiconductor structures 402 and 406 are joined vertically through bonding (e.g., hybrid bonding) according to some embodiments. Similarly, second bonding interface 410 is formed vertically between second and third semiconductor structures 404 and 406 in semiconductor device 401, and second and third semiconductor structures 404 and 406 are joined vertically through bonding (e.g., hybrid bonding) according to some embodiments. Data transfer between the NAND memory in first semiconductor structure 402 and the programmable logic device in third semiconductor structure 406 can be performed through the interconnects (e.g., bonding contacts) across first bonding interface 408. Similarly, data transfer between the DRAM in second semiconductor structure 404 and the programmable logic device in third semiconductor structure 406 can be performed through the interconnects (e.g., bonding contacts) across second bonding interface 410.

Figure 5A:
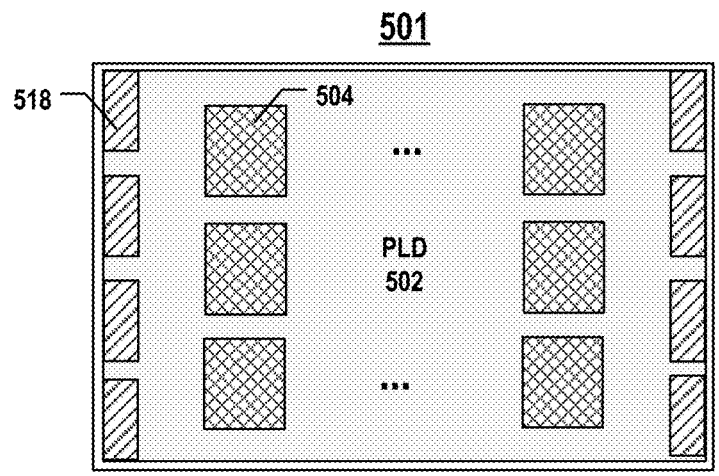
FIG. 5A illustrates a schematic plan view of an exemplary semiconductor structure having a programmable logic device, according to some embodiments.

FIG. 5A illustrates a schematic plan view of an exemplary semiconductor structure 501 having a programmable logic device, according to some embodiments. Semiconductor structure 501 may be one example of third semiconductor structure 406 in FIGS. 4A and 4B. Semiconductor structure 501 can include a programmable logic device (PLD) 502 fabricated using the logic process. PLD 502 can include one or more of PLAs, PALs, GALs, CPLDs, FPGAs, to name a few. PLD 502 includes one or more of FPGA cores, each of which includes a plurality of programmable logic blocks 504 arranged in an array, according to some embodiments. For example, each programmable logic blocks 504 may include one or more LUTs. One or more programmable logic blocks 504 can be configured to perform an independent processing task. In some embodiments, PLD 502 further includes I/O blocks 518. By replacing processors with PLD 502, such as FPGAs, a cache outside of PLD 502 may not be necessary. In some embodiments, semiconductor structure 501 does not include an SRAM cache, which further reduces the size of semiconductor structure 501. It is understood that although each programmable logic block 504 may still include its own memory, such as registers, the memory is dedicated to respective programmable logic block 504 and is not considered an "SRAM cache" herein, which can be shared by other components.

Figure 5B:
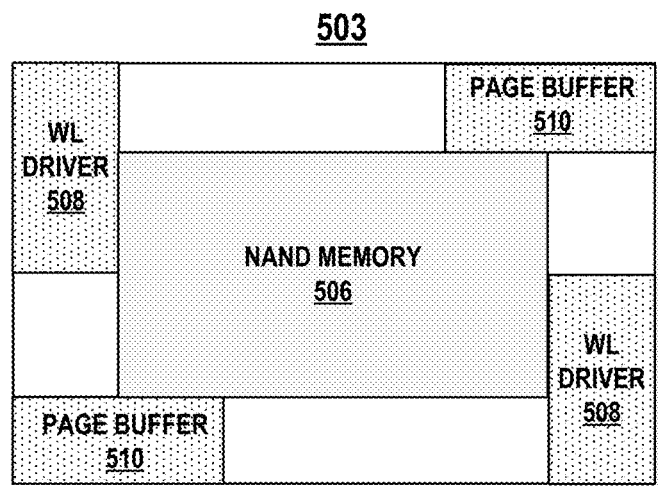
FIG. 5B illustrates a schematic plan view of an exemplary semiconductor structure having NAND memory and peripheral circuits, according to some embodiments.

FIG. 5B illustrates a schematic plan view of an exemplary semiconductor structure 503 having NAND memory and peripheral circuits, according to some embodiments. Semiconductor structure 503 may be one example of first semiconductor structure 402 in FIGS. 4A and 4B. Semiconductor structure 503 can include NAND memory 506 on the same substrate as the peripheral circuits of NAND memory 506. Semiconductor structure 503 can include all the peripheral circuits for controlling and sensing NAND memory 506, including, for example, word line drivers 508, page buffers 510, and any other suitable devices. FIG. 5B shows an exemplary layout of the peripheral circuit (e.g., word line drivers 508, page buffers 510) and NAND memory 506 in which the peripheral circuit (e.g., word line drivers 508, page buffers 510) and NAND memory 506 are formed in different regions on the same plane. For example, the peripheral circuit (e.g., word line drivers 508, page buffers 510) may be formed outside NAND memory 506.

Figure 5C:
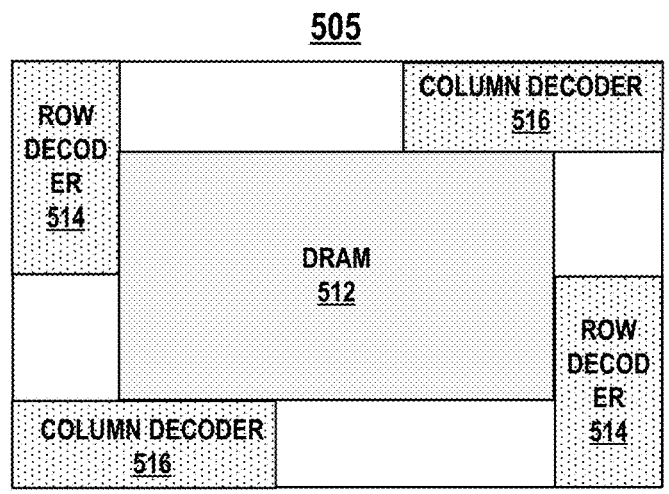
FIG. 5C illustrates a schematic plan view of an exemplary semiconductor structure having DRAM and peripheral circuits, according to some embodiments.

FIG. 5C illustrates a schematic plan view of an exemplary semiconductor structure 505 having DRAM and peripheral circuits, according to some embodiments. Semiconductor structure 505 may be one example of second semiconductor structure 404 in FIGS. 4A and 4B. Semiconductor structure 505 can include DRAM 512 on the same substrate as the peripheral circuits of DRAM 512. Semiconductor structure 505 can include all the peripheral circuits for controlling and sensing DRAM 512, including, for example, row decoders 514, column decoders 516, and any other suitable devices. FIG. 5C shows an exemplary layout of the peripheral circuit (e.g., row decoders 514, column decoders 516) and DRAM 512 in which the peripheral circuit (e.g., row decoders 514, column decoders 516) and DRAM 512 are formed in different regions on the same plane. For example, the peripheral circuit (e.g., row decoders 514, column decoders 516) may be formed outside of DRAM 512.

It is understood that the layouts of semiconductor structures 501, 503, and 505 are not limited to the exemplary layouts in FIGS. 5A-5C. In some embodiments, part of the peripheral circuits of NAND memory 506 (e.g., one or more of word line drivers 508, page buffers 510, and any other suitable devices) may be in semiconductor structure 501 having PLD 502. That is, the peripheral circuits of NAND memory 506 may be distributed on both semiconductor structures 501 and 503, according to some other embodiments. In some embodiments, part of the peripheral circuits of DRAM 512 (e.g., one or more of row decoders 514, column decoders 516, and any other suitable devices) may be in semiconductor structure 501 having PLD 502. That is, the peripheral circuits of DRAM 512 may be distributed on both semiconductor structures 501 and 505, according to some other embodiments. In some embodiments, at least some of the peripheral circuits (e.g., word line drivers 508, page buffers 510) and NAND memory 506 (e.g., the array of NAND memory cells) are stacked one over another, i.e., in different planes. For example, NAND memory 506 (e.g., the array of NAND memory cells) may be formed above or below the peripheral circuits to further reduce the chip size. In some embodiments, at least some of the peripheral circuits (e.g., row decoders 514, column decoders 516) and DRAM 512 (e.g., the array of DRAM cells) are stacked one over another, i.e., in different planes. For example, DRAM 512 (e.g., the array of DRAM cells) may be formed above or below the peripheral circuits to further reduce the chip size.

Figure 6A:
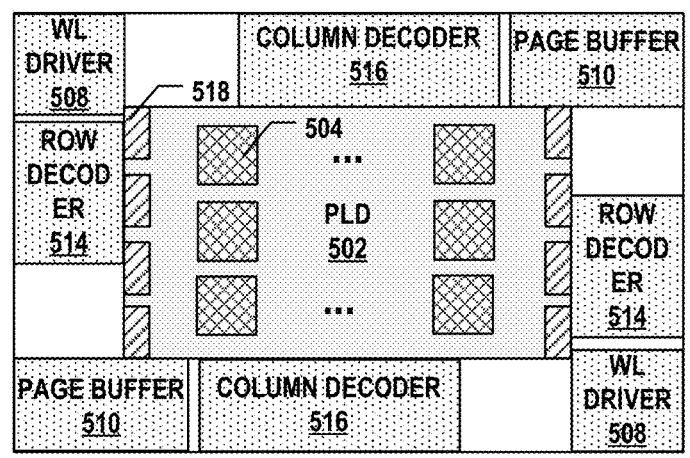
FIG. 6A illustrates a schematic plan view of an exemplary semiconductor structure having a programmable logic device and peripheral circuits, according to some embodiments.

FIG. 6A illustrates a schematic plan view of an exemplary semiconductor structure 601 having a programmable logic device and peripheral circuits, according to some embodiments. Semiconductor structure 601 may be one example of third semiconductor structure 406 in FIGS. 4A and 4B. Semiconductor structure 601 can include PLD 502 on the same substrate as and the peripheral circuits of both NAND memory 506 and DRAM 512 (e.g., word line drivers 508, page buffers 510, row decoders 514, column decoders 516) and fabricated using the same logic process as the peripheral circuits. PLD 502 can include one or more of PLAs, PALs, GALs, CPLDs, FPGAs, to name a few. PLD 502 includes one or more of FPGA cores, each of which includes programmable logic blocks 504 arranged in an array, according to some embodiments. For example, each programmable logic blocks 504 may include one or more LUTs. In some embodiments, PLD 502 further includes I/O blocks 518.

The peripheral circuits (e.g., word line drivers 508, page buffers 510, row decoders 514, column decoders 516) can be disposed outside of PLD 502. For example, FIG. 6A shows an exemplary layout in which the peripheral circuits are distributed outside of PLD 502. Semiconductor structure 601 can include all the peripheral circuits for controlling and sensing NAND memory 506, including, for example, word line drivers 508, page buffers 510, and any other suitable devices. Semiconductor structure 601 can also include all the peripheral circuits for controlling and sensing DRAM 512, including, for example, row decoders 514, column decoders 516, and any other suitable devices. FIG. 6A shows an exemplary layout of the peripheral circuits (e.g., word line drivers 508, page buffers 510, row decoders 514, column decoders 516) in which the peripheral circuits are formed in the same plane outside of PLD 502. It is understood that in some embodiments, at least some of the peripheral circuits (e.g., word line drivers 508, page buffers 510, row decoders 514, column decoders 516) and PLD 502 are stacked one over another, i.e., in different planes. For example, PLD 502 may be formed above or below the peripheral circuits to further reduce the chip size.

Figure 6B:
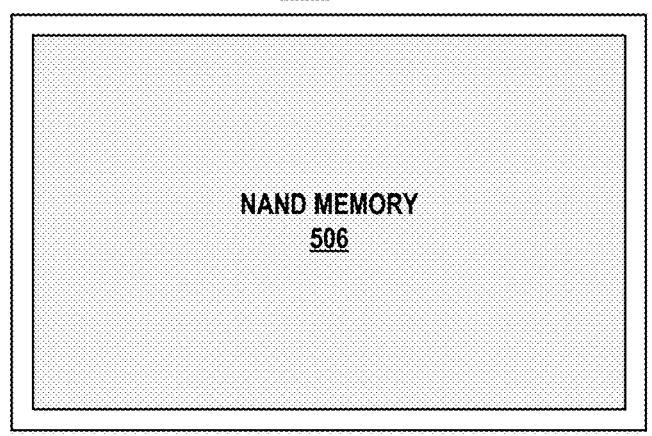
FIG. 6B illustrates a schematic plan view of an exemplary semiconductor structure having NAND memory, according to some embodiments.

FIG. 6B illustrates a schematic plan view of an exemplary semiconductor structure 603 having NAND memory, according to some embodiments. Semiconductor structure 603 may be one example of first semiconductor structure 402 in FIGS. 4A and 4B. By moving all the peripheral circuits (e.g., word line drivers 508, page buffers 510) away from semiconductor structure 603 (e.g., to semiconductor structure 601), the size of NAND memory 506 (e.g., the number of NAND memory cells) in semiconductor structure 603 can be increased.

Figure 6C:
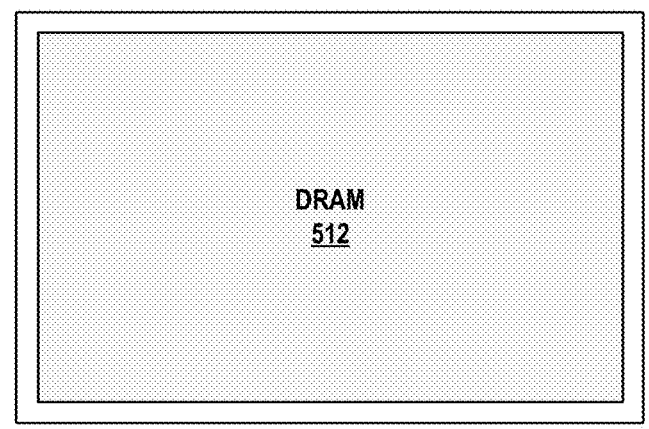
FIG. 6C illustrates a schematic plan view of an exemplary semiconductor structure having DRAM, according to some embodiments.

FIG. 6C illustrates a schematic plan view of an exemplary semiconductor structure 605 having DRAM, according to some embodiments. Semiconductor structure 605 may be one example of second semiconductor structure 404 in FIGS. 4A and 4B. By moving all the peripheral circuits (e.g., row decoders 514, column decoders 516) away from semiconductor structure 605 (e.g., to semiconductor structure 601), the size of DRAM 512 (e.g., the number of DRAM cells) in semiconductor structure 605 can be increased.

Figure 7A:
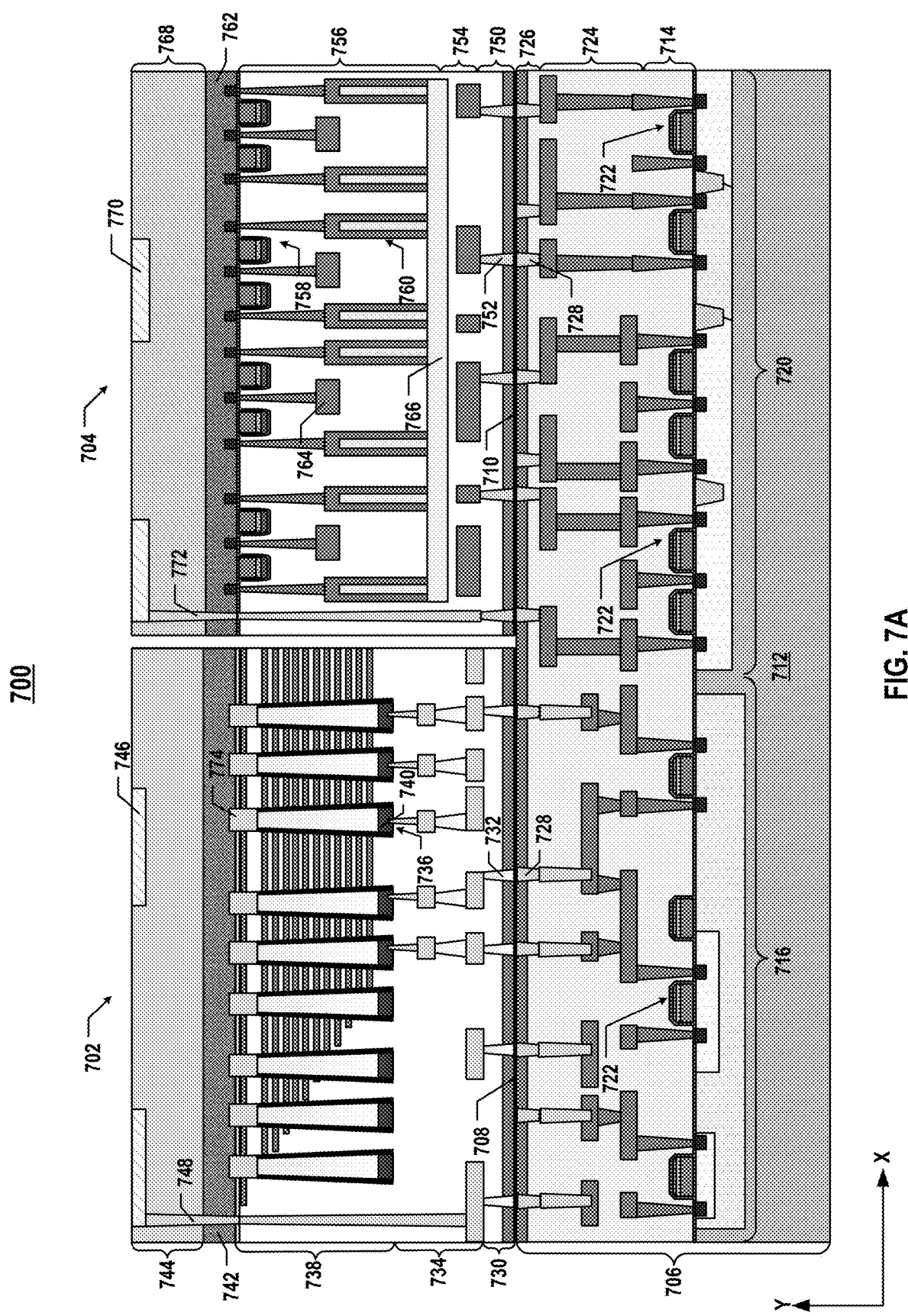
FIG. 7A illustrates a cross-section of an exemplary semiconductor device having a programmable logic device and heterogeneous memories, according to some embodiments.

FIG. 7A illustrates a cross-section of an exemplary semiconductor device 700 having a programmable logic device and heterogeneous memories, according to some embodiments. As one example of semiconductor device 400 described above with respect to FIG. 4A, semiconductor device 700 is a bonded chip including a first semiconductor structure 702, a second semiconductor structure 704, and a third semiconductor structure 706 over which both first and second semiconductor structures 702 and 704 are stacked. First and third semiconductor structures 702 and 706 are joined at a first bonding interface 708 therebetween, according to some embodiments. Second and third semiconductor structures 704 and 706 are jointed at a second bonding interface 710 therebetween, according to some embodiments. First bonding interface 708 and second bonding interface 710 are in the same plane, for example, at the top surface of third semiconductor structure 706 according to some embodiments. As shown in FIG. 7A, third semiconductor structure 706 can include a substrate 712, which can include silicon (e.g., single crystalline silicon, c-Si), silicon germanium (SiGe), gallium arsenide (GaAs), germanium (Ge), silicon on insulator (SOI), or any other suitable materials.

Third semiconductor structure 706 of semiconductor device 700 can include a device layer 714 above substrate 712. It is noted that x- and y-axes are added in FIG. 7A to further illustrate the spatial relationship of the components in semiconductor device 700. Substrate 712 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., semiconductor device 700) is determined relative to the substrate of the semiconductor device (e.g., substrate 712) in the y-direction (the vertical direction or thickness direction) when the substrate is positioned in the lowest plane of the semiconductor device in the y-direction. The same notion for describing the spatial relationship is applied throughout the present disclosure.

In some embodiments, device layer 714 includes a programmable logic device 716 on substrate 712. In some embodiments, device layer 714 further includes a peripheral circuit 720 on substrate 712 and outside of programmable logic device 716. For example, peripheral circuit 720 may be part or the entirety of the peripheral circuits for controlling and sensing the NAND memory and/or DRAM of semiconductor device 700 as described below in detail. In some embodiments, programmable logic device 716 includes a plurality of transistors 722 forming an array of programmable logic blocks (any I/O blocks in some cases) as described above in detail. In some embodiments, transistors 722 also form peripheral circuit 720, i.e., any suitable digital, analog, and/or mixed-signal control and sensing circuits used for facilitating the operation of the NAND memory and/or DRAM including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors, etc.).

Transistors 722 can be formed "on" substrate 712, in which the entirety or part of transistors 722 are formed in substrate 712 (e.g., below the top surface of substrate 712) and/or directly on substrate 712. Isolation regions (e.g., shallow trench isolations (STIs)) and doped regions (e.g., source regions and drain regions of transistors 722) can be formed in substrate 712 as well. Transistors 722 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, third semiconductor structure 706 of semiconductor device 700 further includes an interconnect layer 724 above device layer 714 to transfer electrical signals to and from programmable logic device 716 (and peripheral circuit 720 if any). Interconnect layer 724 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Interconnect layer 724 can further include one or more interlayer dielectric (ILD) layers (also known as "intermetal dielectric (IMD) layers") in which the interconnect lines and via contacts can form. That is, interconnect layer 724 can include interconnect lines and via contacts in multiple ILD layers. The interconnect lines and via contacts in interconnect layer 724 can include conductive materials including, but not limited to, tungsten (W), cobalt (Co), copper (Cu), aluminum (Al), silicides, or any combination thereof. The ILD layers in interconnect layer 724 can include dielectric materials including, but not limited to, silicon oxide, silicon nitride, silicon oxynitride, low dielectric constant (low-k) dielectrics, or any combination thereof. In some embodiments, the devices in device layer 714 are electrically connected to one another through interconnects in interconnect layer 724. For example, peripheral circuit 720 may be electrically connected to programmable logic device 716 through interconnect layer 724.

As shown in FIG. 7A, third semiconductor structure 706 of semiconductor device 700 can further include a bonding layer 726 at first and second bonding interfaces 708 and 710 and above interconnect layer 724 and device layer 714 (including programmable logic device 716). Bonding layer 726 can include a plurality of bonding contacts 728 and dielectrics electrically isolating bonding contacts 728. Bonding contacts 728 can include conductive materials including, but not limited to, W, Co, Cu, Al, silicides, or any combination thereof. The remaining area of bonding layer 726 can be formed with dielectrics including, but not limited to, silicon oxide, silicon nitride, silicon oxynitride, low-k dielectrics, or any combination thereof. Bonding contacts 728 and surrounding dielectrics in bonding layer 726 can be used for hybrid bonding.

Similarly, as shown in FIG. 7A, first semiconductor structure 702 of semiconductor device 700 can also include a bonding layer 730 at first bonding interface 708 and above bonding layer 726 of third semiconductor structure 706. Bonding layer 730 can include a plurality of bonding contacts 732 and dielectrics electrically isolating bonding contacts 732. Bonding contacts 732 can include conductive materials including, but not limited to, W, Co, Cu, Al, silicides, or any combination thereof. The remaining area of bonding layer 730 can be formed with dielectrics including, but not limited to, silicon oxide, silicon nitride, silicon oxynitride, low-k dielectrics, or any combination thereof. Bonding contacts 732 and surrounding dielectrics in bonding layer 730 can be used for hybrid bonding. Bonding contacts 732 are in contact with some bonding contacts 728 (e.g., a first set of bonding contacts 728 directly below first semiconductor structure 702) at first bonding interface 708, according to some embodiments.

As described above, first semiconductor structure 702 can be bonded on top of third semiconductor structure 706 in a face-to-face manner at first bonding interface 708. In some embodiments, first bonding interface 708 is disposed between bonding layers 730 and 726 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, first bonding interface 708 is the place at which bonding layers 730 and 726 are met and bonded. In practice, first bonding interface 708 can be a layer with a certain thickness that includes part of the top surface of bonding layer 726 of third semiconductor structure 706 and the bottom surface of bonding layer 730 of first semiconductor structure 702.

In some embodiments, first semiconductor structure 702 of semiconductor device 700 further includes an interconnect layer 734 above bonding layer 730 to transfer electrical signals. Interconnect layer 734 can include a plurality of interconnects, such as MEOL interconnects and BEOL interconnects. In some embodiments, the interconnects in interconnect layer 734 also include local interconnects, such as bit line contacts and word line contacts. Interconnect layer 734 can further include one or more ILD layers in which the interconnect lines and via contacts can form. The interconnect lines and via contacts in interconnect layer 734 can include conductive materials including, but not limited to, W, Co, Cu, Al, silicides, or any combination thereof. The ILD layers in interconnect layer 734 can include dielectric materials including, but not limited to, silicon oxide, silicon nitride, silicon oxynitride, low-k dielectrics, or any combination thereof.

In some embodiments, first semiconductor structure 702 of semiconductor device 700 includes a NAND flash memory device in which memory cells are provided in the form of an array of 3D NAND memory strings 736 above interconnect layer 734 and bonding layer 730. Each 3D NAND memory string 736 extends vertically through a plurality of pairs each including a conductor layer and a dielectric layer, according to some embodiments. The stacked and interleaved conductor layers and dielectric layer are also referred to herein as a memory stack 738. The interleaved conductor layers and dielectric layers in memory stack 738 alternate in the vertical direction, according to some embodiments. In other words, except the ones at the top or bottom of memory stack 738, each conductor layer can be adjoined by two dielectric layers on both sides, and each dielectric layer can be adjoined by two conductor layers on both sides. The conductor layers can each have the same thickness or different thicknesses. Similarly, the dielectric layers can each have the same thickness or different thicknesses. The conductor layers can include conductor materials including, but not limited to, W, Co, Cu, Al, doped silicon, silicides, or any combination thereof. The dielectric layers can include dielectric materials including, but not limited to, silicon oxide, silicon nitride, silicon oxynitride, or any combination thereof.

In some embodiments, each 3D NAND memory string 736 is a "charge trap" type of NAND memory string including a semiconductor channel and a memory film. In some embodiments, the semiconductor channel includes silicon, such as amorphous silicon, polysilicon, or single crystalline silicon. In some embodiments, the memory film is a composite dielectric layer including a tunneling layer, a storage layer (also known as "charge trap/storage layer"), and a blocking layer. Each 3D NAND memory string 736 can have a cylinder shape (e.g., a pillar shape). The semiconductor channel, tunneling layer, storage layer, and blocking layer of the memory film are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as aluminum oxide ($Al_2O_3$), hafnium oxide ($HfO_2$) or tantalum oxide ($Ta_2O_5$) layer, and so on.

In some embodiments, 3D NAND memory strings 736 further include a plurality of control gates (each being part of a word line). Each conductor layer in memory stack 738 can act as a control gate for each memory cell of 3D NAND memory string 736. In some embodiments, each 3D NAND memory string 736 includes two plugs 774 and 740 at a respective end in the vertical direction. Plug 774 can include a semiconductor material, such as single-crystal silicon, which is epitaxially grown from a semiconductor layer 742. Plug 774 can function as the controller of the source select gate of 3D NAND memory string 736. Plug 774 can be at the upper end of 3D NAND memory string 736 and in contact with semiconductor layer 742. As used herein, the "upper end" of a component (e.g., 3D NAND memory string 736) is the end farther away from substrate 712 in the y-direction, and the "lower end" of the component (e.g., 3D NAND memory string 736) is the end closer to substrate 712 in the y-direction when substrate 712 is positioned in the lowest plane of semiconductor device 700. Another plug 740 can include semiconductor materials (e.g., polysilicon). By covering the upper end of 3D NAND memory string 736 during the fabrication of first semiconductor structure 702, plug 740 can function as an etch stop layer to prevent etching of dielectrics filled in 3D NAND memory string 736, such as silicon oxide and silicon nitride. In some embodiments, plug 740 functions as the drain of 3D NAND memory string 736.

In some embodiments, first semiconductor structure 702 further includes semiconductor layer 742 disposed above memory stack 738 and 3D NAND memory strings 736. Semiconductor layer 742 can be a thinned substrate on which memory stack 738 and 3D NAND memory strings 736 are formed. In some embodiments, semiconductor layer 742 includes single-crystal silicon from which plugs 774 can be epitaxially grown. In some embodiments, semiconductor layer 742 can include polysilicon, amorphous silicon, SiGe, GaAs, Ge, or any other suitable materials. Semiconductor layer 742 can also include isolation regions and doped regions (e.g., functioning as an array common source (ACS) for 3D NAND memory strings 736, not shown). Isolation regions (not shown) can extend across the entire thickness or part of the thickness of semiconductor layer 742 to electrically isolate the doped regions. In some embodiments, a pad oxide layer including silicon oxide is disposed between memory stack 738 and semiconductor layer 742.

It is understood that 3D NAND memory strings 736 are not limited to the "charge trap" type of 3D NAND memory strings and may be "floating gate" type of 3D NAND memory strings in other embodiments. It is also understood that memory stack 738 is not limited to having the single-deck structure but also can have a multiple-deck structure with inter-deck plugs among different decks for electrical connections of 3D NAND memory strings 736. Semiconductor layer 742 may include polysilicon as the source plate of the "floating gate" type of 3D NAND memory strings.

As shown in FIG. 7A, first semiconductor structure 702 of semiconductor device 700 can further include a pad-out interconnect layer 744 above semiconductor layer 742. Pad-out interconnect layer 744 can include interconnects, e.g., contact pads 746, in one or more ILD layers. Pad-out interconnect layer 744 and interconnect layer 734 can be formed at opposite sides of semiconductor layer 742. In some embodiments, interconnects in pad-out interconnect layer 744 can transfer electrical signals between semiconductor device 700 and outside circuits, e.g., for pad-out purposes.

In some embodiments, first semiconductor structure 702 further includes one or more contacts 748 extending through semiconductor layer 742 to electrically connect pad-out interconnect layer 744 and interconnect layers 734 and 724. As a result, programmable logic device 716 (and peripheral circuit 720 if any) can be electrically connected to array of 3D NAND memory strings 736 through interconnect layers 734 and 724 as well as bonding contacts 732 and 728. Moreover, programmable logic device 716 and array of 3D NAND memory strings 736 can be electrically connected to outside circuits through contacts 748 and pad-out interconnect layer 744.

As illustrated in FIG. 7A, second semiconductor structure 704 of semiconductor device 700 can also include a bonding layer 750 at second bonding interface 710 and above bonding layer 726 of third semiconductor structure 706. Bonding layer 750 can include a plurality of bonding contacts 752 and dielectrics electrically isolating bonding contacts 752. Bonding contacts 752 can include conductive materials including, but not limited to, W, Co, Cu, Al, silicides, or any combination thereof. The remaining area of bonding layer 750 can be formed with dielectrics including, but not limited to, silicon oxide, silicon nitride, silicon oxynitride, low-k dielectrics, or any combination thereof. Bonding contacts 752 and surrounding dielectrics in bonding layer 750 can be used for hybrid bonding. Bonding contacts 752 are in contact with some bonding contacts 728 (e.g., a second set of bonding contacts 728 directly below second semiconductor structure 704) at second bonding interface 710, according to some embodiments.

As described above, second semiconductor structure 704 can be bonded on top of third semiconductor structure 706 in a face-to-face manner at second bonding interface 710, next to first semiconductor structure 702 bonded on top of third semiconductor structure 706 in a face-to-face manner as well at first bonding interface 708. As a result, first and second bonding interfaces 708 and 710 can be in the same plane, for example, both at the top surface of third semiconductor structure 706. In other words, first bonding interface 708 is flush with second bonding interface 710, according to some embodiments. In some embodiments, second bonding interface 710 is disposed between bonding layers 750 and 726 as a result of hybrid bonding as well. In some embodiments, second bonding interface 710 is the place at which bonding layers 750 and 726 are met and bonded. In practice, second bonding interface 710 can be a layer with a certain thickness that includes part of the top surface of bonding layer 726 of third semiconductor structure 706 and the bottom surface of bonding layer 750 of second semiconductor structure 704.

In some embodiments, second semiconductor structure 704 of semiconductor device 700 further includes an interconnect layer 754 above bonding layer 750 to transfer electrical signals. Interconnect layer 754 can include a plurality of interconnects, such as MEOL interconnects and BEOL interconnects. In some embodiments, interconnects in interconnect layer 754 also include local interconnects, such as bit line contacts and word line contacts. Interconnect layer 754 can further include one or more ILD layers in which the interconnect lines and via contacts can form. The interconnect lines and via contacts in interconnect layer 754 can include conductive materials including, but not limited to, W, Co, Cu, Al, silicides, or any combination thereof. The ILD layers in interconnect layer 754 can include dielectric materials including, but not limited to, silicon oxide, silicon nitride, silicon oxynitride, low-k dielectrics, or any combination thereof.

Second semiconductor structure 704 of semiconductor device 700 can further include an array of DRAM cells 756 above interconnect layer 754 and bonding layer 750. In some embodiments, each DRAM cell 756 includes a DRAM selection transistor 758 and a capacitor 760. DRAM cell 756 can be a 1T1C cell consisting of one transistor and one capacitor. It is understood that DRAM cell 756 may be of any suitable configurations, such as 2T1C cell, 3T1C cell, etc. In some embodiments, DRAM selection transistors 758 are formed "on" a semiconductor layer 762, in which the entirety or part of DRAM selection transistors 758 are formed in semiconductor layer 762 (e.g., below the top surface of semiconductor layer 762) and/or directly on semiconductor layer 762. Isolation regions (e.g., STIs) and doped regions (e.g., source regions and drain regions of DRAM selection transistors 758) can be formed in semiconductor layer 762 as well. In some embodiments, capacitors 760 are disposed below DRAM selection transistors 758. Each capacitor 760 includes two electrodes, one of which is electrically connected to one node of respective DRAM selection transistor 758, according to some embodiments. Another node of each DRAM selection transistor 758 is electrically connected to a bit line 764 of DRAM, according to some embodiments. Another electrode of each capacitor 760 can be electrically connected to a common plate 766, e.g., a common ground. It is understood that the structure and configuration of DRAM cell 756 are not limited to the example in FIG. 7A and may include any suitable structure and configuration. For example, capacitor 760 may be a planar capacitor, a stack capacitor, a multi-fins capacitor, a cylinder capacitor, a trench capacitor, or a substrate-plate capacitor.

In some embodiments, second semiconductor structure 704 further includes semiconductor layer 762 disposed above and in contact with array of DRAM cells 756. Semiconductor layer 762 can be a thinned substrate on which DRAM selection transistors 758 are formed. In some embodiments, semiconductor layer 762 includes single-crystal silicon. In some embodiments, semiconductor layer 762 can include polysilicon, amorphous silicon, SiGe, GaAs, Ge, silicide or any other suitable materials. Semiconductor layer 762 can also include isolation regions and doped regions (e.g., as the sources and drains of DRAM selection transistors 758).

As shown in FIG. 7A, second semiconductor structure 704 of semiconductor device 700 can further include a pad-out interconnect layer 768 above semiconductor layer 762. Pad-out interconnect layer 768 can include interconnects, e.g., contact pads 770, in one or more ILD layers. Pad-out interconnect layer 768 and interconnect layer 754 can be formed at opposite sides of semiconductor layer 762. In some embodiments, interconnects in pad-out interconnect layer 768 can transfer electrical signals between semiconductor device 700 and outside circuits, e.g., for pad-out purposes.

In some embodiments, second semiconductor structure 704 further includes one or more contacts 772 extending through semiconductor layer 762 to electrically connect pad-out interconnect layer 768 and interconnect layers 754 and 724. As a result, programmable logic device 716 (and peripheral circuit 720 if any) can be electrically connected to array of DRAM cells 756 through interconnect layers 754 and 724 as well as bonding contacts 752 and 728. Also, array of 3D NAND memory strings 736 in first semiconductor structure 702 can be electrically connected to array of DRAM cells 756 in second semiconductor structure 704 through interconnect layers 734, 724, and 754 as well as bonding contacts 732, 728, and 752. Moreover, programmable logic device 716 and array of DRAM cells 756 can be electrically connected to outside circuits through contacts 772 and pad-out interconnect layer 768. As described above, by replacing processors with programmable logic device 716, each of first, second, and third semiconductor structures 702, 704, or 706 does not include an SRAM cache, according to some embodiments.

Figure 7B:
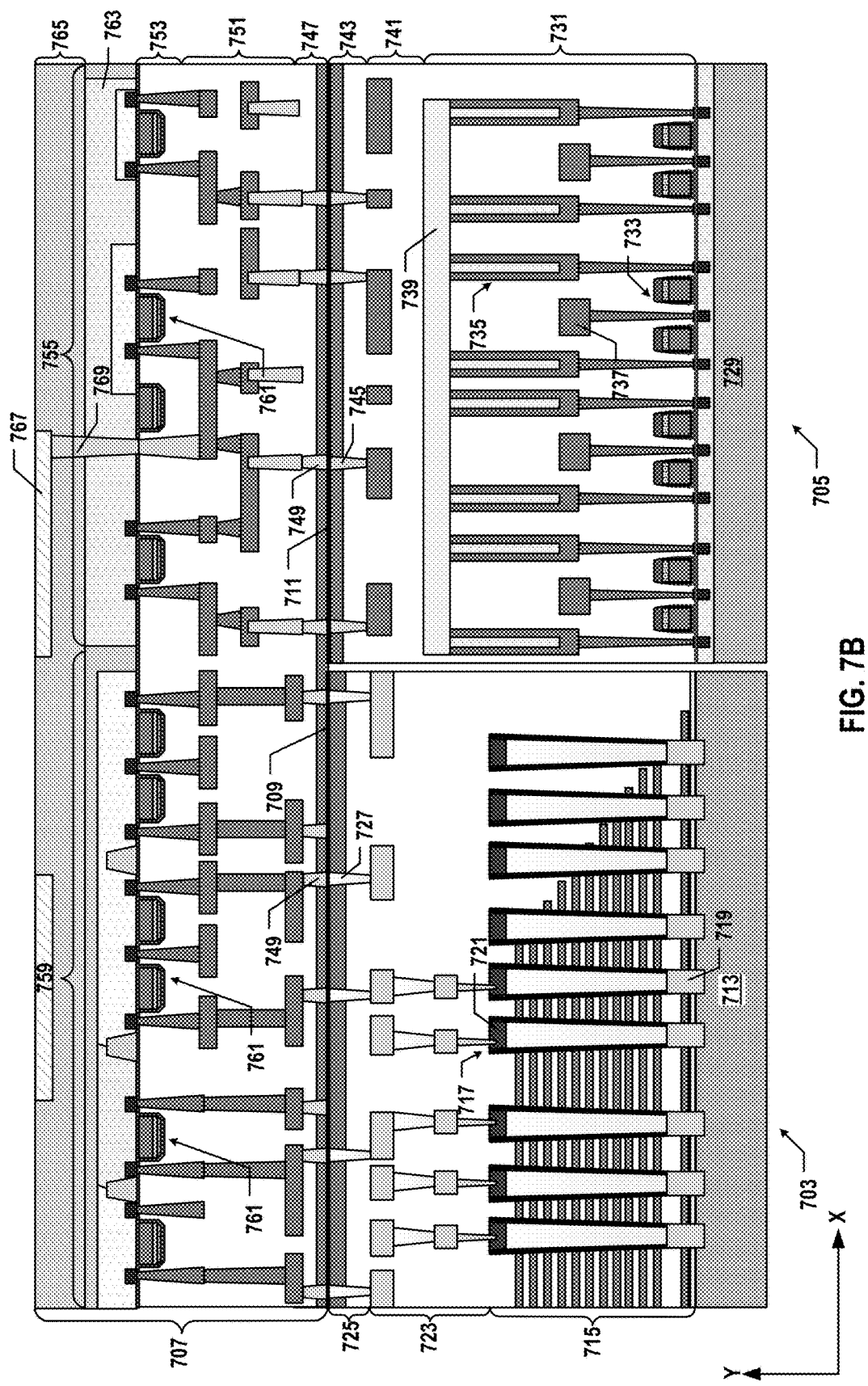
FIG. 7B illustrates a cross-section of another exemplary semiconductor device having a programmable logic device and heterogeneous memories, according to some embodiments.

FIG. 7B illustrates a cross-section of another exemplary semiconductor device 701 having a programmable logic device and heterogeneous memories, according to some embodiments. As one example of semiconductor device 401 described above with respect to FIG. 4B, semiconductor device 701 is a bonded chip including a third semiconductor structure 707 stacked over a first semiconductor structure 703 and a second semiconductor structure 705. Similar to semiconductor device 700 described above in FIG. 7A, semiconductor device 701 represents an example of a bonded chip in which third semiconductor structure 707 including a programmable logic device, first semiconductor structure 703 including NAND memory, and second semiconductor structure 705 including DRAM are formed separately and bonded in a face-to-face manner at a first bonding interface 709 and a second bonding interface 711, respectively. Different from semiconductor device 700 described above in FIG. 7A in which third semiconductor structure 706 including the programmable logic device is below first semiconductor structure 702 including the NAND memory and second semiconductor structure 704 including the DRAM, semiconductor device 701 in FIG. 7B includes third semiconductor structure 707 disposed above first semiconductor structure 703 and second semiconductor structure 705. It is understood that the details of similar structures (e.g., materials, fabrication process, functions, etc.) in both semiconductor devices 700 and 701 may not be repeated below.

First semiconductor structure 703 of semiconductor device 701 can include a substrate 713 and a memory stack 715 including interleaved conductor layers and dielectric layers above substrate 713. In some embodiments, an array of 3D NAND memory strings 717 each extends vertically through the interleaved conductor layers and dielectric layers in memory stack 715 above substrate 713. Each 3D NAND memory string 717 can include a semiconductor channel and a memory film. Each 3D NAND memory string 717 further includes two plugs 719 and 721 at its lower end and upper end, respectively. 3D NAND memory strings 717 can be "charge trap" type of 3D NAND memory strings or "floating gate" type of 3D NAND memory strings. In some embodiments, a pad oxide layer including silicon oxide is disposed between memory stack 715 and substrate 713.

In some embodiments, first semiconductor structure 703 of semiconductor device 701 also includes an interconnect layer 723 above memory stack 715 and 3D NAND memory strings 717 to transfer electrical signals to and from 3D NAND memory strings 717. Interconnect layer 723 can include a plurality of interconnects, including interconnect lines and via contacts. In some embodiments, interconnects in interconnect layer 723 also include local interconnects, such as bit line contacts and word line contacts. In some embodiments, first semiconductor structure 703 of semiconductor device 701 further includes a bonding layer 725 at first bonding interface 709 and above interconnect layer 723 and memory stack 715 (including 3D NAND memory strings 717 therethrough). Bonding layer 725 can include a plurality of bonding contacts 727 and dielectrics surrounding and electrically isolating bonding contacts 727.

Second semiconductor structure 705 of semiconductor device 701 can include a substrate 729 and an array of DRAM cells 731 on substrate 729. Although substrate 713 and substrate 729 are shown as two separate substrates in FIG. 7B, it is understood that in some embodiments, substrates 713 and 729 may be a single, continuous substrate. It is further understood that in some embodiments, another single, continuous substrate (e.g., not shown) may be formed below substrate 713 and substrate 729 and bonded to substrate 713 and 729 to provide further support to semiconductor device 701.

In some embodiments, each DRAM cell 731 includes a DRAM selection transistor 733 and a capacitor 735. DRAM cell 731 can be a 1T1C cell consisting of one transistor and one capacitor. It is understood that DRAM cell 731 may be of any suitable configuration, such as 2T1C cell, 3T1C cell, etc. In some embodiments, DRAM selection transistors 733 are formed "on" substrate 729, in which the entirety or part of DRAM selection transistors 733 are formed in substrate 729 and/or directly on substrate 729. In some embodiments, capacitors 735 are disposed above DRAM selection transistors 733. Each capacitor 735 includes two electrodes, one of which is electrically connected to one node of respective DRAM selection transistor 733, according to some embodiments. Another node of each DRAM selection transistor 733 is electrically connected to a bit line 737 of DRAM, according to some embodiments. Another electrode of each capacitor 735 can be electrically connected to a common plate 739, e.g., a common ground. It is understood that the structure and configuration of DRAM cell 731 are not limited to the example in FIG. 7B and may include any suitable structure and configuration.

In some embodiments, second semiconductor structure 705 of semiconductor device 701 also includes an interconnect layer 741 above array of DRAM cells 731 to transfer electrical signals to and from array of DRAM cells 731. Interconnect layer 741 can include a plurality of interconnects, including interconnect lines and via contacts. In some embodiments, interconnects in interconnect layer 741 also include local interconnects, such as bit line contacts and word line contacts. In some embodiments, second semiconductor structure 705 of semiconductor device 701 further includes a bonding layer 743 at second bonding interface 711 and above interconnect layer 741 and array of DRAM cells 731. Bonding layer 743 can include a plurality of bonding contacts 745 and dielectrics surrounding and electrically isolating bonding contacts 745.

As shown in FIG. 7B, third semiconductor structure 707 of semiconductor device 701 includes another bonding layer 747 at first bonding interface 709 and second bonding interface 711 and above bonding layer 725 of first semiconductor structure 703 and bonding layer 743 of second semiconductor structure 705. Bonding layer 747 can include a plurality of bonding contacts 749 and dielectrics surrounding and electrically isolating bonding contacts 749. Some bonding contacts 749 (e.g., a first set of bonding contacts 749 directly above first semiconductor structure 703) are in contact with bonding contacts 727 at first bonding interface 709, according to some embodiments. Some bonding contacts 749 (e.g., a second set of bonding contacts 749 directly above second semiconductor structure 705) are in contact with bonding contacts 745 at second bonding interface 711, according to some embodiments. First and second bonding interfaces 709 and 711 can be in the same plane, for example, both at the bottom surface of third semiconductor structure 707. In other words, first bonding interface 709 is flush with second bonding interface 711, according to some embodiments. In some embodiments, third semiconductor structure 707 of semiconductor device 701 also includes an interconnect layer 751 above bonding layer 747 to transfer electrical signals. Interconnect layer 751 can include a plurality of interconnects, including interconnect lines and via contacts.

Third semiconductor structure 707 of semiconductor device 701 can further include a device layer 753 above interconnect layer 751 and bonding layer 747. In some embodiments, device layer 753 includes a programmable logic device 755 above interconnect layer 751 and bonding layer 747. In some embodiments, device layer 753 further includes a peripheral circuit 759 above interconnect layer 751 and bonding layer 747 and outside of programmable logic device 755. For example, peripheral circuit 759 may be part or the entirety of the peripheral circuits for controlling and sensing array of 3D NAND memory strings 717 and/or array of DRAM cells 731. In some embodiments, the devices in device layer 753 are electrically connected to one another through interconnects in interconnect layer 751. For example, peripheral circuit 759 may be electrically connected to programmable logic device 755 through interconnect layer 751.

In some embodiments, programmable logic device 755 includes a plurality of transistors 761 forming an array of programmable logic blocks (any I/O blocks in some cases) as described above in detail. Transistors 761 can be formed "on" a semiconductor layer 763, in which the entirety or part of transistors 761 are formed in semiconductor layer 763 and/or directly on semiconductor layer 763. Isolation regions (e.g., STIs) and doped regions (e.g., source regions and drain regions of transistors 761) can be formed in semiconductor layer 763 as well. Transistors 761 can form peripheral circuit 759 as well. Transistors 761 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, third semiconductor structure 707 further includes semiconductor layer 763 disposed above device layer 753. Semiconductor layer 763 can be above and in contact with programmable logic device 755. Semiconductor layer 763 can be a thinned substrate on which transistors 761 are formed. In some embodiments, semiconductor layer 763 includes single-crystal silicon. In some embodiments, semiconductor layer 763 can include polysilicon, amorphous silicon, SiGe, GaAs, Ge, or any other suitable materials. Semiconductor layer 763 can also include isolation regions and doped regions.

As shown in FIG. 7B, third semiconductor structure 707 of semiconductor device 701 can further include a pad-out interconnect layer 765 above semiconductor layer 763. Pad-out interconnect layer 765 can include interconnects, e.g., contact pads 767, in one or more ILD layers. In some embodiments, interconnects in pad-out interconnect layer 765 can transfer electrical signals between semiconductor device 701 and outside circuits, e.g., for pad-out purposes. In some embodiments, third semiconductor structure 707 further includes one or more contacts 769 extending through semiconductor layer 763 to electrically connect pad-out interconnect layer 765 and interconnect layers 751, 723, and 741. As a result, programmable logic device 755 (and peripheral circuit 759 if any) can be electrically connected to array of 3D NAND memory strings 717 through interconnect layers 751 and 723 as well as bonding contacts 749 and 727, and programmable logic device 755 (and peripheral circuit 759 if any) can also be electrically connected to array of DRAM cells 731 through interconnect layers 751 and 741 as well as bonding contacts 749 and 745. Also, array of 3D NAND memory strings 717 in first semiconductor structure 703 are electrically connected to array of DRAM cells 731 in second semiconductor structure 705 through interconnect layers 723, 751, and 741 as well as bonding contacts 727, 749, and 745. Moreover, programmable logic device 755, array of 3D NAND memory strings 717, and array of DRAM cells 731 can be electrically connected to outside circuits through contacts 769 and pad-out interconnect layer 765. As described above, by replacing processors with programmable logic device 755, each of first, second, and third semiconductor structures 703, 705, or 707 does not include an SRAM cache, according to some embodiments.

Figure 9A:
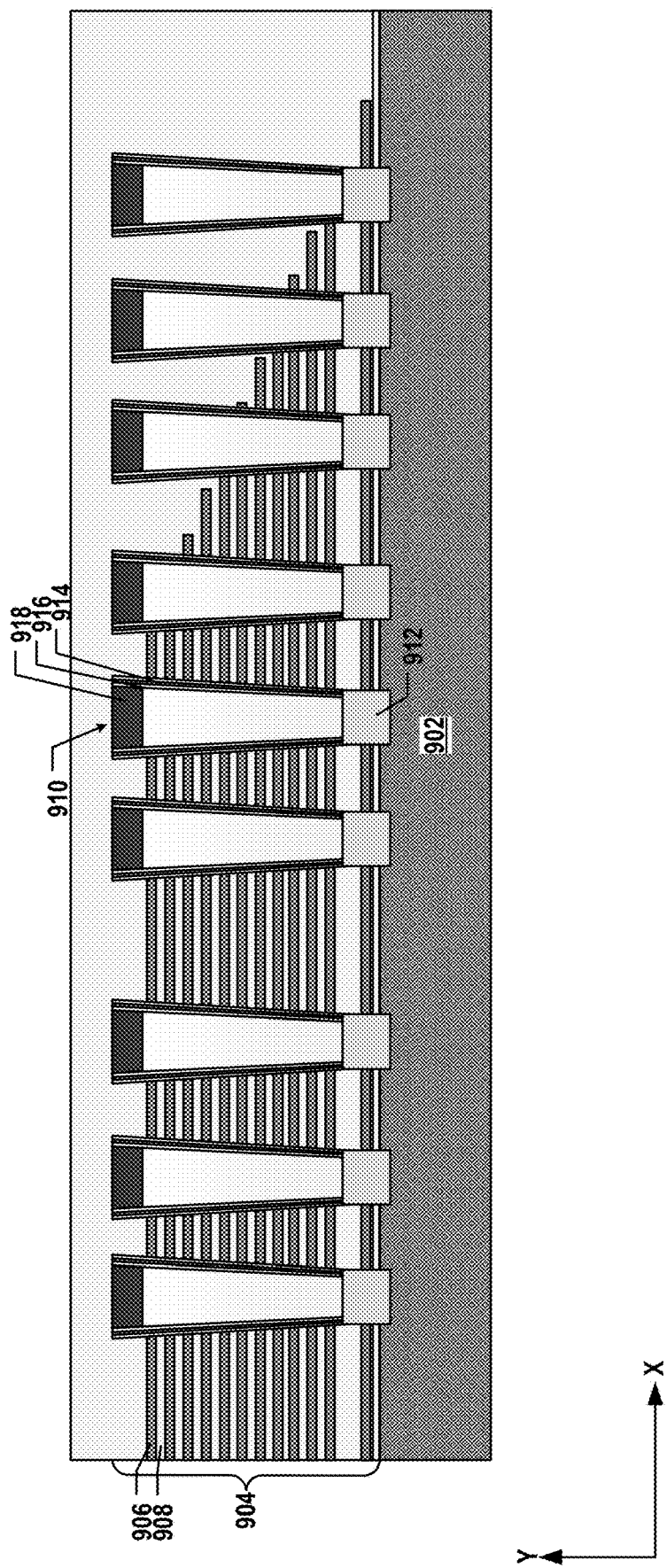
FIGS. 9A and 9B illustrate a fabrication process for forming an exemplary semiconductor structure having 3D NAND memory strings, according to some embodiments.
Figure 9B:
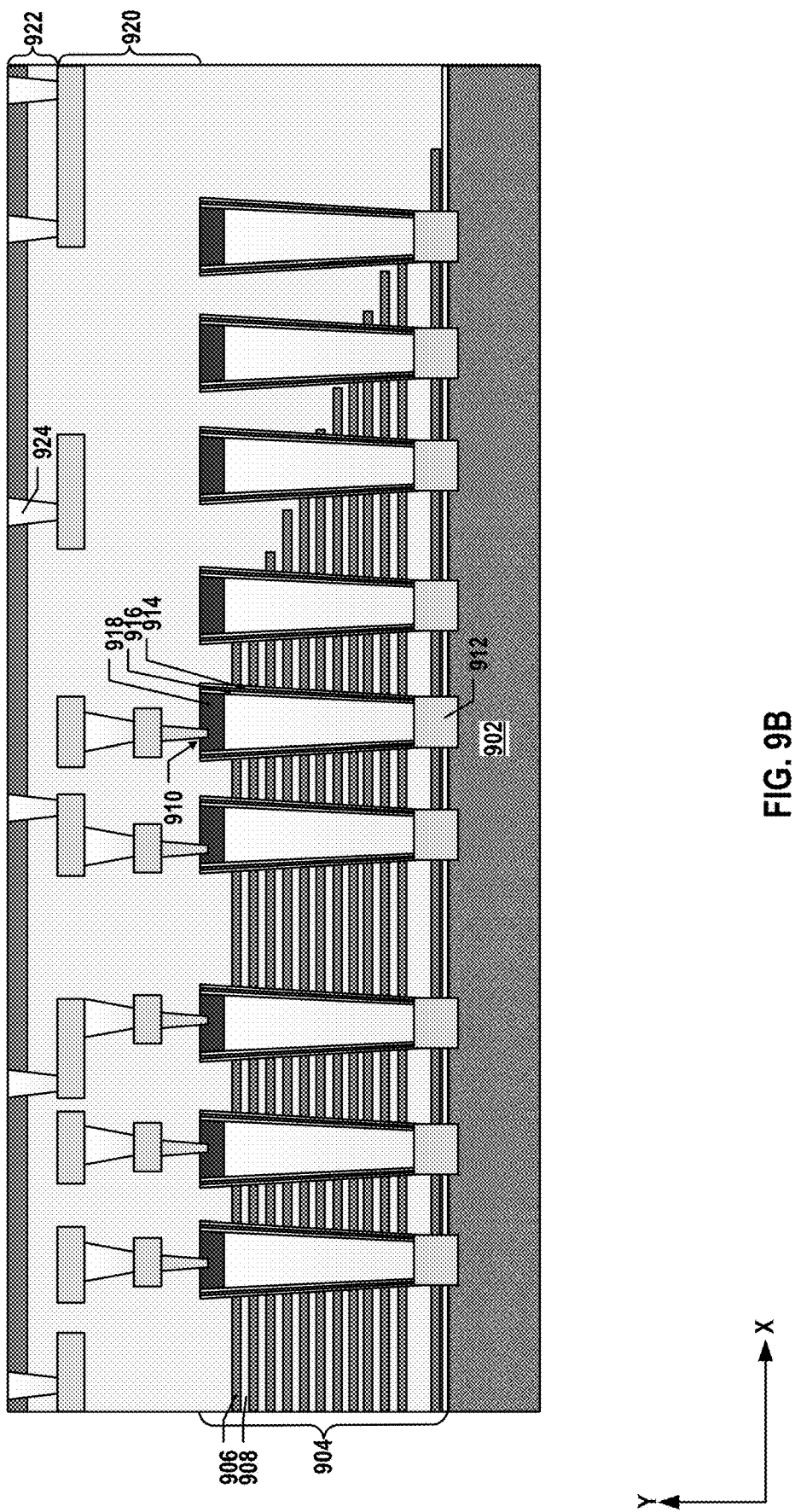
Figure 10A:
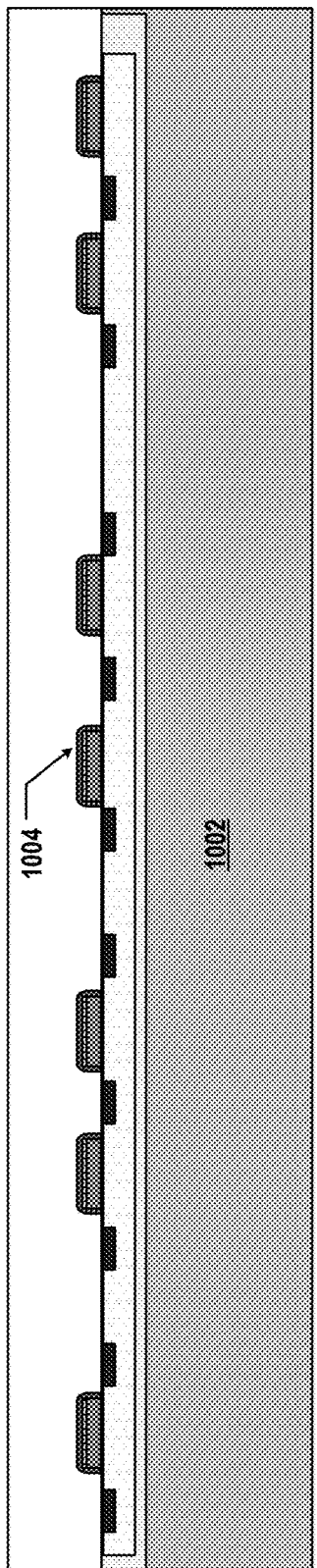
FIGS. 10A-10C illustrate a fabrication process for forming an exemplary semiconductor structure having DRAM cells, according to some embodiments.
Figure 10B:
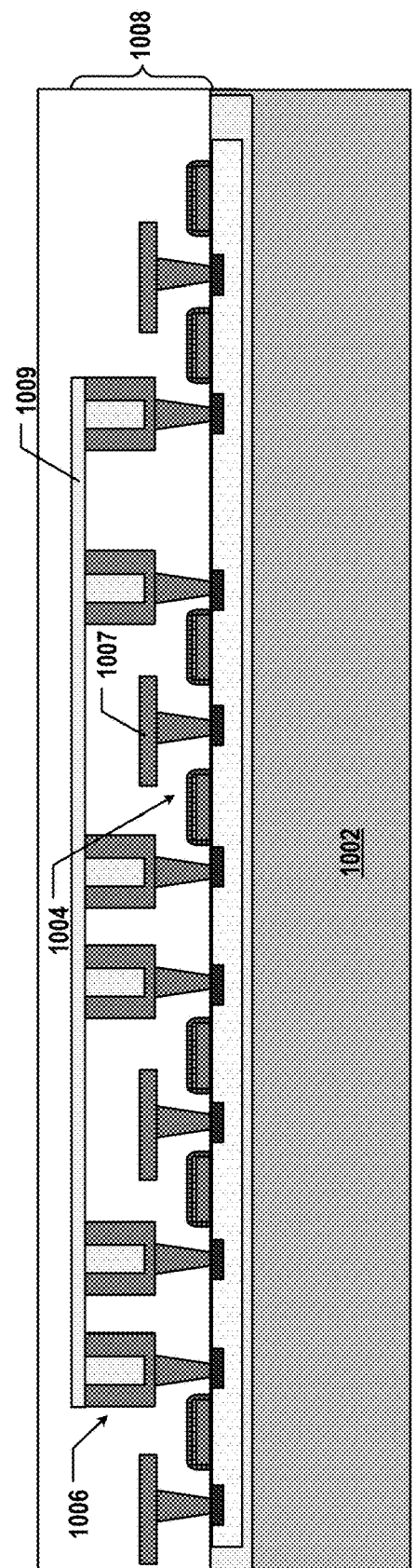
Figure 10C:
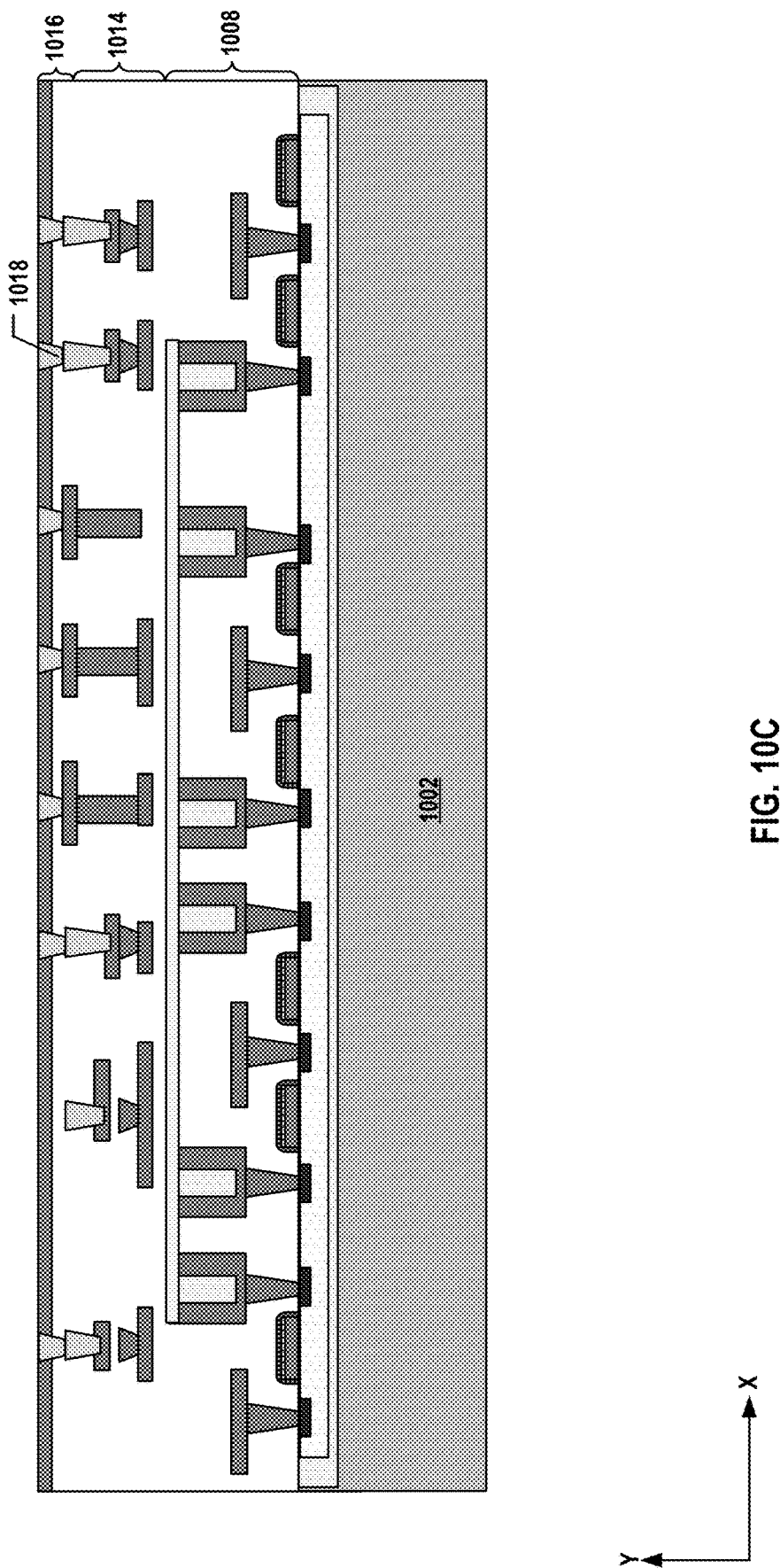
Figure 11A:
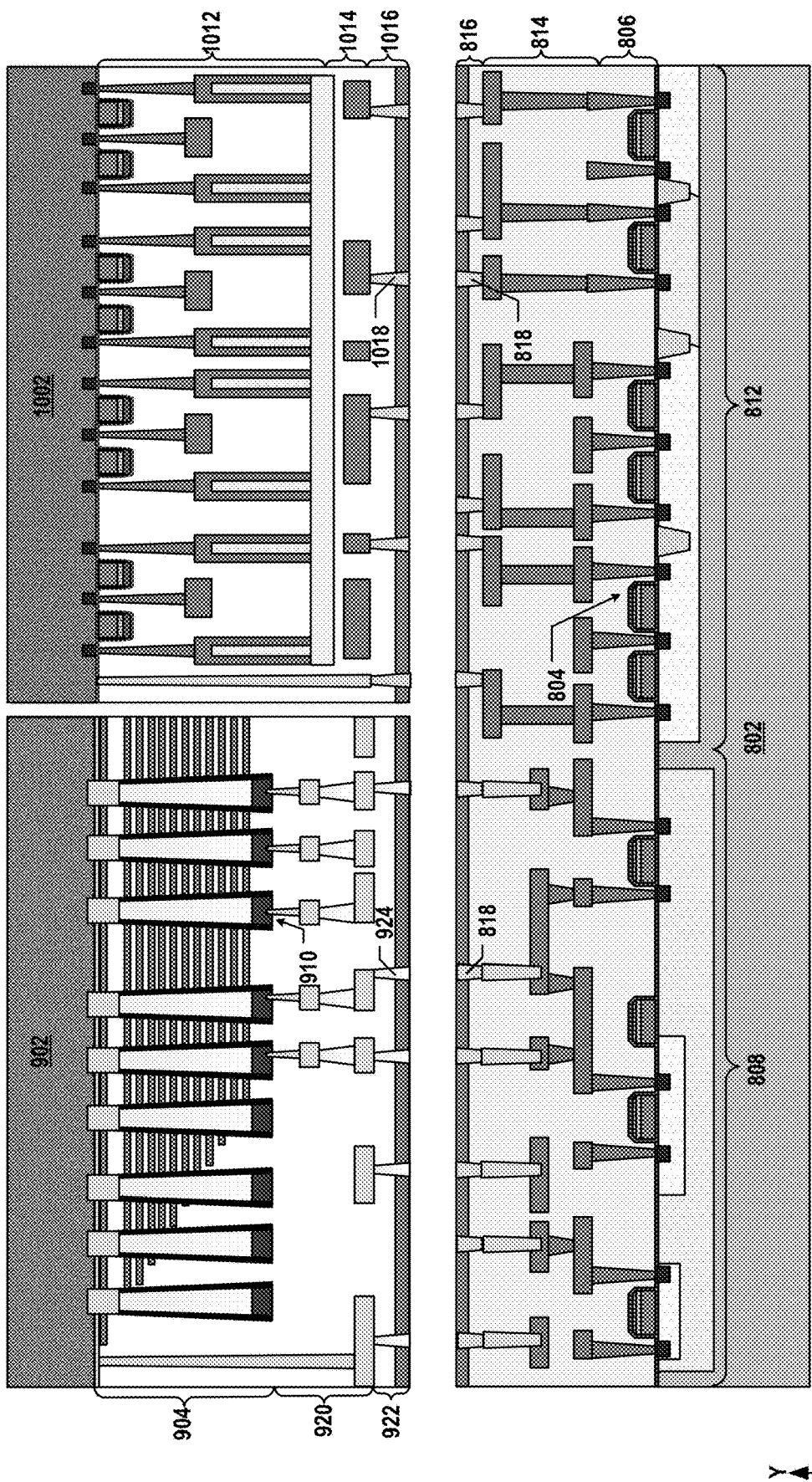
FIGS. 11A and 11B illustrate a fabrication process for forming an exemplary semiconductor device having a programmable logic device and heterogeneous memories, according to some embodiments.
Figure 11B:
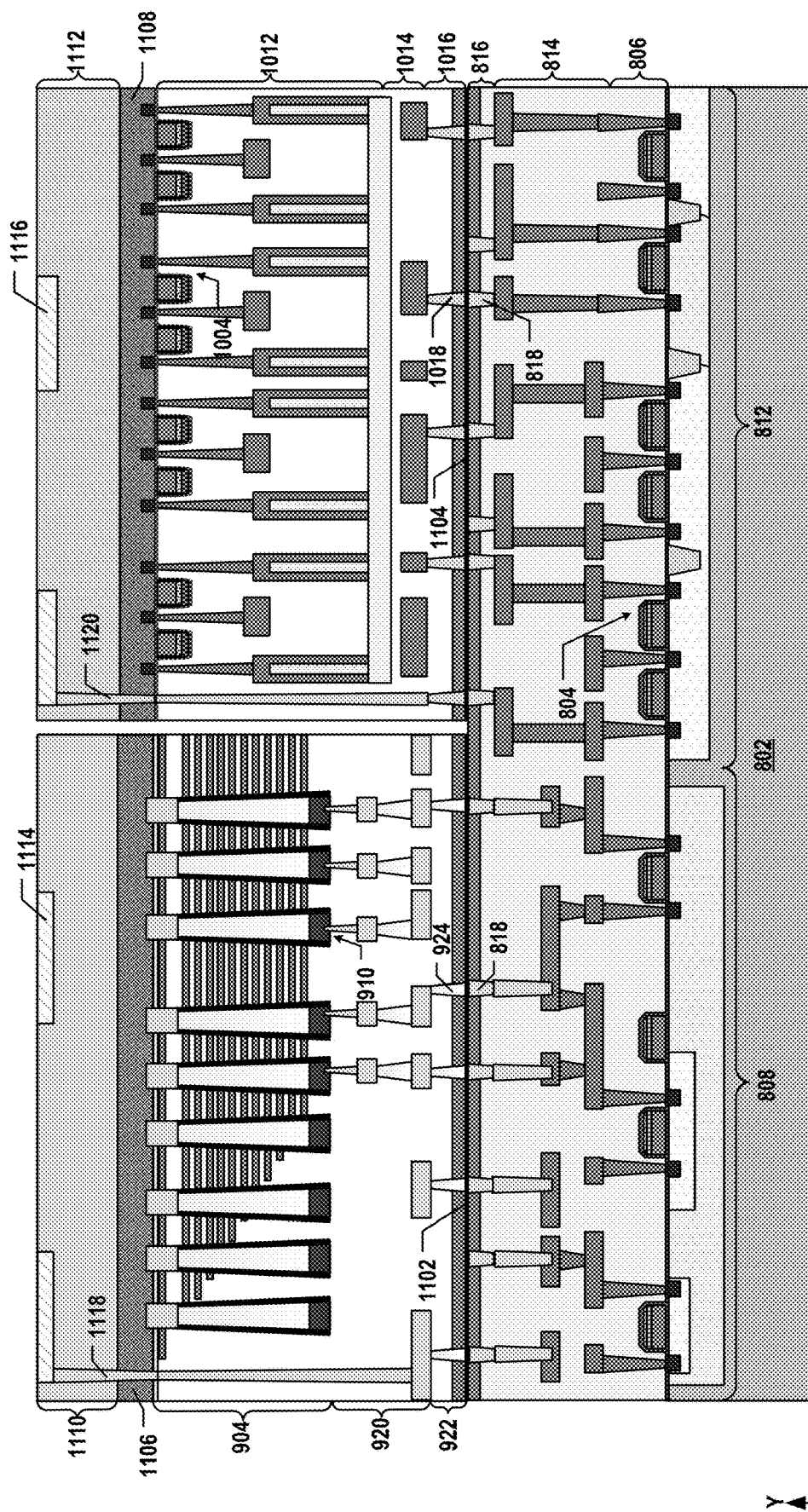
Figure 12A:
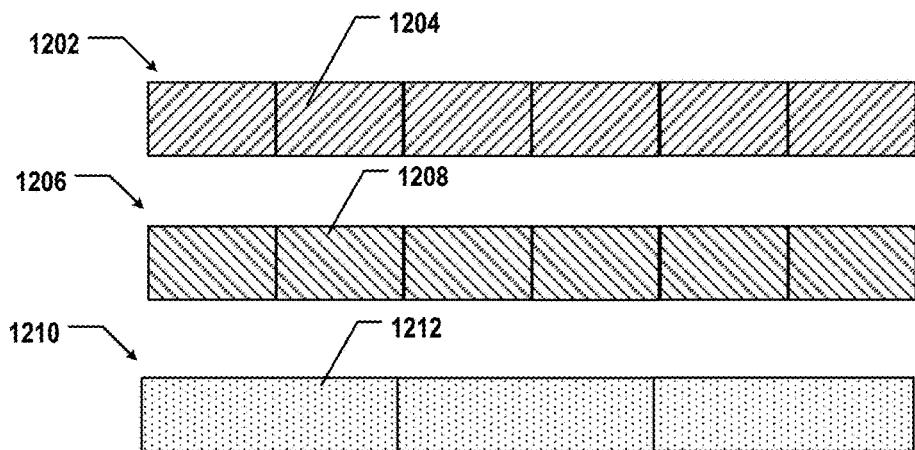
FIGS. 12A-12C illustrate a fabrication process for dicing and bonding an exemplary semiconductor structure, according to some embodiments.
Figure 12B:
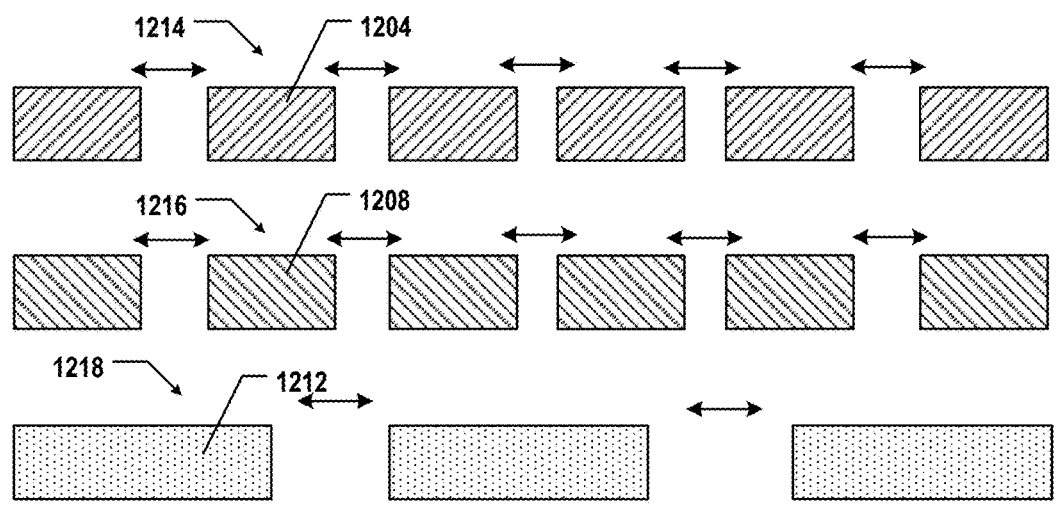
Figure 12C:
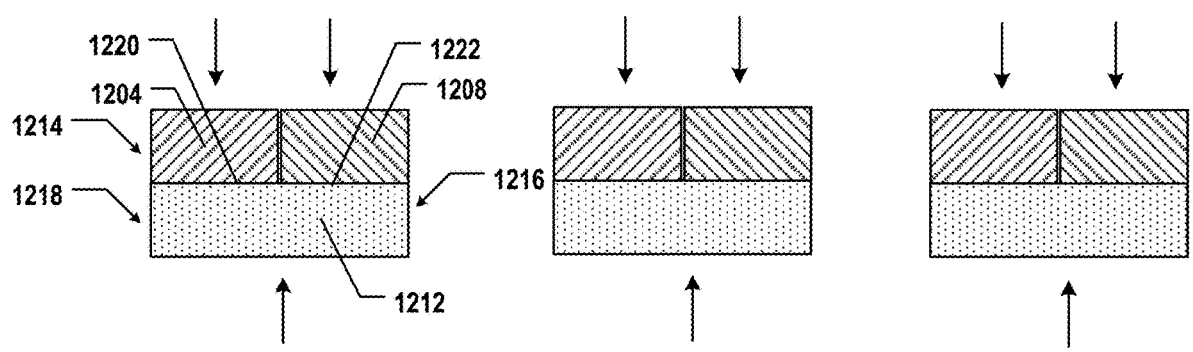
Figure 16A:
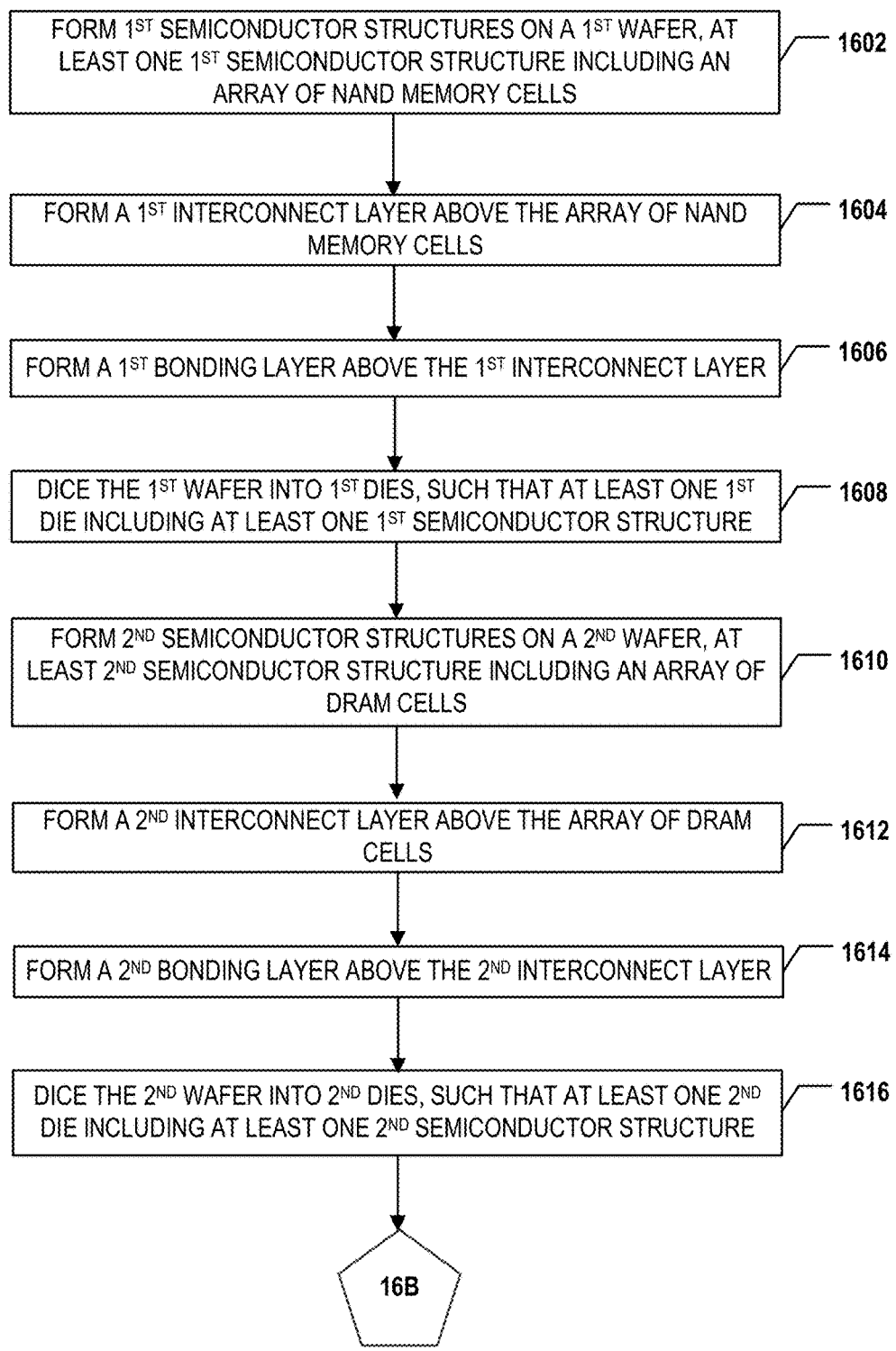
FIGS. 16A and 16B illustrate a flowchart of an exemplary method for forming a semiconductor device having a programmable logic device and heterogeneous memories, according to some embodiments.
Figure 16B:
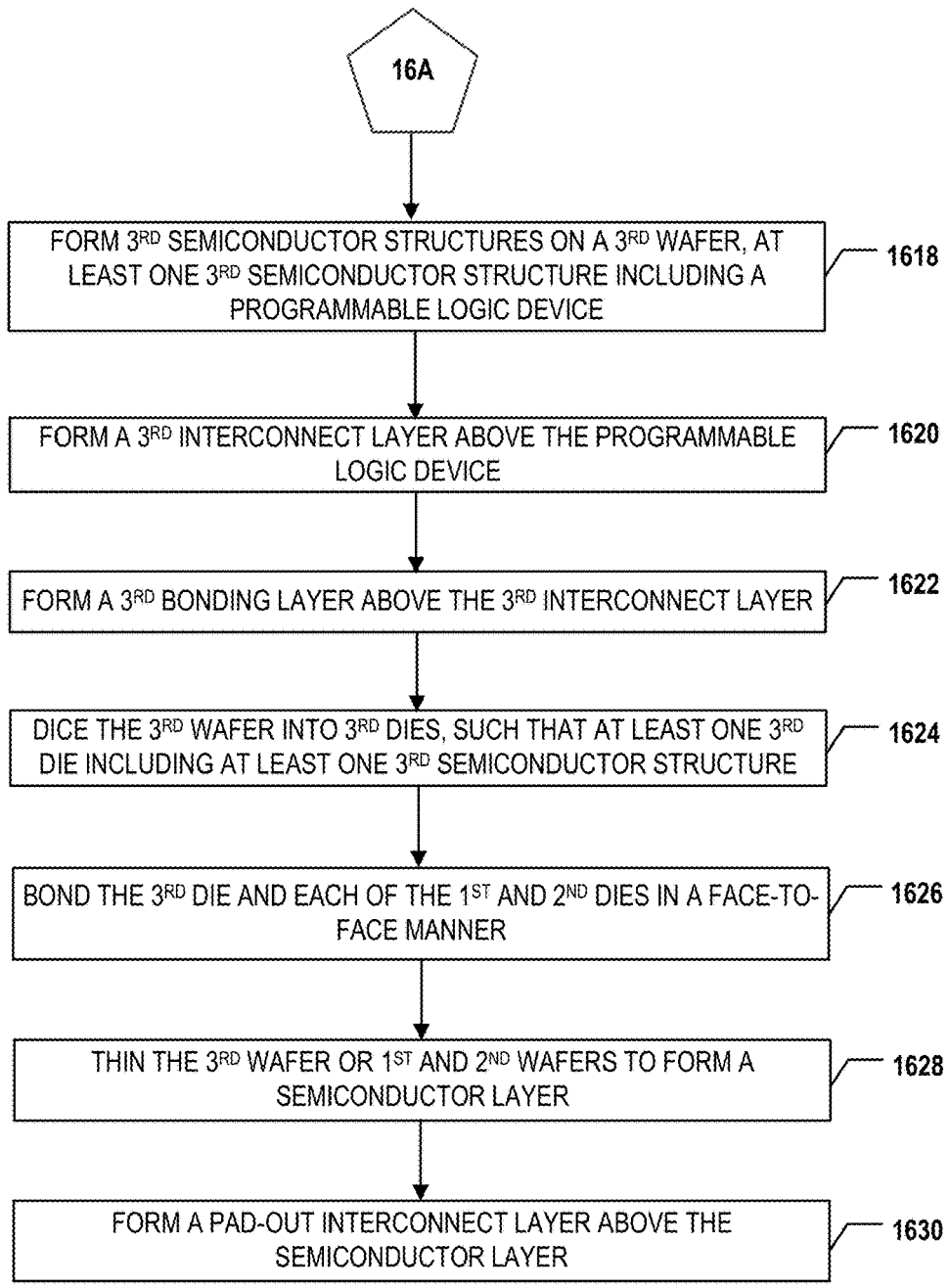
Figure 17A:
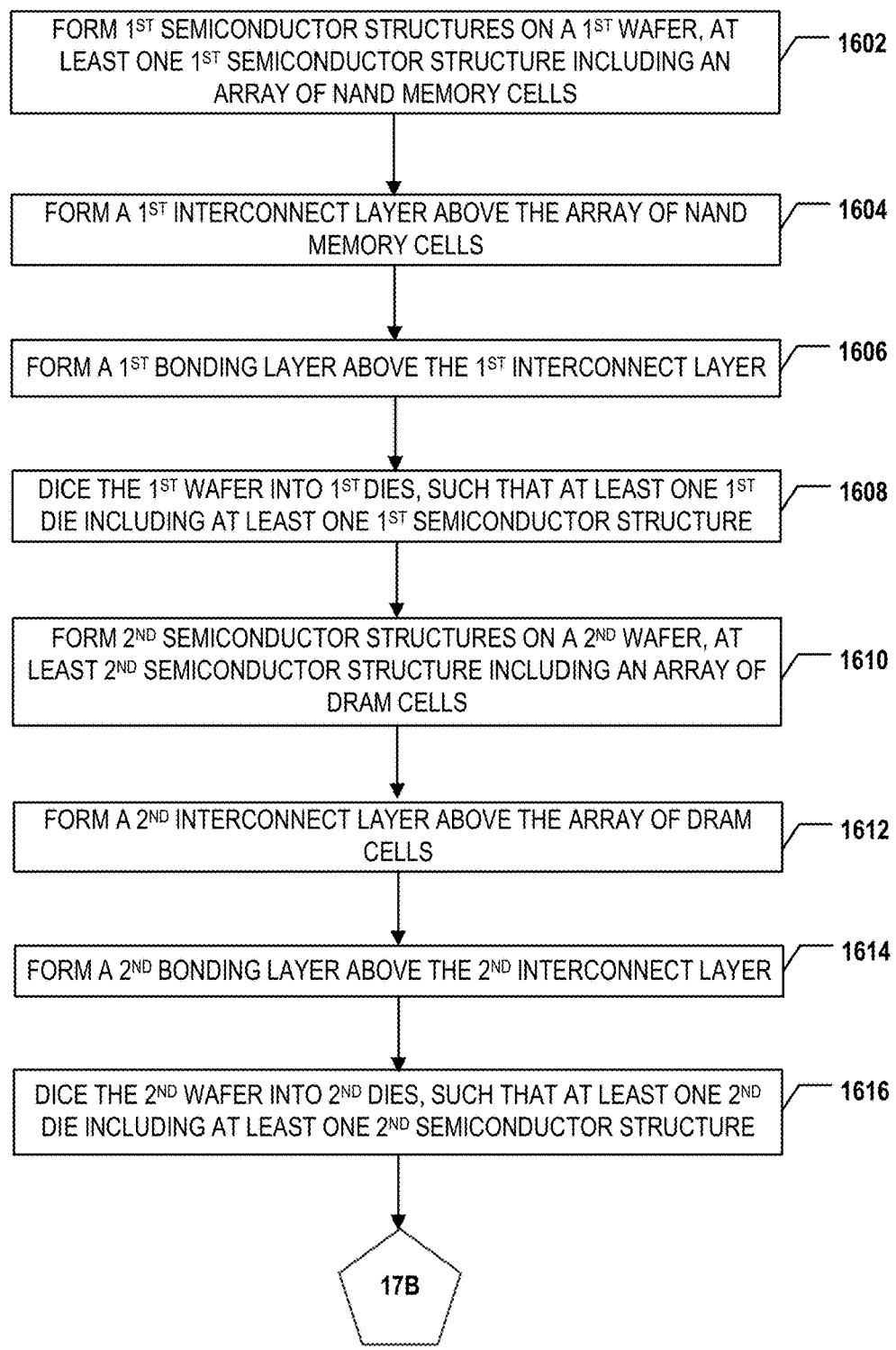
FIGS. 17A and 17B illustrate a flowchart of another exemplary method for forming a semiconductor device having a programmable logic device and heterogeneous memories, according to some embodiments.
Figure 17B:
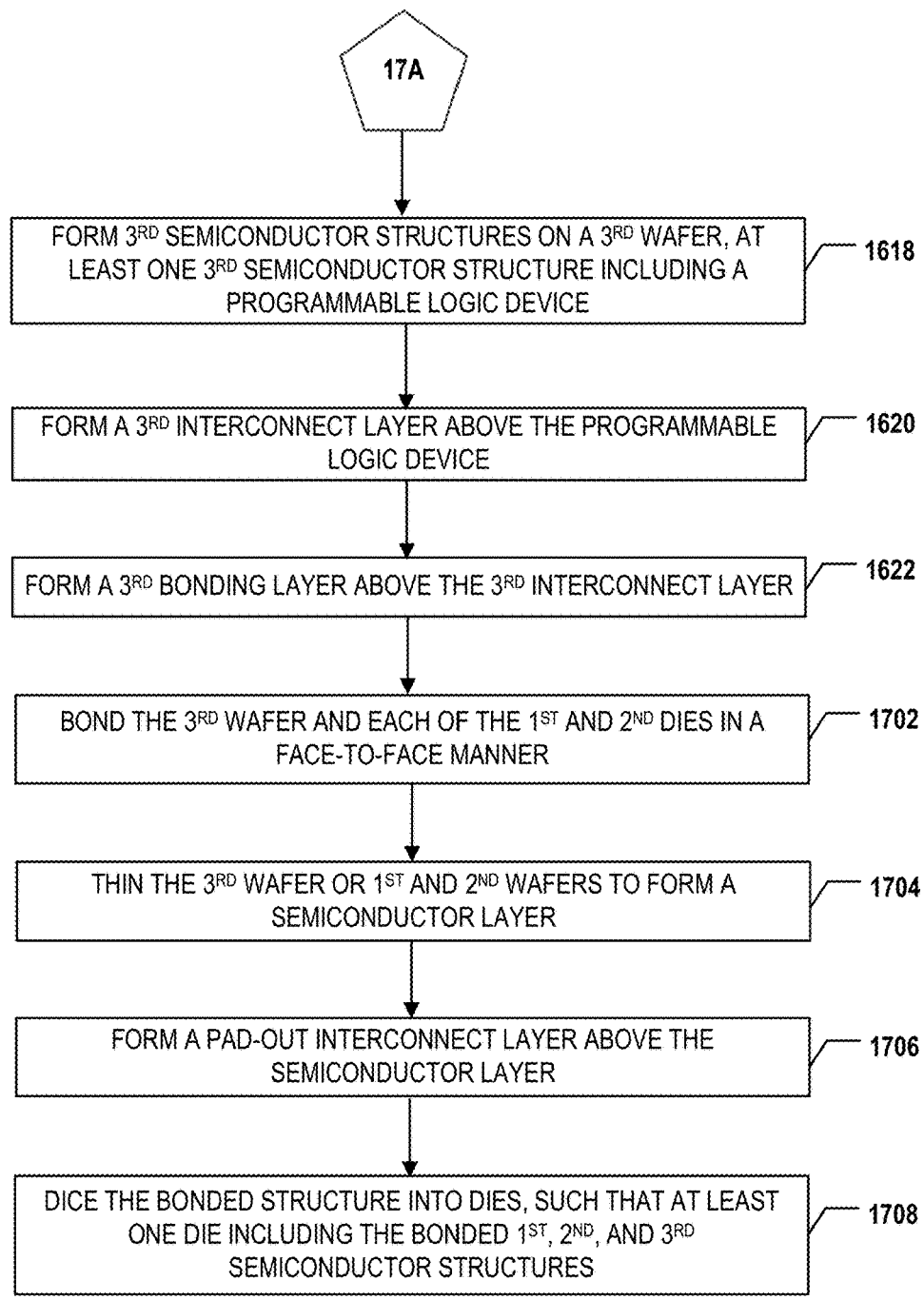

FIGS. 8A and 8B illustrate a fabrication process for forming an exemplary semiconductor structure having a programmable logic device and peripheral circuits, according to some embodiments. FIGS. 9A and 9B illustrate a fabrication process for forming an exemplary semiconductor structure having 3D NAND memory strings, according to some embodiments. FIGS. 10A-10C illustrate a fabrication process for forming an exemplary semiconductor structure having DRAM cells, according to some embodiments. FIGS. 11A and 11B illustrate a fabrication process for forming an exemplary semiconductor device having a programmable logic device and heterogeneous memories, according to some embodiments. FIGS. 12A-12C illustrate a fabrication process for dicing and bonding an exemplary semiconductor structure, according to some embodiments. FIGS. 13A-13D illustrate a fabrication process for bonding and dicing an exemplary semiconductor structure, according to some embodiments. FIGS. 16A and 16B illustrate a flowchart of an exemplary method 1600 for forming a semiconductor device having a programmable logic device and heterogeneous memories, according to some embodiments. FIGS. 17A and 17B illustrate a flowchart of another exemplary method 1700 for forming a semiconductor device having a programmable logic device and heterogeneous memories, according to some embodiments. Examples of the semiconductor devices depicted in FIGS. 8A, 8B, 9A, 9B, 10A-10C, 11A, 11B, 12A-12C, 13A-13D, 16A, 16B, 17A, and 17B include semiconductor devices 700 and 701 depicted in FIGS. 7A and 7B. FIGS. 8A, 8B, 9A, 9B, 10A-10C, 11A, 11B, 12A-12C, 13A-13D, 16A, 16B, 17A, and 17B will be described together. It is understood that the operations shown in methods 1600 and 1700 are not exhaustive and that other operations can be performed as well before, after, or between any of the illustrated operations. Further, some of the operations may be performed simultaneously, or in a different order than shown in FIGS. 16A, 16B, 17A, and 17B.

As depicted in FIGS. 9A and 9B, a first semiconductor structure including an array of 3D NAND memory strings and a first bonding layer including a plurality of first bonding contacts is formed. As depicted in FIGS. 10A-10C, a second semiconductor structure including an array of DRAM cells and a second bonding layer including a plurality of second bonding contacts is formed. As depicted in FIGS. 8A and 8B, a third semiconductor structure including a programmable logic device, a peripheral circuit, and a third bonding layer including a plurality of third bonding contacts is formed. As depicted in FIGS. 11A and 11B, the third semiconductor structure and each of the first and second semiconductor structures are bonded in a face-to-face manner, such that the first bonding contacts are in contact with a first set of the third bonding contacts at a first bonding interface, and the second bonding contacts are in contact with a second set of the third bonding contacts at a second bonding interface.

Referring to FIG. 16A, method 1600 starts at operation 1602, in which a plurality of first semiconductor structures are formed on a first wafer. At least one of the first semiconductor structures includes an array of NAND memory cells and a first bonding layer including a plurality of first bonding contacts. The first wafer can be a silicon wafer. In some embodiments, to form the plurality of first semiconductor structures, the array of NAND memory cells is formed on the first wafer. The array of NAND memory cells can be an array of 3D NAND memory strings. In some embodiments, to form the plurality of first semiconductor structures, a peripheral circuit of an array of NAND memory cells is also formed on the first wafer.

As illustrated in FIG. 12A, a plurality of first semiconductor structures 1204 are formed on a first wafer 1202. First wafer 1202 can include a plurality of shots separated by scribing lines. Each shot of first wafer 1202 includes one or more first semiconductor structures 1204, according to some embodiments. FIGS. 9A and 9B illustrate one example of the formation of first semiconductor structure 1204.

In some embodiments, to form the plurality of first semiconductor structures, a memory stack is formed above the first wafer, and an array of 3D NAND memory strings extending vertically through the memory stack are formed. As illustrated in FIG. 9A, interleaved sacrificial layers (not shown) and dielectric layers 908 are formed above a silicon substrate 902 (as part of first wafer 1202, e.g., a silicon wafer). The interleaved sacrificial layers and dielectric layers 908 can form a dielectric stack (not shown). In some embodiments, each sacrificial layer includes a layer of silicon nitride, and each dielectric layer 908 includes a layer of silicon oxide. The interleaved sacrificial layers and dielectric layers 908 can be formed by one or more thin film deposition processes including, but not limited to, chemical vapor deposition (CVD), physical vapor deposition (PVD), atomic layer deposition (ALD), or any combination thereof. In some embodiments, a memory stack 904 can be formed by a gate replacement process, e.g., replacing the sacrificial layers with conductor layers 906 using wet/dry etch of the sacrificial layers selective to dielectric layers 908 and filling the resulting recesses with conductor layers 906. As a result, memory stack 904 can include interleaved conductor layers 906 and dielectric layers 908. In some embodiments, each conductor layer 906 includes a metal layer, such as a layer of tungsten. It is understood that memory stack 904 may be formed by alternatingly depositing conductor layers (e.g., doped polysilicon layers) and dielectric layers (e.g., silicon oxide layers) without the gate replacement process in other embodiments. In some embodiments, a pad oxide layer including silicon oxide is formed between memory stack 904 and silicon substrate 902.

As illustrated in FIG. 9A, 3D NAND memory strings 910 are formed above silicon substrate 902, each of which extends vertically through interleaved conductor layers 906 and dielectric layers 908 of memory stack 904. In some embodiments, fabrication processes to form 3D NAND memory string 910 include forming a channel hole through memory stack 904 and into silicon substrate 902 using dry etching/and or wet etching, such as deep reactive-ion etching (DRIE), followed by epitaxially growing a plug 912 in the lower portion of the channel hole from silicon substrate 902. In some embodiments, fabrication processes to form 3D NAND memory string 910 also include subsequently filling the channel hole with a plurality of layers, such as a memory film 914 (e.g., a tunneling layer, a storage layer, and a blocking layer) and a semiconductor layer 916, using thin film deposition processes such as ALD, CVD, PVD, or any combination thereof. In some embodiments, fabrication processes to form 3D NAND memory string 910 further include forming another plug 918 in the upper portion of the channel hole by etching a recess at the upper end of 3D NAND memory string 910, followed by filling the recess with a semiconductor material using thin film deposition processes such as ALD, CVD, PVD, or any combination thereof.

Method 1600 proceeds to operation 1604, as illustrated in FIG. 16A, in which a first interconnect layer is formed above the array of NAND memory cells. The first interconnect layer can include a first plurality of interconnects in one or more ILD layers. As illustrated in FIG. 9B, an interconnect layer 920 can be formed above memory stack 904 and array of 3D NAND memory strings 910. Interconnect layer 920 can include interconnects of MEOL and/or BEOL in a plurality of ILD layers to make electrical connections with array of 3D NAND memory strings 910. In some embodiments, interconnect layer 920 includes multiple ILD layers and interconnects therein formed in multiple processes. For example, the interconnects in interconnect layer 920 can include conductive materials deposited by one or more thin film deposition processes including, but not limited to, CVD, PVD, ALD, electroplating, electroless plating, or any combination thereof. Fabrication processes to form interconnects can also include photolithography, chemical mechanical polishing (CMP), wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 9B can be collectively referred to as interconnect layer 920.

Method 1600 proceeds to operation 1606, as illustrated in FIG. 16A, in which a first bonding layer is formed above the first interconnect layer. The first bonding layer can include a plurality of first bonding contacts. As illustrated in FIG. 9B, a bonding layer 922 is formed above interconnect layer 920. Bonding layer 922 can include a plurality of bonding contacts 924 surrounded by dielectrics. In some embodiments, a dielectric layer is deposited on the top surface of interconnect layer 920 by one or more thin film deposition processes including, but not limited to, CVD, PVD, ALD, or any combination thereof. Bonding contacts 924 then can be formed through the dielectric layer and in contact with the interconnects in interconnect layer 920 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor.

Method 1600 proceeds to operation 1608, as illustrated in FIG. 16A, in which the first wafer is diced into a plurality of first dies, such that at least one of the first dies includes at least one of the first semiconductor structures. As illustrated in FIG. 12B, first wafer 1202 (as shown in FIG. 12A) is diced into a plurality of dies 1214, such that at least one die 1214 includes first semiconductor structure 1204. In some embodiments, each shot of first wafer 1202 is cut along the scribing lines using wafer laser dicing and/or mechanical dicing techniques, thereby becoming respective die 1214. Die 1214 includes first semiconductor structure 1204, for example, the structure as shown in FIG. 9B.

Method 1600 proceeds to operation 1610, as illustrated in FIG. 16A, in which a plurality of second semiconductor structures are formed on a second wafer. At least one of the second semiconductor structures includes an array of DRAM cells and a second bonding layer including a plurality of second bonding contacts. The second wafer can be a silicon wafer. In some embodiments, to form the plurality of second semiconductor structures, the array of DRAM cells is formed on the second wafer. In some embodiments, to form the array of DRAM cells, a plurality of transistors are formed on the second wafer and a plurality of capacitors are formed above and in contact with at least some of the transistors. In some embodiments, to form the plurality of second semiconductor structures, a peripheral circuit of the array of DRAM cells is also formed on the second wafer.

As illustrated in FIG. 12A, a plurality of second semiconductor structures 1208 are formed on a second wafer 1206. Second wafer 1206 can include a plurality of shots separated by scribing lines. Each shot of second wafer 1206 includes one or more second semiconductor structures 1208, according to some embodiments. FIGS. 10A-10C illustrate one example of the formation of second semiconductor structure 1208.

As illustrated in FIG. 10A, a plurality of transistors 1004 are formed on a silicon substrate 1002 (as part of second wafer 1206, e.g., a silicon wafer). Transistors 1004 can be formed by a plurality of processes including, but not limited to, photolithography, dry/wet etch, thin film deposition, thermal growth, implantation, CMP, and any other suitable processes. In some embodiments, doped regions are formed in silicon substrate 1002 by ion implantation and/or thermal diffusion, which function, for example, as the source and/or drain regions of transistors 1004. In some embodiments, isolation regions (e.g., STIs) are also formed in silicon substrate 1002 by wet/dry etch and thin film deposition.

As illustrated in FIG. 10B, a plurality of capacitors 1006 are formed above and in contact with transistors 1004, i.e., DRAM selection transistors 1004. Each capacitor 1006 can be patterned by photography to be aligned with respective DRAM selection transistor 1004 to form a 1T1C memory cell, for example, by electrically connecting one electrode of capacitor 1006 with one node of respective DRAM selection transistor 1004. In some embodiments, bit lines 1007 and common plates 1009 are formed as well for electrically connecting DRAM selection transistors 1004 and capacitors 1006. Capacitors 1006 can be formed by a plurality of processes including, but not limited to, photolithography, dry/wet etch, thin film deposition, thermal growth, implantation, CMP, and any other suitable processes. An array of DRAM cells 1008 (each having DRAM selection transistor 1004 and capacitor 1006) are thereby formed.

Method 1600 proceeds to operation 1612, as illustrated in FIG. 16A, in which a second interconnect layer is formed above the array of DRAM cells. The second interconnect layer can include a second plurality of interconnects in one or more ILD layers. As illustrated in FIG. 10C, an interconnect layer 1014 can be formed above array of DRAM cells 1008. Interconnect layer 1014 can include interconnects of MEOL and/or BEOL in a plurality of ILD layers to make electrical connections with array of DRAM cells 1008. In some embodiments, interconnect layer 1014 includes multiple ILD layers and interconnects therein formed in multiple processes. For example, the interconnects in interconnect layers 1014 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 10C can be collectively referred to as interconnect layer 1014.

Method 1600 proceeds to operation 1614, as illustrated in FIG. 16A, in which a second bonding layer is formed above the second interconnect layer. The second bonding layer can include a plurality of second bonding contacts. As illustrated in FIG. 10C, a bonding layer 1016 is formed above interconnect layer 1014. Bonding layer 1016 can include a plurality of bonding contacts 1018 surrounded by dielectrics. In some embodiments, a dielectric layer is deposited on the top surface of interconnect layer 1014 by one or more thin film deposition processes including, but not limited to, CVD, PVD, ALD, or any combination thereof. Bonding contacts 1018 then can be formed through the dielectric layer and in contact with the interconnects in interconnect layer 1014 by first patterning contact holes through the dielectric layer using a patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor.

Method 1600 proceeds to operation 1616, as illustrated in FIG. 16A, in which the second wafer is diced into a plurality of second dies, such that at least one of the second dies includes the at least one of the second semiconductor structures. As illustrated in FIG. 12B, second wafer 1206 (as shown in FIG. 12A) is diced into a plurality of dies 1216, such that at least one die 1216 includes second semiconductor structure 1208. In some embodiments, each shot of second wafer 1206 is cut from second wafer 1206 along the scribing lines using wafer laser dicing and/or mechanical dicing techniques, thereby becoming respective die 1216. Die 1216 includes second semiconductor structure 1208, for example, the structure as shown in FIG. 10C.

Method 1600 proceeds to operation 1618, as illustrated in FIG. 16B, in which a plurality of third semiconductor structures are formed on a third wafer. At least one of the third semiconductor structures includes a programmable logic device and a third bonding layer including a plurality of third bonding contacts. The third wafer can be a silicon wafer. In some embodiments, to form the plurality of third semiconductor structures, the programmable logic device is formed on the third wafer. In some embodiments, to form the programmable logic device, a plurality of transistors are formed on the third wafer. In some embodiments, to form the plurality of third semiconductor structures, a peripheral circuit of at least one of the array of NAND memory cells or the array of DRAM cells is also formed on the third wafer.

As illustrated in FIG. 12A, a plurality of third semiconductor structures 1212 are formed on a third wafer 1210. Third wafer 1210 can include a plurality of shots separated by scribing lines. Each shot of third wafer 1210 includes one or more third semiconductor structures 1212, according to some embodiments. FIGS. 8A and 8B illustrate one example of the formation of third semiconductor structure 1212.

As illustrated in FIG. 8A, a plurality of transistors 804 are formed on a silicon substrate 802 (as part of third wafer 1210, e.g., a silicon wafer) by a plurality of processes including, but not limited to, photolithography, dry/wet etch, thin film deposition, thermal growth, implantation, CMP, and any other suitable processes. In some embodiments, doped regions are formed in silicon substrate 802 by ion implantation and/or thermal diffusion, which function, for example, as source regions and/or drain regions of transistors 804. In some embodiments, isolation regions (e.g., STIs) are also formed in silicon substrate 802 by wet/dry etch and thin film deposition. Transistors 804 can form a device layer 806 on silicon substrate 802. In some embodiments, device layer 806 includes a programmable logic device 808 and a peripheral circuit 812.

Method 1600 proceeds to operation 1620, as illustrated in FIG. 16B, in which a third interconnect layer is formed above the programmable logic device. The third interconnect layer can include a third plurality of interconnects in one or more ILD layers. As illustrated in FIG. 8B, an interconnect layer 814 can be formed above device layer 806 including programmable logic device 808. Interconnect layer 814 can include interconnects of MEOL and/or BEOL in a plurality of ILD layers to make electrical connections with device layer 806. In some embodiments, interconnect layer 814 includes multiple ILD layers and interconnects therein formed in multiple processes. For example, the interconnects in interconnect layer 814 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 8B can be collectively referred to as interconnect layer 814.

Method 1600 proceeds to operation 1622, as illustrated in FIG. 16B, in which a third bonding layer is formed above the third interconnect layer. The third bonding layer can include a plurality of third bonding contacts. As illustrated in FIG. 8B, a bonding layer 816 is formed above interconnect layer 814. Bonding layer 816 can include a plurality of bonding contacts 818 surrounded by dielectrics. In some embodiments, a dielectric layer is deposited on the top surface of interconnect layer 814 by one or more thin film deposition processes including, but not limited to, CVD, PVD, ALD, or any combination thereof. Bonding contacts 818 then can be formed through the dielectric layer and in contact with the interconnects in interconnect layer 814 by first patterning contact holes through the dielectric layer using a patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 1600 proceeds to operation 1624, as illustrated in FIG. 16B, in which the third wafer is diced into a plurality of third dies, such that at least one of the third dies includes the at least one of the third semiconductor structures. As illustrated in FIG. 12B, third wafer 1210 (as shown in FIG. 12A) is diced into a plurality of dies 1218, such that at least one die 1218 includes second semiconductor structure 1212. In some embodiments, each shot of third wafer 1210 is cut from third wafer 1210 along the scribing lines using wafer laser dicing and/or mechanical dicing techniques, thereby becoming respective die 1218. Die 1218 includes second semiconductor structure 1212, for example, the structure as shown in FIG. 8B.

Method 1600 proceeds to operation 1626, as illustrated in FIG. 16B, in which the third die and each of the first die and the second die are bonded in a face-to-face manner, such that the third semiconductor structure is bonded to each of the first semiconductor structure and the second semiconductor structure. The first bonding contacts are in contact with a first set of the third bonding contacts at a first bonding interface, and the second bonding contacts are in contact with a second set of the third bonding contacts at a second bonding interface. The bonding can be hybrid bonding. In some embodiments, the third semiconductor structure is above the first semiconductor structure and the second semiconductor structure after the bonding. In some embodiments, the third semiconductor structure is below the first semiconductor structure and the second semiconductor structure after the bonding.

As illustrated in FIG. 12C, die 1218 and each of dies 1214 and 1216 are bonded in a face-to-face manner, such that third semiconductor structures 1212 is bonded to first semiconductor structure 1204 at a first bonding interface 1220 and bonded to second semiconductor structure 1208 at a second bonding interface 1222. First and second bonding interfaces 1220 and 1222 can be in the same plane. Although third semiconductor structure 1212 is below first and second semiconductor structures 1204 and 1208 after the bonding as shown in FIG. 12C, it is understood that third semiconductor structure 1212 may be above first and second semiconductor structures 1204 and 1208 after bonding in some embodiments. FIG. 11A illustrates an example of bonding first, second, and third semiconductor structures 1204, 1208, and 1212.

As illustrated in FIG. 11A, silicon substrate 902 and components formed thereon (e.g., memory stack 904 and array of 3D NAND memory strings 910 formed therethrough) are flipped upside down. Bonding layer 922 facing down is bonded with bonding layer 816 facing up, i.e., in a face-to-face manner, thereby forming a first bonding interface 1102 (as shown in FIG. 11B). Similarly, silicon substrate 1002 and components formed thereon (e.g., DRAM cells 1012) are flipped upside down. Bonding layer 1016 facing down is bonded with bonding layer 816 facing up, i.e., in a face-to-face manner as well, thereby forming a second bonding interface 1104 (as shown in FIG. 11B). That is, silicon substrates 902 and 1002 and components formed thereon can be bonded with silicon substrate 802 and components formed thereon in a face-to-face manner next to one another, such that first and second bonding interfaces 1102 and 1104 are flush with one another and in the same plane. In some embodiments, a treatment process, e.g., plasma treatment, wet treatment and/or thermal treatment, is applied to bonding surfaces prior to bonding. Although not shown in FIG. 11A, silicon substrate 802 and components formed thereon (e.g., device layer 806 including programmable logic device 808 and peripheral circuit 812) can be flipped upside down, and bonding layer 816 facing down can be bonded with each of bonding layers 922 and 1016 facing up, i.e., in a face-to-face manner, thereby forming first and second bonding interfaces 1102 and 1104.

After the bonding, bonding contacts 924 in bonding layer 922 and some bonding contacts 818 in bonding layer 816 (a first set of bonding contacts 818 directly below silicon substrate 902) are aligned and in contact with one another, such that memory stack 904 and array of 3D NAND memory strings 910 formed therethrough can be electrically connected to device layer 806 (e.g., programmable logic device 808 and peripheral circuit 812 therein). Similarly, after the bonding, bonding contacts 1018 in bonding layer 1016 and some bonding contacts 818 in bonding layer 816 (a second set of bonding contacts 818 directly below silicon substrate 1002) are aligned and in contact with one another, such that array of DRAM cells 1012 can be electrically connected to device layer 806 (e.g., programmable logic device 808 and peripheral circuit 812 therein). It is understood that in the bonded chip, device layer 806 (e.g., programmable logic device 808 and peripheral circuit 812 therein) may be either above or below memory stack 904, array of 3D NAND memory strings 910, and array of DRAM cells 1012. Nevertheless, first and second bonding interfaces 1102 and 1104 can be formed between device layer 806 (e.g., programmable logic device 808 and peripheral circuit 812 therein) and memory stack 904 (and array of 3D NAND memory strings 910 formed therethrough) and array of DRAM cells 1012 after the bonding as illustrated in FIG. 11B.

Method 1600 proceeds to operation 1628, as illustrated in FIG. 16B, in which the third wafer or each of the first and second wafers is thinned to form semiconductor layer(s). In some embodiments, the third wafer of the third semiconductor structure, which is above the first wafer of the first semiconductor structure and the second wafer of the second semiconductor structure after the bonding, is thinned to form the semiconductor layer. In some embodiments, the first wafer of the first semiconductor structure and the second wafer of the second semiconductor structure, which are above the third wafer of the third semiconductor structure after the bonding, are thinned to form first and second semiconductor layers, respectively.

As illustrated in FIG. 11B, silicon substrate 902 at the top of the bonded chip (as shown in FIG. 11A) is thinned, so that the thinned top substrate can serve as a first semiconductor layer 1106, for example, a single-crystal silicon layer or a polysilicon layer. Similarly, silicon substrate 1002 at the top of the bonded chip (as shown in FIG. 11A) is thinned, so that the thinned top substrate can serve as a second semiconductor layer 1108, for example, a single-crystal silicon layer. In one example, the thickness of the thinned substrate may be between about 1 μm and about 20 μm, such as between 1 μm and 20 μm (e.g., 1 μm, 2 μm, 3 μm, 4 μm, 5 μm, 6 μm, 7 μm, 8 μm, 9 μm, 10 μm, 15 μm, 20 μm, any range bounded by the lower end by any of these values, or in any range defined by any two of these values), for example, using a combination of etch and CMP processes. It is understood that in some embodiments, by further applying an additional etch process, the thickness of the thinned substrate may be further reduced to below 1 μm, e.g., in the sub-micron range. It is understood that in some embodiments, first and second semiconductor layers 1106 and 1108 may be a single, continuous semiconductor layer. It is also understood that in some embodiments, another single, continuous semiconductor layer may be formed on first and second semiconductor layers 1106 and 1108. It is further understood that when silicon substrate 802 is the substrate at the top of the bonded chip, another semiconductor layer may be formed by thinning silicon substrate 802.

Method 1600 proceeds to operation 1630, as illustrated in FIG. 16B, in which a pad-out interconnect layer is formed above the semiconductor layer. As illustrated in FIG. 11B, a first pad-out interconnect layer 1110 is formed above first semiconductor layer 1106, and a second pad-out interconnect layer 1112 is formed above second semiconductor layer 1108. Pad-out interconnect layers 1110 and 1112 can include interconnects, such as pad contacts 1114 and 1116, formed in one or more ILD layers. Pad contacts 1114 and 1116 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 1118 and 1120 are formed extending vertically through first and second semiconductor layers 1106 and 1108, respectively, for example by wet/dry etch followed by depositing conductive materials. Contacts 1118 and 1120 can be in contact with interconnects in first and second pad-out interconnect layers 1110 and 1112, respectively.

Figure 13A:
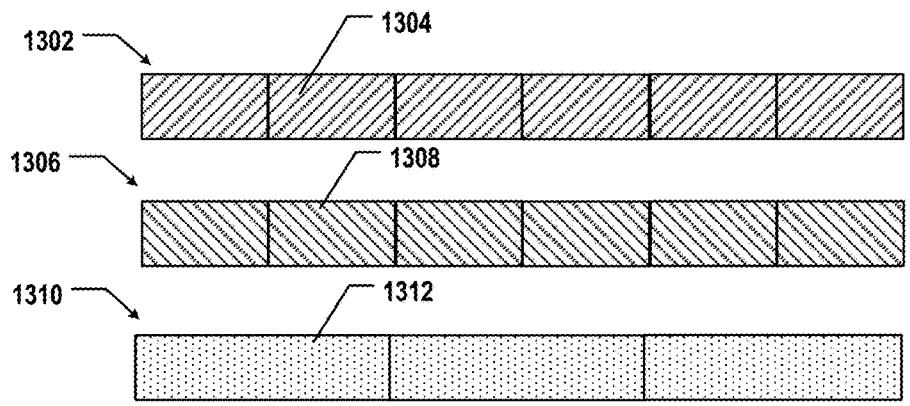
FIGS. 13A-13D illustrate a fabrication process for bonding and dicing an exemplary semiconductor structure, according to some embodiments.

Instead of the packaging scheme based on die-to-die bonding after dicing as described above with respect to FIGS. 12A-12C, 16A, and 16B, FIGS. 13A-13D, 17A, and 17B illustrate another packaging scheme based on die-to-wafer bonding, according to some embodiments. Operations 1602, 1604, 1606, 1608, 1610, 1612, 1614, 1616, 1618, 1620, and 1622 of method 1700 in FIGS. 17A and 17B are described above with respect to method 1600 in FIGS. 16A and 16B and thus, are not repeated. As illustrated in FIG. 13A, a plurality of first semiconductor structures 1304 are formed on a first wafer 1302. First wafer 1302 can include a plurality of shots separated by scribing lines. Each shot of first wafer 1302 includes one or more first semiconductor structures 1304, according to some embodiments. FIGS. 9A and 9B illustrate one example of the formation of first semiconductor structure 1304. Similarly, a plurality of second semiconductor structures 1308 are formed on a second wafer 1306. Second wafer 1306 can include a plurality of shots separated by scribing lines. Each shot of second wafer 1306 includes one or more second semiconductor structures 1308, according to some embodiments. FIGS. 10A-10C illustrate one example of the formation of second semiconductor structure 1308. Similarly, a plurality of third semiconductor structures 1312 are formed on a third wafer 1310. Third wafer 1310 can include a plurality of shots separated by scribing lines. Each shot of third wafer 1310 includes one or more third semiconductor structures 1312, according to some embodiments. FIGS. 8A and 8B illustrate one example of the formation of third semiconductor structure 1312.

Figure 13B:
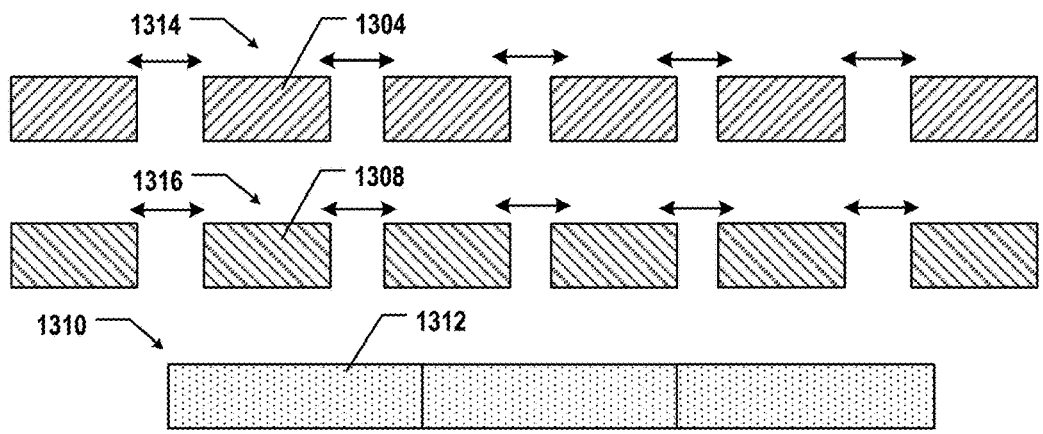

As illustrated in FIG. 13B, first wafer 1302 (as shown in FIG. 13A) is diced into a plurality of dies 1314, such that at least one die 1314 includes first semiconductor structure 1304. In some embodiments, each shot of first wafer 1302 is cut from first wafer 1302 along the scribing lines using wafer laser dicing and/or mechanical dicing techniques, thereby becoming respective die 1314. Die 1314 includes first semiconductor structure 1304, for example, the structure as shown in FIG. 9B. Similarly, second wafer 1306 (as shown in FIG. 13A) is diced into a plurality of dies 1316, such that at least one die 1316 includes second semiconductor structure 1308. In some embodiments, each shot of second wafer 1306 is cut from second wafer 1306 along the scribing lines using wafer laser dicing and/or mechanical dicing techniques, thereby becoming respective die 1316. Die 1316 includes second semiconductor structure 1308, for example, the structure as shown in FIG. 10C.

Method 1700 proceeds to operation 1702, as illustrated in FIG. 17B, in which the third wafer and each of the at least one first die and the at least one second die are bonded in a face-to-face manner to form a bonded structure, such that at least one third semiconductor structure is bonded to each of the first semiconductor structure and the second semiconductor structure. The first bonding contacts are in contact with a first set of the third bonding contacts at a first bonding interface, and the second bonding contacts are in contact with a second set of the third bonding contacts at a second bonding interface.

Figure 13C:
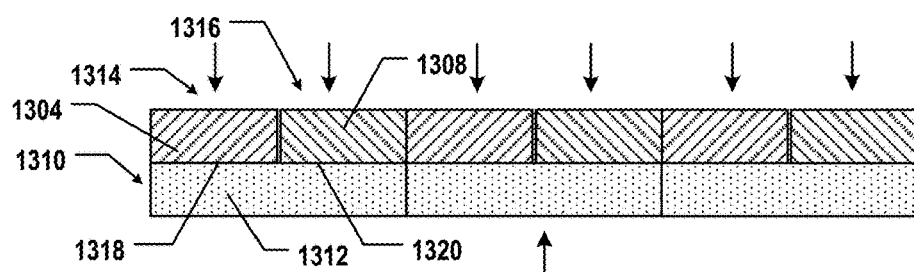

As illustrated in FIG. 13C, third wafer 1310 and each of die 1314 including first semiconductor structure 1304 and die 1316 including second semiconductor structure 1308 are bonded in a face-to-face manner, such that first semiconductor structure 1304 is bonded to third semiconductor structure 1312 at a first bonding interface 1318 and second semiconductor structure 1308 is bonded to third semiconductor structure 1312 at a second bonding interface 1320. Although first semiconductor structure 1304 and second semiconductor structure 1308 are above third semiconductor structure 1312 after bonding as shown in FIG. 13C, it is understood that third semiconductor structure 1312 may be above first semiconductor structure 1304 and second semiconductor structure 1308 after the bonding in some embodiments. FIG. 11A illustrates one example of the formation of bonded first, second, and third semiconductor structures 1304, 1308, and 1312.

Method 1700 proceeds to operation 1704, as illustrated in FIG. 17B, in which the third wafer or each of the first and second wafers is thinned to form semiconductor layer(s). In some embodiments, the third wafer of the third semiconductor structure, which is above the first wafer of the first semiconductor structure and the second wafer of the second semiconductor structure after the bonding, is thinned to form the semiconductor layer. In some embodiments, the first wafer of the first semiconductor structure and the second wafer of the second semiconductor structure, which are above the third wafer of the third semiconductor structure after the bonding, is thinned to form first and second semiconductor layers, respectively.

As illustrated in FIG. 11B, silicon substrate 902 at the top of the bonded chip (as shown in FIG. 11A) is thinned, so that the thinned top substrate can serve as a first semiconductor layer 1106, for example, a single-crystal silicon layer or a polysilicon layer. Similarly, silicon substrate 1002 at the top of the bonded chip (as shown in FIG. 11A) is thinned, so that the thinned top substrate can serve as a second semiconductor layer 1108, for example, a single-crystal silicon layer. In one example, the thickness of the thinned substrate may be between about 1 μm and about 20 μm, such as between 1 μm and 20 μm (e.g., 1 μm, 2 μm, 3 μm, 4 μm, 5 μm, 6 μm, 7 μm, 8 μm, 9 μm, 10 μm, 15 μm, 20 μm, any range bounded by the lower end by any of these values, or in any range defined by any two of these values), for example, using a combination of etch and CMP processes. It is understood that in some embodiments, by further applying an additional etch process, the thickness of the thinned substrate may be further reduced to below 1 μm, e.g., in the sub-micron range. It is understood that in some embodiments, first and second semiconductor layers 1106 and 1108 may be a single, continuous semiconductor layer. It is also understood that in some embodiments, another single, continuous semiconductor layer may be formed on first and second semiconductor layers 1106 and 1108. It is further understood that when silicon substrate 802 is the substrate at the top of the bonded chip, another semiconductor layer may be formed by thinning silicon substrate 802.

Method 1700 proceeds to operation 1706, as illustrated in FIG. 17B, in which a pad-out interconnect layer is formed above the semiconductor layer. As illustrated in FIG. 11B, a first pad-out interconnect layer 1110 is formed above first semiconductor layer 1106, and a second pad-out interconnect layer 1112 is formed above second semiconductor layer 1108. Pad-out interconnect layers 1110 and 1112 can include interconnects, such as pad contacts 1114 and 1116, formed in one or more ILD layers. Pad contacts 1114 and 1116 can include conductive materials including, but not limited to W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after bonding and thinning, contacts 1118 and 1120 are formed extending vertically through first and second semiconductor layers 1106 and 1108, respectively, for example by wet/dry etch followed by depositing conductive materials. Contacts 1118 and 1120 can be in contact with interconnects in first and second pad-out interconnect layers 1110 and 1112, respectively.

Figure 13D:
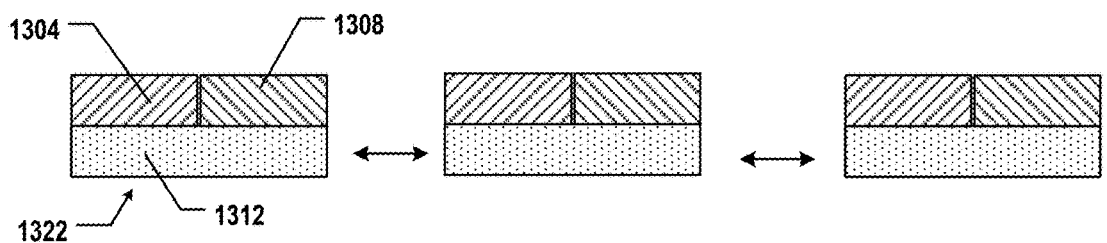

Method 1700 proceeds to operation 1708, as illustrated in FIG. 17B, in which the bonded structure is diced into a plurality of dies. At least one of the dies includes the bonded first, second, and third semiconductor structures. As illustrated in FIG. 13D, the bonded structure (as shown in FIG. 13C) is diced into a plurality of dies 1322. At least one of dies 1322 includes bonded first, second, and third semiconductor structures 1304, 1308, and 1312. In some embodiments, each shot of the bonded structure is cut from the bonded structure along the scribing lines using wafer laser dicing and/or mechanical dicing techniques, thereby becoming respective die 1322. Die 1322 can include bonded first, second, and third semiconductor structures 1304, 1308, and 1312, for example, the bonded structure as shown in FIG. 11B.

Figure 14:
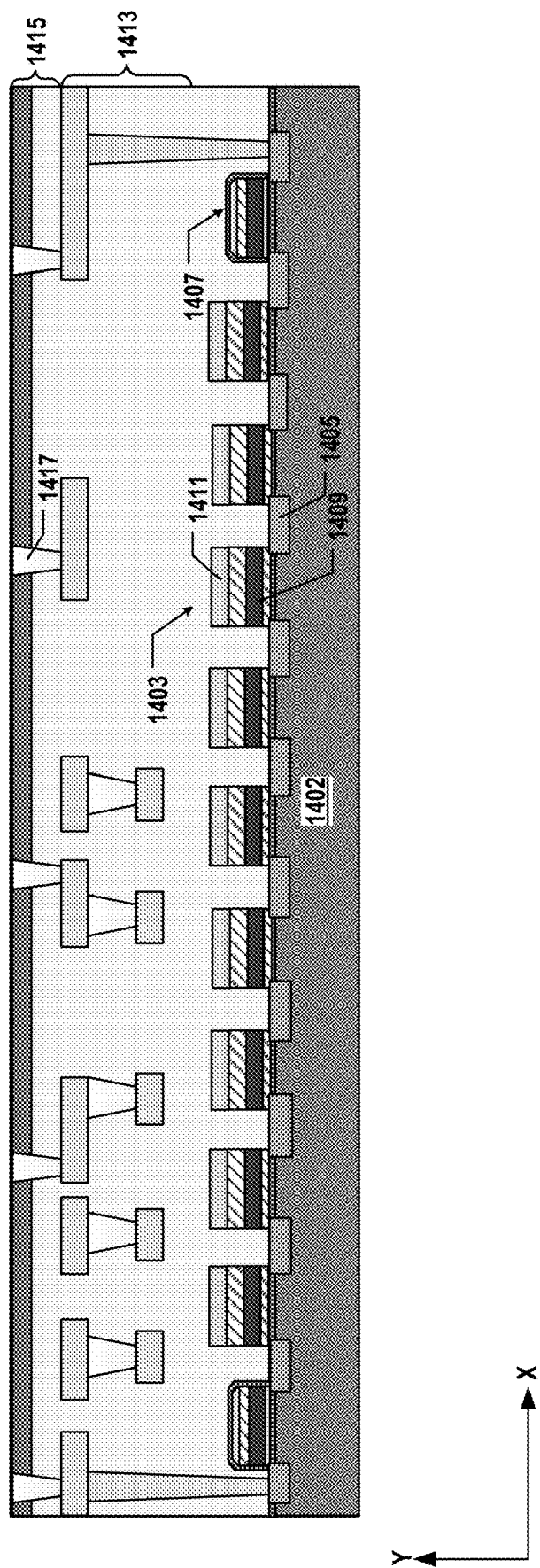
FIG. 14 illustrates a cross-section of an exemplary semiconductor structure having 2D NAND memory cells, according to some embodiments.

It is understood that the NAND memory disclosed herein may include an array of 2D NAND memory cells in addition to or instead of an array of 3D NAND memory strings in some embodiments. FIG. 14 illustrates a cross-section of an exemplary semiconductor structure 1400 having 2D NAND memory cells, according to some embodiments. Semiconductor structure 1400 includes a NAND flash memory device in which memory cells are provided in the form of an array of 2D NAND memory cells 1403 on a substrate 1402. Array of 2D NAND memory cells 1403 can include a plurality of 2D NAND memory strings, each of which includes a plurality of memory cells connected in series by sources/drains 1405 (resembling a NAND gate) and two select transistors 1407 at the ends of the 2D NAND memory string, respectively. In some embodiments, each 2D NAND memory cell 1403 includes a floating-gate transistor having a floating gate 1409 and a control gate 1411 stacked vertically. In some embodiments, the floating-gate transistor further includes dielectric layers, such as a blocking layer disposed vertically between control gate 1411 and floating gate 1409 and a tunneling layer disposed below floating gate 1409. Channels can be formed laterally between sources/drains 1405 and below the gate stacks (including the tunneling layer, floating gate 1409, the blocking layer, and control gate 1411). Each channel is controlled by the voltage signal applied to the respective gate stack through control gate 1411, according to some embodiments. It is understood that 2D NAND memory cell 1403 may include a charge-trap transistor, which replaces floating gate 1409 with a storage layer.

In some embodiments, semiconductor structure 1400 also includes an interconnect layer 1413 above array of 2D NAND memory cells 1403 to transfer electrical signals to and from array of 2D NAND memory cells 1403. Interconnect layer 1413 can include a plurality of interconnects, including interconnect lines and via contacts. In some embodiments, interconnects in interconnect layer 1413 also include local interconnects, such as bit line contacts and word line contacts. In some embodiments, semiconductor structure 1400 further includes a bonding layer 1415 above interconnect layer 1413 and array of 2D NAND memory cells 1403. Bonding layer 1415 can include a plurality of bonding contacts 1417 and dielectrics surrounding and electrically isolating bonding contacts 1417.

It is understood that although the third semiconductor structures disclosed above in which a programmable logic device is formed (e.g., 706 and 707) each includes the peripheral circuits of the NAND memory and/or the DRAM (e.g., 720 and 759), in some embodiments, the entirety or part of the peripheral circuits may not be included in the third semiconductor structure in the bonded semiconductor device. It is also understood that although the first semiconductor structures disclosed above in which NAND memory is formed (e.g., 702 and 703) each does not include the peripheral circuits of the NAND memory, in some embodiments, the entirety or part of the peripheral circuits may be included in the first semiconductor structure in the bonded semiconductor device. It is further understood that although the second semiconductor structures disclosed above in which DRAM is formed (e.g., 704 and 705) each does not include the peripheral circuits of the DRAM, in some embodiments, the entirety or part of the peripheral circuits may be included in the second semiconductor structure in the bonded semiconductor device.

Figure 15A:
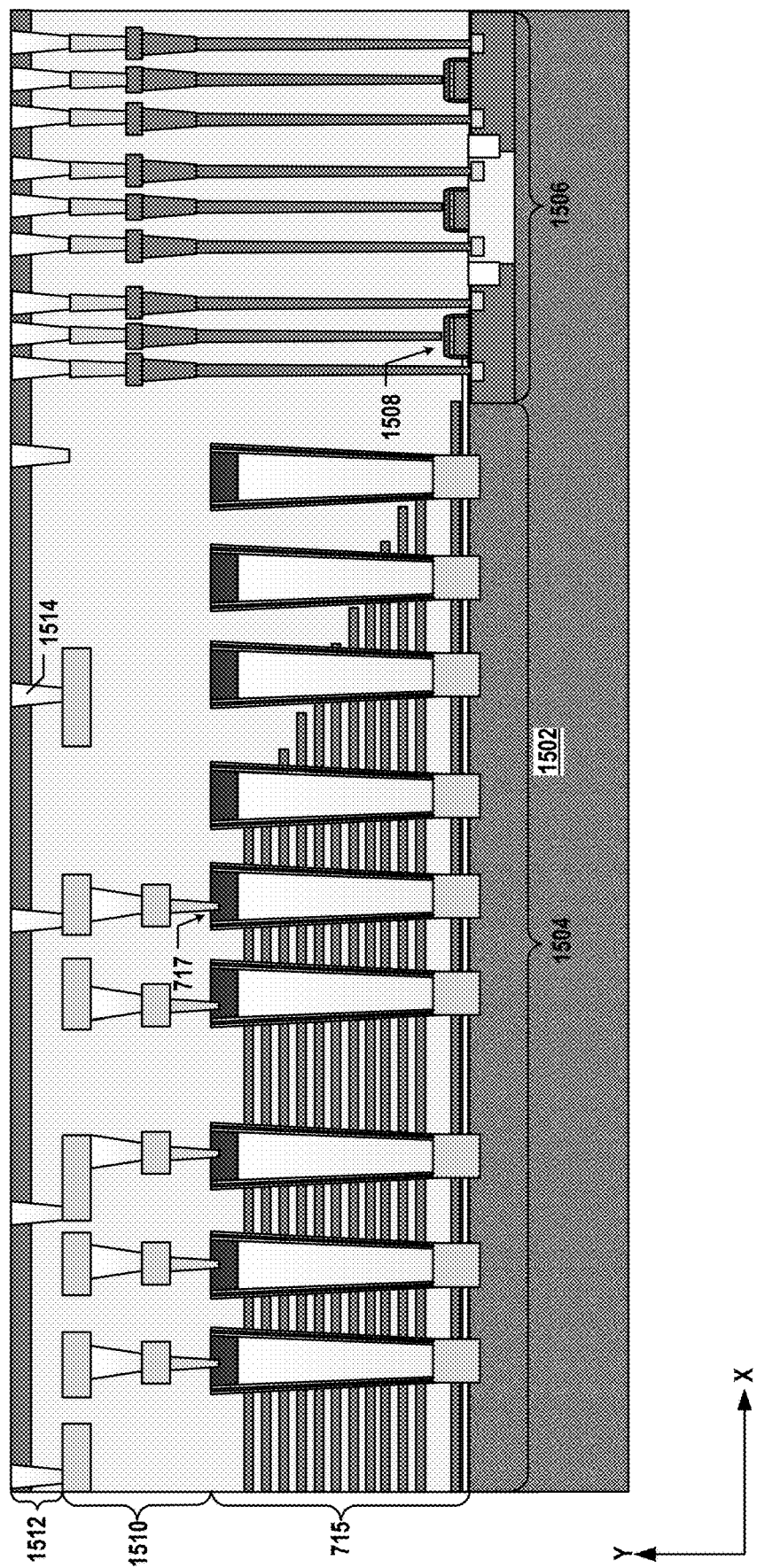
FIG. 15A illustrates a cross-section of an exemplary semiconductor structure having NAND memory and peripheral circuits, according to some embodiments.

FIG. 15A illustrates a cross-section of an exemplary semiconductor structure 1500 having NAND memory and peripheral circuits, according to some embodiments. For illustrative purposes only, a NAND memory 1504 in semiconductor structure 1500 includes array of 3D NAND memory strings 717 extending vertically through memory stack 715 above a substrate 1502 as described above in detail in first semiconductor structure 703 with respect to FIG. 7B. The details of similar structures (e.g., materials, fabrication process, functions, etc.) in both semiconductor structures 703 and 1500 are not repeated. It is understood that NAND memory 1504 may include an array of 2D NAND memory cells (e.g., 1403) in other embodiments.

As illustrated in FIG. 15A, semiconductor structure 1500 further includes a peripheral circuit 1506 formed on substrate 1502 and outside of NAND memory 1504 (e.g., array of 3D NAND memory strings 717). Both NAND memory 1504 and peripheral circuit 1506 of NAND memory 1504 can be formed in the same plane, e.g., on substrate 1502. Peripheral circuit 1506 can be the entirety or part of the peripheral circuits for sensing and controlling NAND memory 1504, including one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). In some embodiments, peripheral circuit 1506 includes a plurality of transistors 1508. Transistors 1508 can be formed "on" substrate 1502, in which the entirety or part of transistors 1508 are formed in substrate 1502 (e.g., below the top surface of substrate 1502) and/or directly on substrate 1502. Isolation regions (e.g., STIs) and doped regions (e.g., source regions and drain regions of transistors 1508) can be formed in substrate 1502 as well. Transistors 1508 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, semiconductor structure 1500 also includes an interconnect layer 1510 above NAND memory 1504 (e.g., memory stack 715, 3D NAND memory strings 717) and peripheral circuit 1506 to transfer electrical signals to and from 3D NAND memory strings 717 and peripheral circuit 1506. Interconnect layer 1510 can include a plurality of interconnects, including interconnect lines and via contacts. NAND memory 1504 (e.g., 3D NAND memory strings 717) and peripheral circuit 1506 can be electrically connected by interconnects in interconnect layer 1510 as well. In some embodiments, semiconductor structure 1500 further includes a bonding layer 1512 above interconnect layer 1510, memory stack 715 (and 3D NAND memory strings 717 therethrough), and peripheral circuit 1506. Bonding layer 1512 can include a plurality of bonding contacts 1514 and dielectrics surrounding and electrically isolating bonding contacts 1514.

Figure 15B:
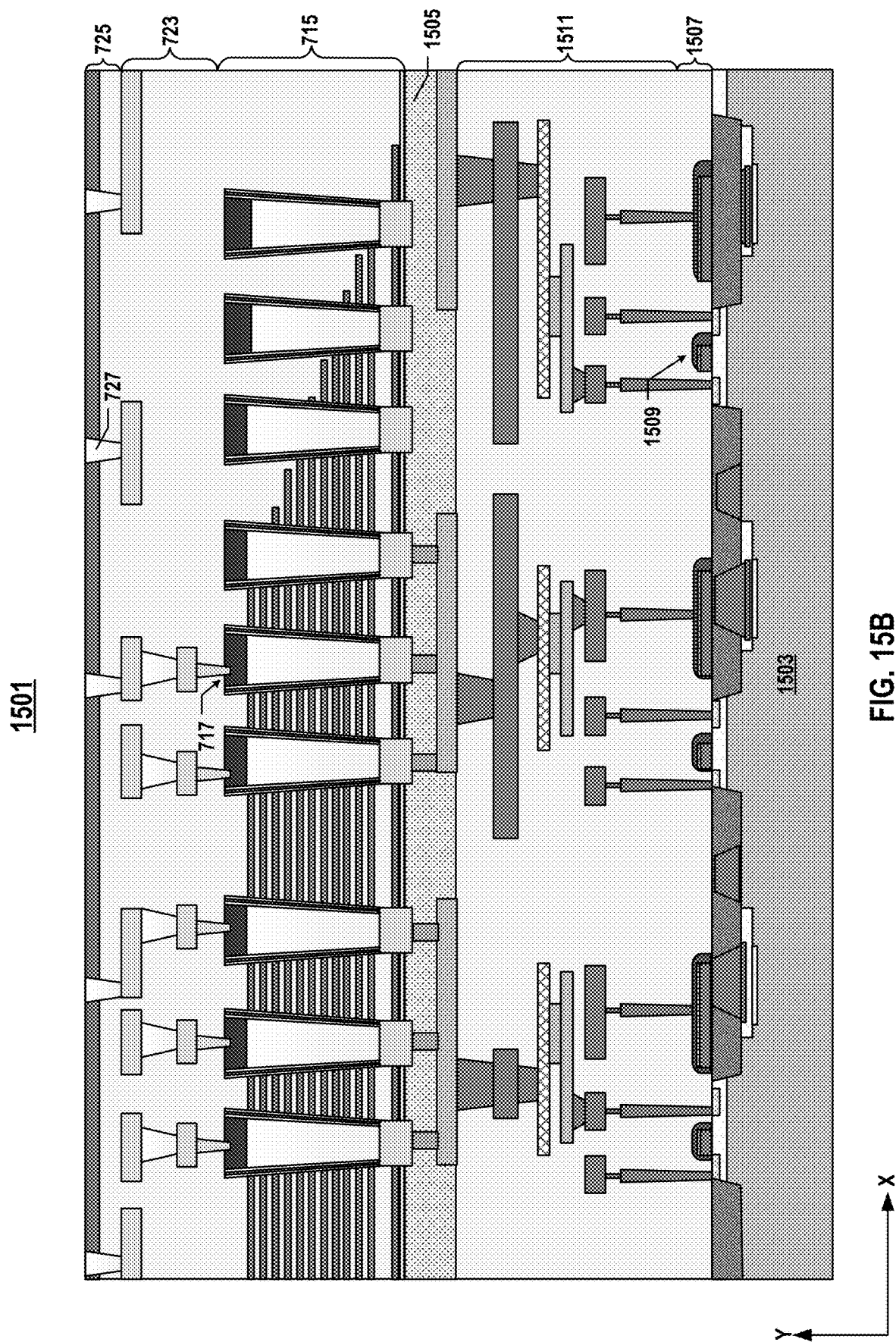
FIG. 15B illustrates a cross-section of another exemplary semiconductor structure having NAND memory and peripheral circuits, according to some embodiments.

The relative positions of the NAND memory and the peripheral circuit of the NAND memory in the same semiconductor structure are not limited to being in the same plane as shown in FIG. 15A. In some embodiments, the peripheral circuit of the NAND memory is above the NAND memory. In some embodiments, the peripheral circuit of the NAND memory is below the NAND memory. FIG. 15B illustrates a cross-section of another exemplary semiconductor structure 1501 having NAND memory and peripheral circuits, according to some embodiments. Semiconductor structure 1501 is similar to semiconductor structure 703, both of which include memory stack 715, array of 3D NAND memory strings 717, interconnect layer 723 above memory stack 715, and bonding layer 725 above interconnect layer 723. The details of similar structures (e.g., materials, fabrication process, functions, etc.) in both semiconductor structures 703 and 1501 are thus not repeated.

Different from semiconductor structure 703, semiconductor structure 1501 further includes a peripheral circuit 1507 below memory stack 715 (and 3D NAND memory strings 717 therethrough) on a substrate 1503. Peripheral circuit 1507 can be the entirety or part of the peripheral circuits for sensing and controlling 3D NAND memory strings 717, including one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). In some embodiments, peripheral circuit 1507 includes a plurality of transistors 1509. Transistors 1509 can be formed "on" substrate 1503, in which the entirety or part of transistors 1509 are formed in substrate 1503 (e.g., below the top surface of substrate 1503) and/or directly on substrate 1503. Isolation regions (e.g., STIs) and doped regions (e.g., source regions and drain regions of transistors 1509) can be formed in substrate 1503 as well. Transistors 1509 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, semiconductor structure 1501 also includes an interconnect layer 1511 formed vertically between peripheral circuit 1507 and memory stack 715 (and 3D NAND memory strings 717 therethrough) to electrically connect 3D NAND memory strings 717 and peripheral circuit 1507 for transferring electrical signals between 3D NAND memory strings 717 and peripheral circuit 1507. Interconnect layer 1511 can include a plurality of interconnects, including interconnect lines and via contacts. 3D NAND memory strings 717 and peripheral circuit 1507 can be electrically connected by the interconnects in interconnect layer 1511 as well. In some embodiments, semiconductor structure 1501 further includes a semiconductor layer 1505 above which memory stack 715 (and 3D NAND memory strings 717 therethrough) can be formed. Semiconductor layer 1505 can be a polysilicon layer formed above interconnect layer 1511, for example, by one or more thin film deposition processes. Memory stack 715 then can be formed above semiconductor layer 1505. It is understood that although peripheral circuit 1507 is below memory stack 715 (and 3D NAND memory strings 717 therethrough) as shown in FIG. 15B, in some embodiments, peripheral circuit 1507 may be above memory stack 715 (and 3D NAND memory strings 717 therethrough).

Although semiconductor structures 1500 and 1501 in FIGS. 15A and 15B include NAND flash memory, it is understood that semiconductor structures including DRAM may have similar configurations as semiconductor structures 1500 and 1501. For example, semiconductor structure including DRAM as disclosed herein (e.g., 704 and 705) may include the entirety or part of the peripheral circuits of DRAM cells as well. The peripheral circuit of DRAM cells can be in the same plane as the DRAM cells (e.g., outside of the DRAM cell array), above the DRAM cell array, and/or below the DRAM cell array.

Figure 18:
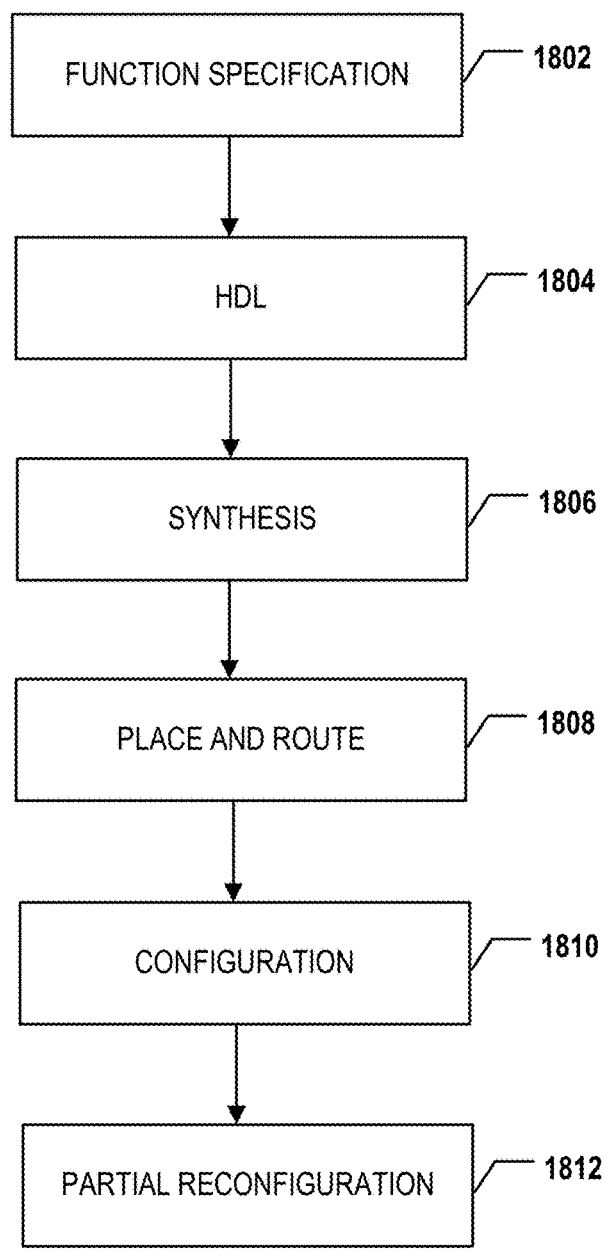
FIG. 18 is a flowchart of an exemplary method for programming a semiconductor device having a programmable logic device, according to some embodiments.

As described above, the semiconductor device having a programmable logic device and heterogeneous memories fabricated according to method 1600 or method 1700 has an undefined function at the time of manufacture and needs to be programmed after the manufacturing to perform its desired functions, according to some embodiments. For example, FIG. 18 is a flowchart of an exemplary method 1800 for programming a semiconductor device having a programmable logic device, according to some embodiments. The semiconductor device described in FIG. 18 can be any semiconductor devices described herein including, for example, semiconductor devices 700 and 701 depicted in FIGS. 7A and 7B, respectively.

Referring to FIG. 18, method 1800 starts at operation 1802, in which the functions to be performed by the semiconductor device having a programmable logic device, e.g., FPGA, are specified. For example, the I/O interfaces, function behaviors and/or modules at different levels and internal interfaces thereof, and system clock may be defined as a function specification at this stage. Method 1800 proceeds to operation 1804, as illustrated in FIG. 18, in which the function specification is provided in the forms of HDLs, such as VHDL or Verilog. For example, the register-transfer level (RTL) description in the HDLs may be created and simulated. Method 1800 proceeds to operation 1806, as illustrated in FIG. 18, in which the design specified in the HDLs is synthesized. For example, bitstreams/netlist for the programmable logic device may be generated by the logic synthesis process, which turns the abstract specification of desired function behaviors, for example at RTL, into the design at the logic blocks levels. Method 1800 proceeds to operation 1808, as illustrated in FIG. 18, in which the logic blocks are placed and routed (interconnected) on the grid of the programmable logic device. For example, an automated place-and-route procedure may be performed to generate a pinout based on the netlist, which will be used to interface with the parts outside of the programmable logic device. Operations 1802, 1804, 1806, and 1808 can be performed by electronic design automation (EDA) tools.

Method 1800 proceeds to operation 1810, as illustrated in FIG. 18, in which the semiconductor device having a programmable logic device is configured. For example, once the design and validation processes are complete, the binary file generated, for example, using the FPGA vendor's proprietary software, may be used to configure the programmable logic device. In one example, this file in the format of bitstreams is transferred/downloaded into the FPGA via an interface, e.g., a serial interface (JTAG), or to the memory devices, e.g., the DRAM and/or NAND memory, in the semiconductor device. It is understood that in some embodiments, method 1800 may proceed to operation 1812, as illustrated in FIG. 18, in which the semiconductor device having a programmable logic device may be partially reconfigured in a dynamic manner while the remaining programmable logic device design continues to function. For example, a subset of the programmable logic blocks in an operating FPGA design may be reconfigured by downloading a partial bitstream into the FPGA in the semiconductor device. Partial Reconfiguration can allow for the dynamic change of function modules within an active FPGA design.

According to one aspect of the present disclosure, a semiconductor device includes an array of NAND memory cells and a first bonding layer including a plurality of first bonding contacts. The semiconductor device also includes a second semiconductor structure including an array of DRAM cells and a second bonding layer including a plurality of second bonding contacts. The semiconductor device also includes a third semiconductor structure including a programmable logic device and a third bonding layer including a plurality of third bonding contacts. The semiconductor device further includes a first bonding interface between the first bonding layer and the third bonding layer, and a second bonding interface between the second bonding layer and the third bonding layer. The first bonding contacts are in contact with a first set of the third bonding contacts at the first bonding interface. The second bonding contacts are in contact with a second set of the third bonding contacts at the second bonding interface. The first bonding interface and the second bonding interface are in a same plane.

In some embodiments, the third semiconductor structure includes a substrate, the programmable logic device on the substrate, and the third bonding layer above the programmable logic device.

In some embodiments, the first semiconductor structure includes the first bonding layer above the third bonding layer, the array of NAND memory cells above the first bonding layer, and a first semiconductor layer above and in contact with the array of NAND memory cells. In some embodiments, the array of NAND memory cells includes at least one of a 3D NAND memory string or a 2D NAND memory cell.

In some embodiments, the semiconductor structure further includes a first pad-out interconnect layer above the first semiconductor layer. In some embodiments, the first semiconductor layer includes single-crystal silicon. In some embodiments, the first semiconductor layer includes polysilicon.

In some embodiments, the second semiconductor structure includes the second bonding layer above the third bonding layer, DRAM cell arrays above the second bonding layer, and a second semiconductor layer above and in contact with DRAM cell arrays.

In some embodiments, the semiconductor structure further includes a second pad-out interconnect layer above the second semiconductor layer. In some embodiments, the second semiconductor layer includes single-crystal silicon.

In some embodiments, the first semiconductor structure includes a first substrate, the array of NAND memory cells on the first substrate, and the first bonding layer above the array of NAND memory cells. In some embodiments, the array of NAND memory cells includes at least one of a 3D NAND memory string or a 2D NAND memory cell.

In some embodiments, the second semiconductor structure includes a second substrate, the array of DRAM cells on the second substrate, and the second bonding layer above the array of DRAM cells.

In some embodiments, the third semiconductor structure includes the third bonding layer above the first bonding layer and the second bonding layer, the programmable logic device above the third bonding layer, and a third semiconductor layer above and in contact with the programmable logic device.

In some embodiments, the semiconductor structure further includes a pad-out interconnect layer above the third semiconductor layer. In some embodiments, the third semiconductor layer includes single-crystal silicon.

In some embodiments, the first semiconductor structure further includes a peripheral circuit of the array of NAND memory cells. In some embodiments, the second semiconductor structure further includes a peripheral circuit of the array of DRAM cells. In some embodiments, the third semiconductor structure further includes a peripheral circuit of at least one of the array of NAND memory cells or the array of DRAM cells.

In some embodiments, the first semiconductor structure includes a first interconnect layer vertically between the first bonding layer and the array of NAND memory cells, the second semiconductor structure includes a second interconnect layer vertically between the second bonding layer and the array of DRAM cells, and the third semiconductor structure includes a third interconnect layer vertically between the third bonding layer and the programmable logic device.

In some embodiments, the programmable logic device is electrically connected to the array of NAND memory cells through the first and third interconnect layers, the first bonding contacts, and the first set of the third bonding contacts, and the programmable logic device is electrically connected to the array of DRAM cells through the second and third interconnect layers, the second bonding contacts, and the second set of the third bonding contacts.

In some embodiments, the array of NAND memory cells are electrically connected to the array of DRAM cells through the first, second, and third interconnect layers and the first, second, and third bonding contacts.

In some embodiments, the programmable logic device includes a plurality of programmable logic blocks.

In some embodiments, each of the first, second, and third semiconductor structures does not include a static random-access memory (SRAM) cache.

According to another aspect of the present disclosure, a method for forming a semiconductor device is disclosed. A plurality of first semiconductor structures are formed on a first wafer. At least one of the first semiconductor structures includes an array of NAND memory cells and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of DRAM cells and a second bonding layer including a plurality of second bonding contacts. The second wafer is diced into a plurality of second dies, such that at least one of the second dies includes the at least one of the second semiconductor structures. A plurality of third semiconductor structures are formed on a third wafer. At least one of the third semiconductor structures includes a programmable logic device and a third bonding layer including a plurality of third bonding contacts. The third wafer is diced into a plurality of third dies, such that at least one of the third dies includes the at least one of the third semiconductor structures. The third die and each of the first die and the second die are bonded in a face-to-face manner, such that the third semiconductor structure is bonded to each of the first semiconductor structure and the second semiconductor structure. The first bonding contacts are in contact with a first set of the third bonding contacts at a first bonding interface. The second bonding contacts are in contact with a second set of the third bonding contacts at a second bonding interface.

In some embodiments, to form the plurality of first semiconductor structures, the array of NAND memory cells is formed on the first wafer, a first interconnect layer is formed above the array of NAND memory cells, and the first bonding layer is formed above the first interconnect layer. In some embodiments, to form the plurality of first semiconductor structures, a peripheral circuit of the array of NAND memory cells is formed on the first wafer.

In some embodiments, to form the plurality of second semiconductor structures, the array of DRAM cells is formed on the second wafer, a second interconnect layer is formed above the array of DRAM cells, and the second bonding layer is formed above the second interconnect layer. In some embodiments, to form the plurality of second semiconductor structures, a peripheral circuit of the array of DRAM cells is formed on the second wafer.

In some embodiments, to form the plurality of third semiconductor structures, the programmable logic device is formed on the third wafer, a third interconnect layer is formed above the programmable logic device, and the third bonding layer is formed above the third interconnect layer. In some embodiments, to form the plurality of third semiconductor structures, a peripheral circuit of at least one of the array of NAND memory cells or the array of DRAM cells is formed on the third wafer.

In some embodiments, the third semiconductor structure is above the first semiconductor structure and the second semiconductor structure after the bonding. In some embodiments, the third wafer is thinned to form a semiconductor layer after the bonding, and a pad-out interconnect layer is formed above the semiconductor layer.

In some embodiments, the third semiconductor structure is below the first semiconductor structure and the second semiconductor structure after the bonding. In some embodiments, the first wafer and the second wafer are thinned to form a first semiconductor layer and a second semiconductor layer, respectively, after the bonding, and a first pad-out interconnect layer and a second pad-out interconnect layer are formed above the first semiconductor layer and the second semiconductor layer, respectively.

In some embodiments, the bonding includes hybrid bonding.

According to still another aspect of the present disclosure, a method for forming a semiconductor device is disclosed. A plurality of first semiconductor structures are formed on a first wafer. At least one of the first semiconductor structures includes an array of NAND memory cells and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of DRAM cells and a second bonding layer including a plurality of second bonding contacts. The second wafer is diced into a plurality of second dies, such that at least one of the second dies includes the at least one of the second semiconductor structures. A plurality of third semiconductor structures are formed on a third wafer. At least one of the third semiconductor structures includes a programmable logic device and a third bonding layer including a plurality of third bonding contacts. The third wafer and each of the at least one first die and the at least one second die are bonded in a face-to-face manner to form a bonded structure, such that the at least one third semiconductor structure is bonded to each of the first semiconductor structure and the second semiconductor structure. The first bonding contacts are in contact with a first set of the third bonding contacts at a first bonding interface. The second bonding contacts are in contact with a second set of the third bonding contacts at a second bonding interface. The bonded structure is diced into a plurality of dies. At least one of the dies includes the bonded first, second, and third semiconductor structures.

In some embodiments, to form the plurality of first semiconductor structures, the array of NAND memory cells is formed on the first wafer, a first interconnect layer is formed above the array of NAND memory cells, and the first bonding layer is formed above the first interconnect layer. In some embodiments, to form the plurality of first semiconductor structures, a peripheral circuit of the array of NAND memory cells is formed on the first wafer.

In some embodiments, to form the plurality of second semiconductor structures, the array of DRAM cells is formed on the second wafer, a second interconnect layer is formed above the array of DRAM cells, and the second bonding layer is formed above the second interconnect layer. In some embodiments, to form the plurality of second semiconductor structures, a peripheral circuit of the array of DRAM cells is formed on the second wafer.

In some embodiments, to form the plurality of third semiconductor structures, the programmable logic device is formed on the third wafer, a third interconnect layer is formed above the programmable logic device, and the third bonding layer is formed above the third interconnect layer. In some embodiments, to form the plurality of third semiconductor structures, a peripheral circuit of at least one of the array of NAND memory cells or the array of DRAM cells is formed on the third wafer.

In some embodiments, the third semiconductor structure is above the first semiconductor structure and the second semiconductor structure after the bonding. In some embodiments, the third wafer is thinned to form a semiconductor layer after the bonding, and a pad-out interconnect layer is formed above the semiconductor layer.

In some embodiments, the third semiconductor structure is below the first semiconductor structure and the second semiconductor structure after the bonding. In some embodiments, the first wafer and the second wafer are thinned to form a first semiconductor layer and a second semiconductor layer, respectively, after the bonding, and a first pad-out interconnect layer and a second pad-out interconnect layer are formed above the first semiconductor layer and the second semiconductor layer, respectively.

In some embodiments, the bonding includes hybrid bonding.

According to yet another aspect of the present disclosure, a semiconductor device includes a logic die including an array of programmable logic blocks, a memory die including an array of memory blocks comprising a plurality types of memory, and a bonding interface between the logic die and the memory die, such that the array of programmable logic blocks is electrically connected to the array of memory blocks through the bonding interface.

In some embodiments, the plurality types of memory include NAND memory, DRAM, and PCM.

In some embodiments, the plurality types of memory do not include SRAM.

In some embodiments, at least one of the logic die or the memory die further includes a plurality of logic circuits.

In some embodiments, the array of programmable logic blocks of the logic die and the array of memory blocks of the memory die do not share an SRAM cache.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor device, comprising:
   a first semiconductor structure comprising an array of NAND memory cells and a first bonding layer comprising a plurality of first bonding contacts;

a second semiconductor structure comprising an array of dynamic random-access memory (DRAM) cells and a second bonding layer comprising a plurality of second bonding contacts;
a third semiconductor structure comprising a programmable logic device and a third bonding layer comprising a plurality of third bonding contacts;
a first bonding interface between the first bonding layer and the third bonding layer, the first bonding contacts being in contact with a first set of the third bonding contacts at the first bonding interface; and
a second bonding interface between the second bonding layer and the third bonding layer, the second bonding contacts being in contact with a second set of the third bonding contacts at the second bonding interface,
wherein the first bonding interface and the second bonding interface are in a same plane.

2. The semiconductor device of claim 1, wherein the third semiconductor structure comprises:
a substrate;
the programmable logic device on the substrate; and
the third bonding layer above the programmable logic device.

3. The semiconductor device of claim 2, wherein the first semiconductor structure comprises:
the first bonding layer above the third bonding layer;
the array of NAND memory cells above the first bonding layer; and
a first semiconductor layer above and in contact with the array of NAND memory cells.

4. The semiconductor device of claim 3, further comprising a first pad-out interconnect layer above the first semiconductor layer, wherein the first semiconductor layer comprises single-crystal silicon or polysilicon.

5. The semiconductor device of claim 2, wherein the second semiconductor structure comprises:
the second bonding layer above the third bonding layer;
the array of DRAM cells above the second bonding layer; and
a second semiconductor layer above and in contact with the array of DRAM cells.

6. The semiconductor device of claim 5, further comprising a second pad-out interconnect layer above the second semiconductor layer, wherein the second semiconductor layer comprises single-crystal silicon.

7. The semiconductor device of claim 1, wherein the first semiconductor structure comprises:
a first substrate;
the array of NAND memory cells on the first substrate; and
the first bonding layer above the array of NAND memory cells.

8. The semiconductor device of claim 7, wherein the second semiconductor structure comprises:
a second substrate;
the array of DRAM cells on the second substrate; and
the second bonding layer above the array of DRAM cells.

9. The semiconductor device of claim 7, wherein the third semiconductor structure comprises:
the third bonding layer above the first bonding layer and the second bonding layer;
the programmable logic device above the third bonding layer; and
a third semiconductor layer above and in contact with the programmable logic device.

10. The semiconductor device of claim 1, wherein
the first semiconductor structure further comprises a peripheral circuit of the array of NAND memory cells;
the second semiconductor structure further comprises a peripheral circuit of the array of DRAM cells; and
the third semiconductor structure further comprises a peripheral circuit of at least one of the array of NAND memory cells or the array of DRAM cells.

11. The semiconductor device of claim 1, wherein
the first semiconductor structure comprises a first interconnect layer vertically between the first bonding layer and the array of NAND memory cells;
the second semiconductor structure comprises a second interconnect layer vertically between the second bonding layer and the array of DRAM cells; and
the third semiconductor structure comprises a third interconnect layer vertically between the third bonding layer and the programmable logic device.

12. The semiconductor device of claim 11, wherein
the programmable logic device is electrically connected to the array of NAND memory cells through the first and third interconnect layers, the first bonding contacts, and the first set of the third bonding contacts;
the programmable logic device is electrically connected to the array of DRAM cells through the second and third interconnect layers, the second bonding contacts, and the second set of the third bonding contacts; and
the array of NAND memory cells is electrically connected to the array of DRAM cells through the first, second, and third interconnect layers and the first, second, and third bonding contacts.

13. The semiconductor device of claim 1, wherein the programmable logic device comprises a plurality of programmable logic blocks.

14. The semiconductor device of claim 1, wherein each of the first, second, and third semiconductor structures does not include a static random-access memory (SRAM) cache.

15. A method for forming a semiconductor device, comprising:
forming a plurality of first semiconductor structures on a first wafer, wherein at least one of the first semiconductor structures comprises an array of NAND memory cells and a first bonding layer comprising a plurality of first bonding contacts;
dicing the first wafer into a plurality of first dies, such that at least one of the first dies comprises the at least one of the first semiconductor structures;
forming a plurality of second semiconductor structures on a second wafer, wherein at least one of the second semiconductor structures comprises an array of dynamic random-access memory (DRAM) cells and a second bonding layer comprising a plurality of second bonding contacts;
dicing the second wafer into a plurality of second dies, such that at least one of the second dies comprises the at least one of the second semiconductor structures;
forming a plurality of third semiconductor structures on a third wafer, wherein at least one of the third semiconductor structures comprises a programmable logic device and a third bonding layer comprising a plurality of third bonding contacts;
dicing the third wafer into a plurality of third dies, such that at least one of the third dies comprises the at least one of the third semiconductor structures; and
bonding (i) the third die and (ii) each of the first die and the second die in a face-to-face manner, such that the third semiconductor structure is bonded to each of the first semiconductor structure and the second semiconductor structure, wherein the first bonding contacts are in contact with a first set of the third bonding contacts at a first bonding interface, and the second bonding contacts are in contact with a second set of the third bonding contacts at a second bonding interface.

16. The method of claim 15, wherein forming the plurality of first semiconductor structures comprises:
    forming the array of NAND memory cells on the first wafer;
    forming a first interconnect layer above the array of NAND memory cells; and
    forming the first bonding layer above the first interconnect layer.

17. The method of claim 15, wherein forming the plurality of second semiconductor structures comprises:
    forming the array of DRAM cells on the second wafer;
    forming a second interconnect layer above the array of DRAM cells; and
    forming the second bonding layer above the second interconnect layer.

18. The method of claim 15, wherein forming the plurality of third semiconductor structures comprises:
    forming the programmable logic device on the third wafer;
    forming a third interconnect layer above the programmable logic device; and
    forming the third bonding layer above the third interconnect layer.

19. A method for forming a semiconductor device, comprising:
    forming a plurality of first semiconductor structures on a first wafer, wherein at least one of the first semiconductor structures comprises an array of NAND memory cells and a first bonding layer comprising a plurality of first bonding contacts;
    dicing the first wafer into a plurality of first dies, such that at least one of the first dies comprises the at least one of the first semiconductor structures;
    forming a plurality of second semiconductor structures on a second wafer, wherein at least one of the second semiconductor structures comprises an array of dynamic random-access memory (DRAM) cells and a second bonding layer comprising a plurality of second bonding contacts;
    dicing the second wafer into a plurality of second dies, such that at least one of the second dies comprises the at least one of the second semiconductor structures;
    forming a plurality of third semiconductor structures on a third wafer, wherein at least one of the third semiconductor structures comprises a programmable logic device and a third bonding layer comprising a plurality of third bonding contacts;
    bonding (i) the third wafer and (ii) each of the at least one first die and the at least one second die in a face-to-face manner to form a bonded structure, such that the at least one third semiconductor structure is bonded to each of the first semiconductor structure and the second semiconductor structure, wherein the first bonding contacts are in contact with a first set of the third bonding contacts at a first bonding interface, and the second bonding contacts are in contact with a second set of the third bonding contacts at a second bonding interface; and
    dicing the bonded structure into a plurality of dies, wherein at least one of the dies comprises the bonded first, second, and third semiconductor structures.

20. The method of claim 19, wherein forming the plurality of third semiconductor structures comprises:
    forming the programmable logic device on the third wafer;
    forming a third interconnect layer above the programmable logic device; and
    forming the third bonding layer above the third interconnect layer.

* * * * *